United States Patent [19]
Fukushima et al.

[11] Patent Number: 5,986,301
[45] Date of Patent: Nov. 16, 1999

[54] THIN FILM CAPACITOR WITH ELECTRODES HAVING A PEROVSKITE STRUCTURE AND A METALLIC CONDUCTIVITY

[75] Inventors: Noburu Fukushima, Tokyo; Takashi Kawakubo; Tatsuo Shimizu, both of Kanagawa-ken, all of Japan

[73] Assignee: Kabushiki Kaisha Toshiba, Kawasaki, Japan

[21] Appl. No.: 08/858,768

[22] Filed: May 19, 1997

Related U.S. Application Data

[63] Continuation of application No. 08/590,566, Jan. 26, 1996, abandoned.

[30] Foreign Application Priority Data

| Jan. 27, 1995 | [JP] | Japan | .................................... | 7-011655 |
| Sep. 13, 1995 | [JP] | Japan | .................................... | 7-235789 |

[51] Int. Cl.$^6$ ......................... H01L 27/108; H01L 29/76; H01L 29/94; H01L 31/119
[52] U.S. Cl. .......................... 257/306; 257/295; 257/310
[58] Field of Search ................................... 257/295, 296, 257/306, 310, 347

[56] References Cited

U.S. PATENT DOCUMENTS

| 5,185,689 | 2/1993 | Maniar | .................................... | 361/313 |
| 5,241,211 | 8/1993 | Tashiro | .................................... | 257/506 |
| 5,442,585 | 8/1995 | Eguchi et al. | .......................... | 365/149 |
| 5,556,818 | 9/1996 | Kohler et al. | ............................ | 501/138 |
| 5,629,229 | 5/1997 | Si et al. | ...................................... | 438/3 |

FOREIGN PATENT DOCUMENTS

| 60-94716 | 5/1985 | Japan . |
| 2-248089 | 10/1990 | Japan . |
| 4-167554 | 6/1992 | Japan . |
| 6-21341 | 1/1994 | Japan . |
| 7-94681 | 4/1996 | Japan . |

OTHER PUBLICATIONS

Dat et al. Polycrystalline $La_{0.5}SR_{0.5}CoO_3/PbZr_{0.53}Ti_{0.47}O_3/La_{0.5}Sr_{0.5}CoO_3$ ferroelectric capacitors on platinized silicon with no polarization fatigue Appl.Phys.Let. 64(20) May 16, 1994.

Warren et al. Mechanisms for the Suppression of the Switchable Polarization in PZT and $BaTiO_3$ Mat.Res.Soc.Symp. Proc. vol. 361 1995.

Ramesh et al. Ferroelectric La–Sr–Co–O/Pb–Zr–Ti–O/La–Sr–Co–O heterostructures on silicon via template growth Appl.Phys.Let.63(26), Dec. 27, 1993.

Eom et al., "Fabrication and Properties of Epitaxial Ferroelectric Heterostructures With ($SrRuo_3$) Isotropic Metallic Oxide Electrodes", *Appl. Phys. Lett.*, vol. 63, No. 18, pp. 255–257, (1993).

Eom et al., "Single–Crystal Epitaxial Thin Films of The Isotropic Metallic Oxides $Sr_{1-x}Ca_xRuO_3$ ($O \leq X \geq 1$)", *Science*, vol. 258:1766–1769, (1992).

Fujishima et al., "Optical–conductivity Spectra of $Sr_{1-x}La_xTiO_3$: Filling–Dependent Effect of The Electron Correlation", *The American Physical Society*, vol. 41, No. 17, pp. 11 167–11 170, (1992).

Blom et al., "Ferroelectric Schottky Diode", *The American Physical Society*, vol. 73, No. 15, pp. 2107–2110 (1994).

Sleight et al., "Preparation and Properties of Alkali Rhenium Bronzes And A $WO_3–ReO_3$ Solid Solution", *Solid State Communications*, vol. 4:601–602, (1966).

*Primary Examiner*—Olik Chaudhuri
*Assistant Examiner*—Howard Weiss
*Attorney, Agent, or Firm*—Foley & Lardner

[57] ABSTRACT

A thin film capacitor comprises a dielectric thin film having a perovskite structure sandwiched between top and bottom electrodes. At least one of the top and bottom electrodes is made of a conductive oxide material having a perovskite structure represented with a general formula of $ABO_3$ in which A represents A-site elements composed of at least two of alkaline-earth and rare earth metals, and B represents B-site elements composed of at least one of transition metals. The capacitors involve a small leakage current, occupy a small area, and provide large capacitance. Accordingly, the capacitors realize a high integration semiconductor memory such as a DRAM of gigabit order.

27 Claims, 29 Drawing Sheets

X-axis:20MV/m div
Y-axis:0.1C/m$^2$ div

X-axis:20MV/m div
Y-axis:0.1C/m$^2$ div

ABO₃

THIN FILM CAPACITOR WITH ELECTRODES HAVING A PEROVSKITE STRUCTURE AND A METALLIC CONDUCTIVITY

This application is a continuation of application Ser. No. 08/590,566, filed Jan. 26, 1996, now abandoned.

BACKGROUND OF THE INVENTION

1. Field of the Invention

The present invention relates to a thin film capacitor made of perovskite dielectric material and a semiconductor device having the thin film capacitor.

2. Description of the Prior Art

The integration and performance of semiconductor devices such as volatile memories like MOS DRAMs are rapidly improving. The integration density of memories has experienced fourfould increase for each new generation, which occurred nearly every three years. Such integration will continue because of expanding needs of integrated memories, and more critical dimensions will be required for the memories. Namely, the memories play a role of "process driver." High integration of memories is backed by various technological innovations, and more integrated memories will be developed. When the capacity of DRAMs was changed from one to four megabits, the cell structure thereof was also changed from a planar type to a three-dimensional type such as a stack type and a trench type. The 1-Mb DRAM employs a silicon oxide insulation film ($SiO_2$) of about 10 nm thick to form a planar capacitor that provides required capacitance. The planar capacitor, however, is improper for the 4-Mb DRAM because each cell area of this DRAM is too small to accommodate the planar capacitor of required capacitance. To solve this problem, the three-dimensional structures have been proposed. Among them, a trench structure forms a capacitor in a trench, and a stack structure forms a multi-layered capacitor on a transistor. However, even the three-dimensional structures may be improper, or are difficult to fabricate 256-Mb and 1-Gb DRAMs as long as $SiO_2$ is used for a capacitor insulation film. There are attempts to employ STO ($SrTiO_3$) and BTO ($BaTiO_3$) instead of $SiO_2$ to form a capacitor insulation film having a perovskite structure and a high dielectric constant, for very high integration DRAMs.

Another attempt is to develop a ferroelectric capacitor memory. This is a nonvolatile memory that holds data even after power is cut. This memory has capacitors made of a ferroelectric thin film having a perovskite structure. Remnant polarization in the ferroelectric thin film quickly inverts when the film is sufficiently thin, to speedily achieve write and read operations like a volatile memory. It is easy to increase the capacity of this memory because each memory cell only consists of a transistor and a capacitor. A technique is studied to operate the ferroelectric capacitor memory like a DRAM without inverting remnant polarization in the capacitor. Just before power is cut, the technique uses the remnant polarization to operate the memory as a nonvolatile memory. This technique is advantageous in maintaining the performance of the ferroelectric thin film of the capacitor because the film may fatigue if the remnant polarization is frequently inverted.

Another attempt is made to employ the ferroelectric capacitor for a large bypass capacitor of a GaAs microwave monolithic integrated circuit (MMIC). Electrodes of this kind of capacitor are usually made of metal such as Pt, conductive metal oxide such as $RuO_2$, or semiconductor oxide such as ITO ($InTiO_3$) and STO:Nb.

When these electrodes are used with a dielectric film to form a capacitor of a volatile memory such as a DRAM, the apparent dielectric constant of the dielectric film drastically decreases if the dielectric film is very thin. In addition, the dielectric film may cause a large leakage current to deteriorate a memory function. When such electrodes are used with a ferroelectric film such as a PZT film to form a storage capacitor of a nonvolatile memory, charges accumulated in each interface between the ferroelectric film and the electrodes may fatigue and destabilize the memory function of the capacitor.

To stabilize the memory function of a volatile memory, it is necessary to suppress the leakage current of a capacitor of the memory. To achieve this, a known technique directly bonds metal electrodes to a dielectric film and forms a Schottky barrier in each interface between the metal electrodes and the dielectric film. The Schottky barrier, however, produces a steep electric field in the dielectric film and decreases the dielectric constant thereof. Namely, this technique is effective to reduce the leakage current of a capacitor but causes a steep potential gradient to decrease the dielectric constant of the capacitor on the contrary to the original aim. The height of a Schottky barrier to be formed in a given dielectric film is determined by the electron state of metal electrodes bonded to the dielectric film. When the metal of the electrodes is Pt, Au, W, or WN, the work function of the metal determines the barrier height. Namely, the barrier height is selectable according to the metal of the electrodes. In practice, however, metals suitable for fabricating semiconductor memories are limited, and therefore, the work functions of these metals are close to one another. Accordingly, it is difficult to choose an optimum barrier height.

Instead of forming the Schottky barrier, another prior art employs semiconductor electrodes made of ITO to form a depletion layer in the electrodes around each interface between the electrodes and a dielectric film that forms a capacitor together with the electrodes. The depletion layers, however, produce series-connected Junction capacitance to decrease the capacitance of the dielectric film. In addition, a shortage of interface potential increases a leakage current. ITO or STO:Nb is incapable of providing a required electrode resistivity of $1 \times 10^{-3}$ Ω cm or below. Namely, the resistance of ITO or STO:Nb is too high.

To solve this problem, conductive oxide such as $RuO2$ is used to form electrodes of a capacitor. The electrodes may control the electron state of each interface between the electrodes and a dielectric film of the capacitor and optimize the dielectric characteristics of the capacitor. Such electrodes, however, form reactive products that degrade the dielectric characteristics of the capacitor. For example, $RuO_2$ electrodes formed on a dielectric film of $Sr_{1-x}Ba_xTiO_3$ form interface products mainly composed of SrRuO3. The electrodes also form a Ba rich layer in each interface. This Ba rich layer is ferroelectric to decrease the dielectric constant of the capacitor.

A perovskite dielectric thin film serving as a capacitor insulation film is usually made of $BaTiO_3$ or $SrTiO_3$ and has a manufacturing problem. To attain a high dielectric constant, the film must be processed under a high temperature. Accordingly, a bottom electrode on which the dielectric thin film is formed must be made from refractory metal such as platinum or palladium. It is impossible to use aluminum, copper, and Nichrome for the bottom electrode because they may vaporize during the high-temperature process or may react with the dielectric thin film to drastically decrease the dielectric constant of the film. The refractory metal, however, causes a problem of irregularities on the surface of the electrode during the high-temperature process to form the dielectric thin film. This results in providing the dielectric thin film with an uneven thickness to cause an uneven distribution of electric field. The electric field becomes stronger at a thin part of the dielectric thin film, to deteriorate the insulation characteristics of the film. When the dielectric thin film is epitaxially grown on the bottom electrode, the bottom electrode may roughen the film and may cause crystalline dislocation in the film, to thereby cause an abnormal distribution of charges. It is very difficult to carry out a finer and finer etching process on the refractory metal electrode. If W or WN, which is very easy to process, is used to form the bottom electrode or a barrier metal, the surface of the electrode or barrier metal will have irregularities. If the perovskite dielectric thin film is directly grown on the W or WN electrode, $WO_3$ will be produced to spoil the function of the electrode or barrier metal.

SUMMARY OF THE INVENTION

An object of the present invention is to provide a thin film capacitor having a high dielectric constant and a low leakage current and to provide a volatile or nonvolatile semiconductor memory employing such capacitors to achieve a required dielectric constant and a stable memory function.

Another object of the present invention is to provide a thin film capacitor composed of a BSTO dielectric thin film and conductive oxide electrodes and to provide a semiconductor memory employing such capacitors. The present invention forms the conductive oxide electrodes on each face of the dielectric thin film without an interface reaction or mutual diffusion between the dielectric thin film and the electrodes, nor changing the composition of the dielectric thin film, to thereby maintain the excellent dielectric characteristics of the thin film.

Still another object of the present invention is to provide a thin film capacitor that is stable through high-temperature manufacturing processes and has proper surface morphology and insulation characteristics, and to provide a semiconductor memory employing such thin film capacitors.

In order to accomplish the objects, a first aspect of the present invention provides a thin film capacitor comprising electrodes made of electric conductive oxide material having a perovskite structure expressed with a general formula of $ABO_3$ shown in FIG. 30. The general formula $ABO_3$ of the perovskite structure contains:

(1) A-site elements composed of at least two of alkaline-earth and rare earth metals and B-site elements composed of at least one of transition metals, or (2) A-site elements composed of at least one of rare earth metals and B-site elements composed of nickel (Ni).

More precisely, at least one of the first (top) and second (bottom) electrodes of the thin film capacitor is made of $ABO_3$ perovskite conductive oxide. The first and second electrodes sandwich a high-dielectric-constant thin film or a ferroelectric thin film made of perovskite oxide. In this specification, the high-dielectric-constant thin film and the ferroelectric thin film are each called the "dielectric thin film." These electrodes and the dielectric thin film are laminated to form the thin film capacitor that forms a part of the semiconductor memory. The alkaline-earth metals include calcium Ca, strontium Sr, barium Ba, and radium Ra in the group 2A of the periodic table. The rare earth metals include scandium Sc (having an atomic number of 21), yttrium Y (39), and lanthanides (57 to 71). The lanthanides include lanthanum La, cerium Ce, praseodymium Pr, neodymium Nd, promethium Pm, samarium Sm, europium Eu, gadolinium Gd, terbium Tb, dysprosium Dy, holmium Ho, erbium Er, thulium Tm, ytterbium Yb, and lutetium Lu. The transition metals include elements in the groups 3A to 7A, 8, and 1B of the periodic table. Namely, the transition metals include scandium Sc (having an atomic number of 21) to copper Cu (29), yttrium Y (39) to silver Ag (47), and hafnium Hf (72) to gold Au (79). Preferable ones of the transition metals for the present invention are titanium Ti, chromium Cr, manganese Mn, iron Fe, cobalt Co, and ruthenium Ru.

Specifically speaking, the electric conductive oxide material for the first or second electrode comprises at least one material selected from the group consisting of:

i) $A_1B_1O_3$, in which $A_1$ comprising at least one element of alkaline-earth elements and at least one element of rare-earth elements, and $B_1$ comprising at least one element of Fe, Mn, Cr, Ti and Ru;

ii) $A_2CoO_3$, in which $A_2$ comprising at least one element of alkaline-earth elements and at least one element selected from the group of Nd, Sm, Pr and Eu;

iii) $A_3NiO_3$, in which $A_3$ comprising at least one element of rare-earth elements;

iv) $A_4RuO_3$, in which $A_4$ comprising at least two elements of alkaline-earth elements; and v) $WReO_{3-\delta}$, in which $\delta$ representing oxygen deficiency.

The top and bottom electrodes may be arranged on the top and bottom of the dielectric thin film, respectively, or on the bottom and top thereof, respectively, or vertically, on the left and right sides thereof, respectively. The thin film capacitor may be flat as shown in FIG. 2, or cylindrical with concentric inner and outer cylinders as shown in FIG. 4. It may be three-dimensional with inner and outer concentric spheres or polyhedrons. It is preferable that each of the first and second electrodes is made of conductive perovskite oxide. Alternatively, one of the electrodes may be made of conductive perovskite oxide, and the other of another material such as a $p^+$-type silicon substrate, a refractory metal.

The A- and B-site elements of the general formula $ABO_3$ representing perovskite oxide according to the first aspect of the present invention is formed as follows from AE, which is at least one of Sr and Ca, and RE, which is at least one of the rare earth elements including Y:

(a) The A-site elements consist of $AE_{1-x}RE_x$ ($0.1 \leq x \leq 0.95$), and the B-site elements of Ti, Cr, Mn, Fe, or Co. Preferably, AE is strontium Sr, and RE is lanthanum La. Alternatively, AE is calcium Ca, and RE is yttrium Y.

(b) The A-site elements consist of $AE_{1-x}RE_x$ ($0.05 \leq x \leq 0.5$), and the B-site elements of ruthenium Ru.

(c) The A-site elements consist of $Nd_{1-x}Sr_x$ ($0.05 \leq x \leq 0.5$), and the B-site elements of Co.

(d) The A-site elements consist of RE, and the B-site elements of Ni.

The molar ratio of the A-site elements, B-site elements, and oxygen of the general formula $ABO_3$ may not precisely be 1:1:3. Some deviation from the stoichiometric composition is allowed.

The $ABO_3$ perovskite conductive oxide is considered to have a special electron state in which a Fermi surface is present in a very narrow band. Namely, this oxide is strong correlative metal. The first aspect of the present invention controls the width of the band that determines electric conductivity as well as energy between the Fermi surface and a vacuum level by changing the composition of $ABO_3$.

Materials for the dielectric thin film and $ABO_3$ perovskite electrodes and film forming processes are properly selected to fabricate a required storage capacitor. The $ABO_3$ perovskite electrodes have the same crystalline structure as that of the perovskite dielectric thin film. Accordingly, the structural consistency of the electrodes with the dielectric thin film is very high. The lattice constant of $ABO_3$ perovskite oxide is close to that of STO that is frequently used to form volatile memories. Accordingly, the electrodes and dielectric thin film are properly bonded together. By changing the composition of the A-site elements, the lattice constant of the electrodes changes to improve the structural consistency, or the lattice matching between the electrodes and the dielectric thin film, thus the interface states which cause the increase in leakage current can be avoided.

The alkaline-earth metals and rare earth metals (including Y) used as the A-site elements and the transition metals used as the B-site elements may be selected and combined in various ways. For example, conductive oxides such as $AE_{1-x}RE_xTiO_3$, $AE_{1-x}RE_xCrO_3$, $AE_{1-x}RE_xMnO_3$, and $AE_{1-x}RE_xFeO_3$ have peculiar electron states compared with normal electrode metals. Accordingly, these oxides widely control the height of a Schottky barrier when used to form electrodes. Transition metal oxide shows a very narrow band in a gap in oxygen orbits 2p and d due to element substitution, i.e., alkaline-earth metal and rare earth metal substitution. This is called an in-gap state. It is understood that a Fermi surface in the band achieves metal conduction. Changing the degree of the element substitution, i.e., the proportion x ($0.1 \leq x \leq 0.95$) of RE will change the band width of the in-gap state and the relative energy of vertically adjacent bands. In this way, the electron state of the oxide of the first aspect of the present invention is changeable from a semiconductor state to a normal metal state. Namely, changing the effective work function of the oxide will change the characteristics of a Schottky barrier produced between the electrodes and the dielectric thin film. The electron state of any one of $AE_{1-x}RE_xTiO_3$, $AE_{1-x}RE_xCrO_3$, $AE_{1-x}RE_xMnO_3$, and $AE_{1-x}RE_xFeO_3$ is easily changed by changing the composition, or the mole fraction x of RE. Materials and the mole fraction x of RE must be selected in consideration of the interface states between the electrodes of a capacitor and the dielectric thin film thereof because the interface state is affected by the characteristics of the selected materials, film forming processes, and film forming conditions.

For example, $AE_{1-x}RE_xTiO_3$ shows electric conductivity like metal when the nominal valence of Ti decreases from $4^+$. When the ion radii of RE and Ti are each large, the oxide easily becomes metal, and when the ion radii are each small, the oxide hardly becomes metal. As the mole fraction x of RE approaches 1 and the nominal valence of Ti approaches $3^+$, the oxide again becomes semiconductor. To change the electron state of a given oxide by changing ion radii, at least two alkaline-earth metals, or at least two rare earth metals, or a combination thereof must be used to change a mean ion radius. As a result, the electron state of the oxide changes from strong correlative metal to normal metal.

In this way, various electron states may be set by properly selecting the A-site elements of $AE_{1-x}RE_x$. As the nominal valence of Ti of $AE_{1-x}RE_xTiO_3$ approaches $4^+$, the oxide is stable under a high oxygen partial pressure, and as it approaches $3^+$, a balanced oxygen partial pressure decreases. This phenomenon is applicable to $AE_{1-x}RE_xCrO_3$, $AE_{1-x}RE_xMnO_3$, and $AE_{1-x}RE_xFeO_3$. This phenomenon is used to composition for a given oxide according to processes to be carried out and dielectric material to be used. Consequently, the conductive oxide $AE_{1-x}RE_xBO_3$ is proper for preparing electrodes that form a capacitor with a dielectric thin film, for a semiconductor memory such as a DRAM.

$ABO_3$ perovskite oxide containing A-site elements of $AE_{1-x}RE_x$ with AE=Sr and RE=La having a large mean ion radius shows metallic conductivity even when the mole fraction x is nearly 1. The electron state of this sort of oxide is dependent on the nominal valence of B-site elements such as Ti, Cr, Mn, and Fe and the mean ion radius of A- and B-site elements. Namely, it is possible to optionally set the electron state of this sort of oxide. For example, $Sr_{1-x}La_xTiO_3$, $Sr_{1-x}La_xCrO_3$, $Sr_{1-x}La_xMnO_3$, and $Sr_{1-x}La_xFeO_3$ show metal-like electric conductivity when the mole fraction x is in the range of 0.1 to 0.95. These oxides show a strong-correlative-metal-like electron state at each end of the range. When the mole fraction x is about 0.5, the oxides show a normal-metal-like electron state. In this way, the electron state of this kind of oxide is optionally set to form electrodes that are properly bonded to a dielectric thin film to form a capacitor.

A combination of AE=Ca and RE=Y in the A-site elements of $AE_{1-x}RE_x$ of $ABO_3$ perovskite oxide involves a small ion radius and easily transforms into semiconductor. For example, $Ca_{1-x}Y_xTiO_3$ provides high electric conductivity in the range of $0.1 \leq x \leq 0.5$ and shows a normal-metal-like electron state around x=0.3.

$AE_{1-x}RE_xRuO_3$ ($0.05 \leq x \leq 0.5$) also provides electrodes suitable for a perovskite dielectric thin film that forms, together with the electrodes, a capacitor of a semiconductor memory, by properly selecting A-site elements $AE_{1-x}RE_x$ and by changing the electron state and lattice constant thereof. If RE is not La, the oxide may show a normal-metal-like electron state similar to Pt and $RuO_2$. If RE is La, the oxide shows a strong-correlative-metal-like electron state. Properly composing $AE_{1-x}RE_x$ realizes electrodes having an interface barrier suitable for a dielectric thin film that forms a capacitor together with the electrodes. This capacitor has a high dielectric constant and a low leakage current, and therefore, is suitable for a semiconductor memory such as a DRAM.

$RENiO_3$ is semiconductor when the ion radius of RE is small. At this time, this oxide has a valence band and a conduction band separated from each other along a charge transfer gap D. As the ion radius of RE increases, the oxide becomes strong correlative metal. This is because the band width W of each of the valence and conduction bands increases to reduce an actual electron correlation D/W, thereby generating an intra-gap level similar to the substitution of the rare earth metal of $AE_{1-x}RE_xTiO_3$. Namely, similar to changing the substitution level of the rare earth element of $AE_{1-x}RE_xTiO_3$, rare earth metal having a proper ion radius may be selected for $RENiO_3$ to change the electron state of electrodes to be formed and optimize the height of a Schottky barrier in each interface between the electrodes and a dielectric thin film.

When oxide is composed of two or more rare earth elements, the mean ion radius of the oxide is determined according to the ion radius of each element and a mixing ratio of the elements. The mean ion radius determines the electron state of the oxide. This phenomenon is used to change the electron state of a given electrode material. It is preferable that the ion radius of each rare earth element or the mean ion radius of rare earth elements of oxide is equal to 0.11 nm or larger. If the ion radius or mean ion radius of oxide is smaller than 0.11 nm, the oxide will be semiconductor, which is not preferable to prepare capacitor electrodes. As the ion radius becomes greater than 0.11 nm, the electron state of the oxide changes from strong correlative metal to normal metal. In this range, an optimum electron state for the oxide is selected to fabricate electrodes that are properly bonded to a dielectric thin film to form a capacitor. The crystalline structure and lattice constant of $RENiO_3$ are close to those of a usual perovskite oxide material used to form a dielectric thin film. Namely, $RENiO_3$ has high lattice matching with the dielectric thin film. $RENiO_3$ produces no interface state in an interface between the dielectric thin film and the electrodes formed from $RENiO_3$, to thereby provide a capacitor suitable for a semiconductor memory such as a DRAM.

In this way, the first aspect of the present invention provides conductive oxide electrodes of a capacitor of a semiconductor memory. The electrodes have each a perovskite structure to be properly bonded to a perovskite dielectric thin film that forms the capacitor together with the electrodes. The oxide of the electrodes produces no parasitic interface potential that deteriorates the dielectric constant of the capacitor and degrade the fatigue characteristics of the capacitor. The oxide electrodes of the first aspect may be used with a $Ba_xSr_{1-x}TiO_3$ (BSTO) dielectric thin film. By epitaxially growing the BSTO thin film on the electrode, it is possible to greatly change the characteristics of the BSTO film. When x<0.7, BSTO is paraelectric under a room temperature and shows no spontaneous polarization. When BSTO is epitaxially grown on an MgO substrate, stress due to a mismatching between them increases a Curie temperature to change BSTO to be ferroelectric under a room temperature. This phenomenon also occurs when BSTO is epitaxially grown on a conductive oxide electrode prepared according to the first aspect of the present invention. Accordingly, BSTO is used to form a ferroelectric memory as shown in FIGS. 9 and 14.

In this case, a conductive oxide electrode serving as a bottom electrode of a capacitor of the memory must be a polycrystalline or single crystalline film precisely oriented. The bottom electrode is made of, for example, (AE, RE)$TiO_3$, (Sr, Ca, RE)$RuO_3$, or $RENiO_3$, and a c-axis of the electrode is oriented vertical to the surface thereof. The composition of the electrode is properly selected so that the length of each of a- and b-axes of the electrode is sufficiently shorter than that of the BSTO film. This results in reinforcing ferroelectricity caused by the stress due to substrate mismatching and increasing a dielectric constant. For example, $Ca_{1-x}Y_xTiO_3$ has lattice constants of a=0.536 nm and b=0.553 nm when x=0.5. At this time $(a^2+b^2)^{1/2}/2$ corresponding to the lattice constant of BSTO is smaller than twice a lattice constant of 0.391 nm of BSTO, so that BSTO is ferroelectric when BSTO is epitaxially grown on the $Ca_{1-x}Y_xTiO_3$ bottom electrode. When x is increased, the length of b-axis of $Ca_{1-x}Y_xTiO_3$ becomes larger to reduce the effect of lattice mismatching.

Compared with conventional noble metal electrodes, the oxide electrodes according to the first aspect of the present invention are inexpensive and have good processibility, heat resistance, and durability against oxidization. The oxide electrodes of the first aspect are easily formed from inexpensive high-performance dielectric materials according to a CVD technique, to manufacture semiconductor memories. It is known that the dielectric constant of a dielectric thin film in a perpendicular direction to the surface thereof improves when a compression stress is applied in an in-surface direction. Any one of the conductive oxide electrodes according to the first aspect has a proper thermal expansion coefficient with respect to a perovskite dielectric thin film, to apply proper stress to the dielectric thin film and improve the dielectric constant thereof. This effect is conspicuous when forming stack capacitors having a finite aspect ratio, for a semiconductor memory. The aspect ratio may be 1 to 3 as shown in FIG. 22. The conductive oxide electrodes according to the first aspect of the present invention have an electric resistivity further smaller than that provided by known ITO, STO, and $LaNiO_3$. This results in reducing wiring resistance when forming semiconductor integrated circuits such as memories, increasing the degree of freedom of designing semiconductor memories, improving the high-frequency characteristics of memories even in a gigahertz band, and easily realizing high-speed large-capacity memories.

A second aspect of the present invention employs perovskite conductive oxide electrodes containing Ru and a BSTO dielectric thin film, to form a capacitor without deteriorating the dielectric constant thereof nor causing an interface reaction between the dielectric thin film and the electrodes or a mutual diffusion between them. As shown in FIG. 15B, at least one of first and second electrodes 242 and 244 is made of $Sr_{1-x}Ba_xRuO_3$ (0<x<1, preferaby $0.1 \leq x \leq 0.6$), and these electrodes sandwich a dielectric thin film 243 made of $Sr_{1-x}Ba_xTiO_3$, to form a capacitor of a memory such as a DRAM.

Even if Ba and Sr diffuse between the BSTO thin film and the electrodes during film forming processes and heat-treatments, the ratio of Ba to Sr in the dielectric thin film around an electrode-film interface will be unchanged, to thereby avoid an unintended low-dielectric constant layer that may decrease the dielectric constant of the capacitor. The cation radius of Ba (0.161 nm for $Ba^{2+}$) greatly differs from that of Sr (0.144 nm for $Sr^{2+}$), and therefore, strain in the perovskite structure of $Sr_{1-x}Ba_xRuO_3$ changes. Here, a relationship between the crystalline strain of a perovskite structure and the electron state thereof is widely known. The smaller the strain, the more metallic the electron state of the structure, to show high conductivity. This is described in, for example, "Systematic study of insulator-metal transition in perovskite $RNiO_3$ (R=Pr, Nd, Sm, Eu) due to closing of charge transfer gap" by J. B. Torrance in Phys. Rev. B45, 8209, 1992. It is also known that a thin film capacitor having a very thin dielectric layer produces a Schottky barrier in an interface between the dielectric layer and an electrode, to greatly affect the dielectric constant and leakage current of the capacitor. The height of the Schottky barrier changes depending on the electron state of the electrode material. The first aspect of the present invention changes the electron state of the electrode material to change the height of the barrier in the interface between the dielectric layer and the electrode and optimize the dielectric characteristics of the capacitor. This is applied to the second aspect of the present invention to change the ratio of Sr to Ba of the electrodes made of $Sr_{1-x}Ba_xRuO_3$, to change the electron state of the electrodes and improve the performance of the capacitor. To change the electron state of the electrodes and optimize the characteristics of the dielectric thin film, the second aspect substitutes rare earth elements such as La and Nd having a proper ion radius for a part of Sr or Ba of the $Sr_{1-x}Ba_xRuO_3$ electrodes. Adding rare earth elements is effective to prevent a generation of insulating reactive products having a low dielectric constant when the dielectric material and electrode material mutually diffuse to each other through an interface between them. Namely, the reactive products containing mainly Ti due to the mutual diffusion is doped with the rare earth elements, to maintain a metal-like conductivity, the essential function as the electrodes, and the high dielectric constant. Similar to the first aspect, the second aspect employs the ABO$_3$ perovskite oxide to form electrodes. Similar to the first aspect, many elements may be used as A-site elements of the perovskite oxide, to improve the crystalline characteristics of the electrodes and the morphology of the surface thereof, thereby providing a high-performance thin film capacitor.

A third aspect of the present invention provides capacitors of a semiconductor memory such as a DRAM shown in FIGS. 18 and 21. Each capacitor consists of a bottom electrode 242, a dielectric thin film 243 having a perovskite structure, and a top electrode 244. These films are sequentially laminated one upon another. The bottom electrode 242 on which the dielectric thin film 243 is directly formed is made of $W_{1-x}Re_xO_{3-\delta}$ (a mixed crystal of $WO_3$ and $ReO_3$). In FIGS. 18 and 21, the electrodes 242 and 244 are named as the top and bottom electrodes. These are dependent on manufacturing processes, and any one of them may be top or bottom. According to the third aspect, at least one of the electrodes is made of $W_{1-x}Re_xO_{3-\delta}$. This $W_{1-x}Re_xO_{3-\delta}$ must be a top layer of one of the electrodes on which the perovskite dielectric thin film is formed. The bottom electrode 242 on which the dielectric thin film 243 is directly formed may be composed of a lower layer 242b made of W or WN and an upper layer 242a made of $W_{1-x}Re_xO_{3-67}$ as shown in FIG. 21. The bottom electrode according to the third aspect is not roughened through high-temperature manufacturing processes, and therefore, the dielectric thin film formed thereon has excellent insulation characteristics. According to the prior arts, a perovskite dielectric thin film must be formed on an electrode layer made of refractory metal such as platinum, which is very hard to process. On the other hand, $W_{1-x}Re_xO_{3-\delta}$ is easy to process by etching. According to the prior arts, an oxide thin film must not directly be grown on an electrode or barrier metal that is made of W or WN because it produces insulation oxide $WO_3$ to spoil the function of the electrode or barrier metal. On the other hand, the third aspect of the present invention forms a mixed crystal of $WO_3$ and $ReO_3$ on a bottom electrode before forming an oxide film thereon. Accordingly, no oxidization occurs when the dielectric thin film is formed, and therefore, the high conductivity of the bottom electrode is secured. Consequently, the capacitor of the third aspect involves a small leakage current and a high dielectric constant.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
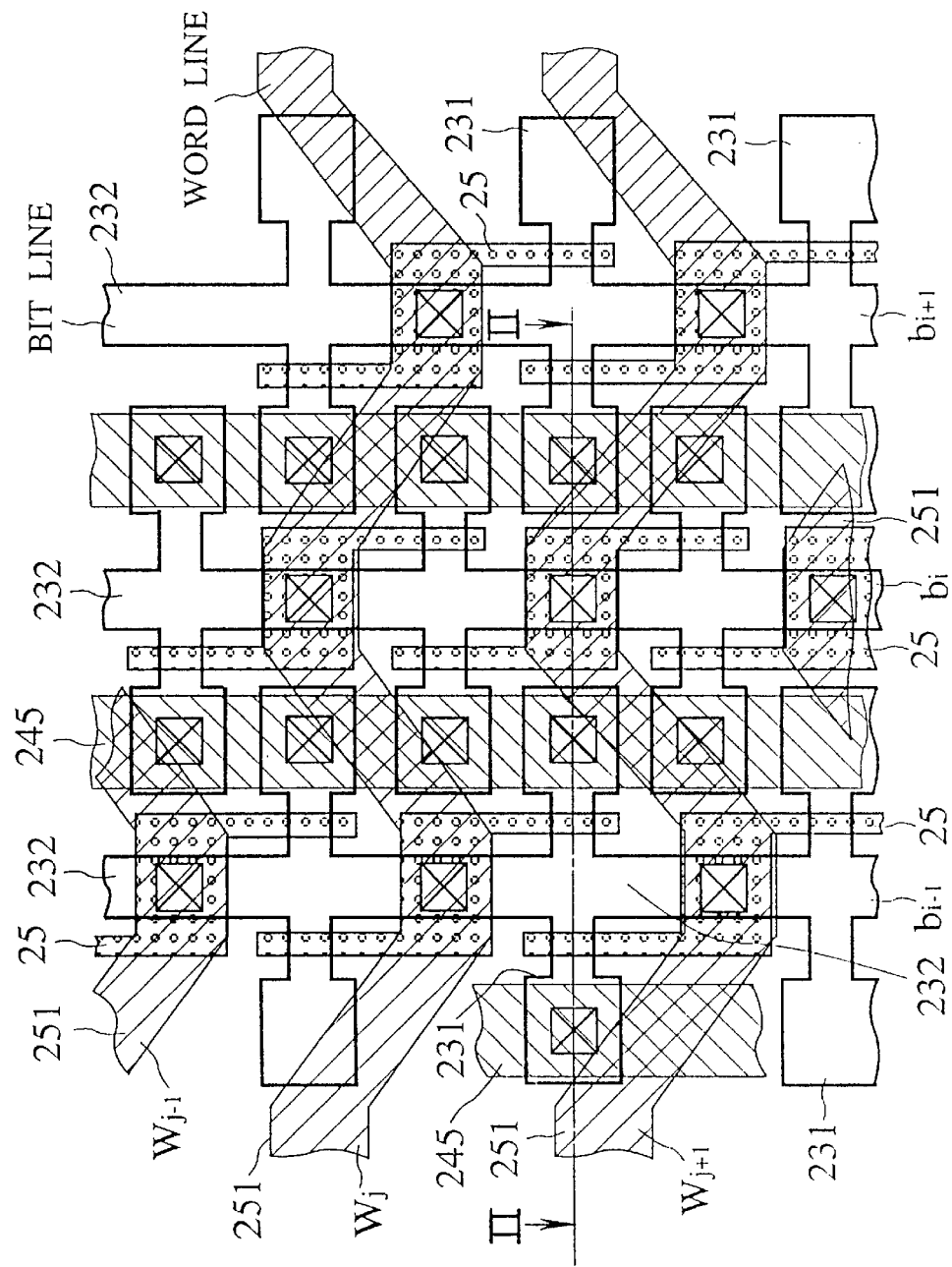
FIG. 1 is a plan view showing a DRAM according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally, and as it is conventional in the representation of semiconductor memories, it will be appreciated that the various drawings are not drawn to scale from one figure to another nor inside a given figure, and in particular that the layer thicknesses are arbitrarily drawn for facilitating the reading of the drawings.

[First Embodiment]

Figure 2:
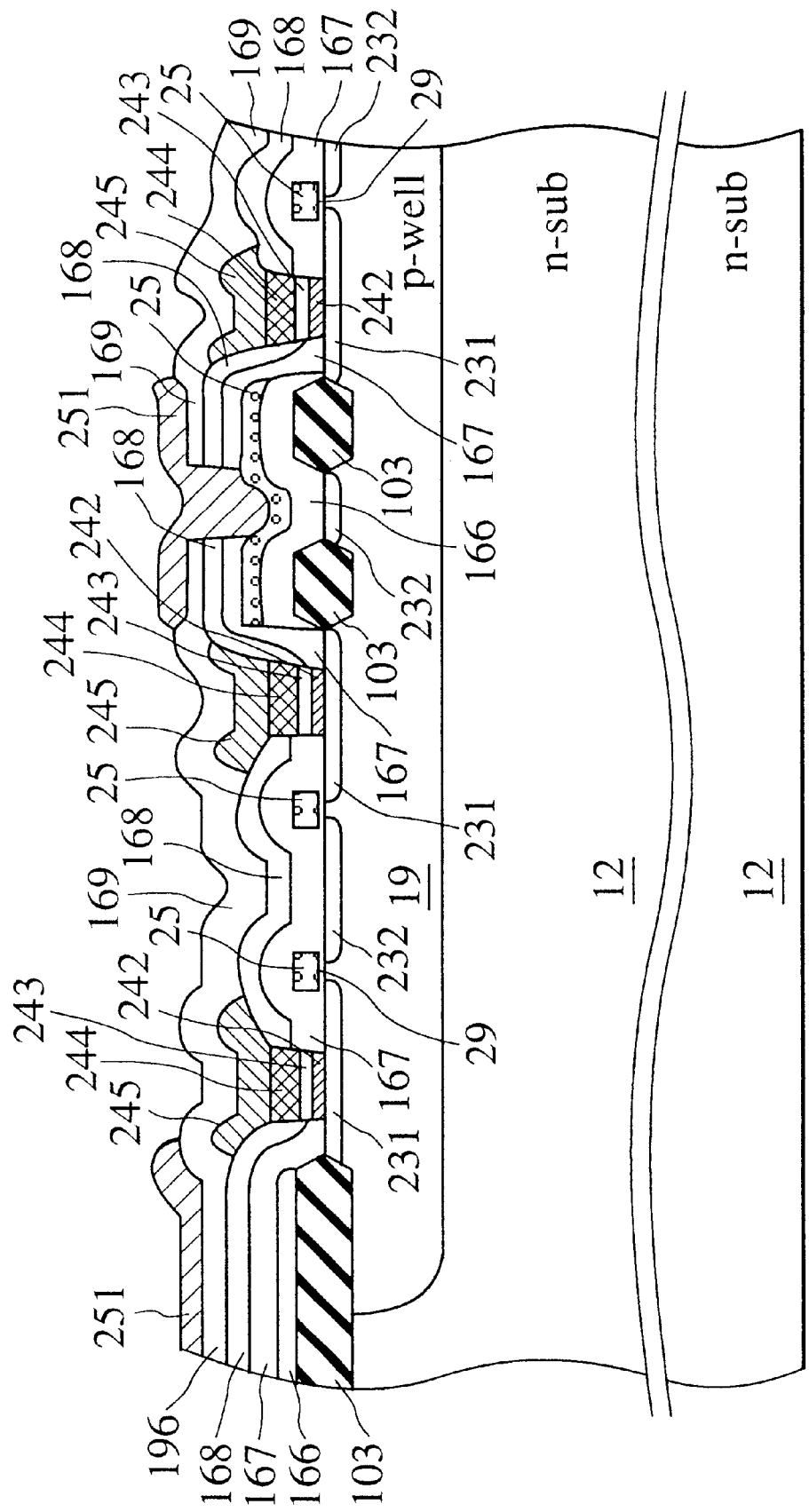
FIG. 2 is a sectional view taken along a line II—II of FIG. 1.
Figure 3:
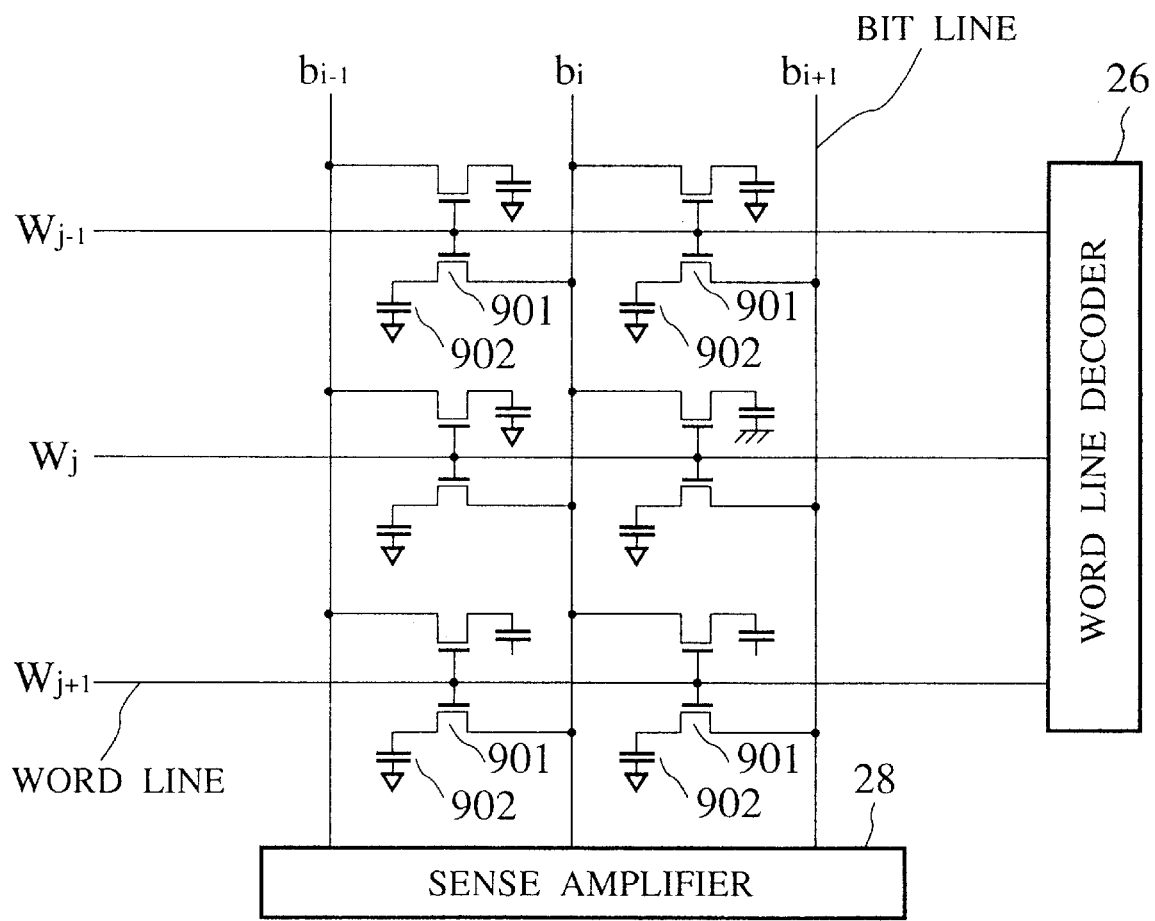
FIG. 3 is a circuit diagram showing the DRAM of FIG. 1.

FIG. 1 is a plan view showing a DRAM according to the first embodiment of the present invention, FIG. 2 is a sectional view taken along a line II—II of FIG. 1, and FIG. 3 shows an equivalent circuit of the DRAM. Each cell of the DRAM consists of a transistor and a storage capacitor. The capacitor consists of a dielectric thin film made of a perovskite oxide having a high dielectric constant, and electrodes that sandwich the dielectric thin film. The electrodes are made of conductive oxide having a perovskite structure represented with a general formula of $ABO_3$.

In FIG. 2, the DRAM has an n-type substrate 12 on which a p-type well (hereinafter called "the p-well") 19 is formed. The impurity concentration of the well 19 is in the range of $1 \times 10^{16}$ to $5 \times 10^{17}$ cm$^{-3}$. On the surface of the p-well 19, there are formed the switching MOS transistor and capacitor. The transistor and capacitor form a cell, and an X-Y matrix of the cells form the DRAM as shown in FIG. 1. A word line 251 is made of Al, and a bit line 232 is made of an n$^+$-type buried diffusion layer. In FIG. 2, the switching transistor consists of an n$^+$type source region 231, an n$^+$type drain region 232, and a gate electrode 25. The source region 231 is formed at the surface of the p-well 19 and has an impurity concentration of $1 \times 10^{19}$ to $1 \times 10^{21}$ cm$^{-3}$. The drain region 232 serves as the bit line. The gate electrode 25 is formed on a gate oxide film 29 having a thickness of 30 to 50 nm. The gate electrode 25 is made of a polysilicon layer of 350 to 500 nm thick doped with arsenic (As), i.e., doped polysilicon (DOPOS).

Interlayer insulation films 167 and 168 are formed from $SiO_2$/PSG or BPSG on the source region 231. The insulation films 167 and 168 have openings in which the storage capacitor is formed. The storage capacitor has a bottom electrode 242, a dielectric thin film 243, and a top electrode 244. The bottom electrode 242 serves as a storage node electrode and is made of a film of $Sr_{0.8}La_{0.2}TiO_3$ of 100 nm thick on the source region 231. The dielectric thin film 243 has a thickness of 100 nm and is made of $Sr_{0.8}Ba_{0.4}TiO_3$. The top electrode 244 is a film of $Sr_{0.8}La_{0.2}TiO_3$ of 300 nm thick. These films 242, 243, and 244 are deposited according to a selective MOCVD technique in the openings of the insulation films 167 and 168. The bottom electrode 242 is electrically connected to the source region 231. Although not shown in FIG. 2, a barrier metal layer such as W, Ti, TiN may be interposed between the source region 231 and the bottom electrode 242. The top electrode 244 is electrically connected to a plate electrode 245, which is a doped polysilicon (DOPOS) film or a silicide film made of $WSi_2$, $MoSi_2$, or $TiSi_2$.

The gate electrode 25 is electrically connected to the word line 251 through a contact hole that is formed through the interlayer insulation films 167, 168, and 169 that are formed on the gate electrode 25. The capacitance of the capacitor of this embodiment is at least 100 times as large as that of a conventional capacitor made of silicon oxide ($SiO_2$). Accordingly, the capacitor formed in the small contact hole having the dimensions of 0.25 μm by 0.25 μm or 0.18 μm by 0.18 μm is capable of providing capacitance required for a 256-Mb DRAM or 1-Gb DRUM. The film 242 serving as the silicon bottom electrode may be omitted, and the source region 231 may be used as the bottom electrode. Alternatively, the source region 231 may be omitted, and the surface of the well 19 may be used as the bottom electrode like a standard DRAM.

Figure 5:
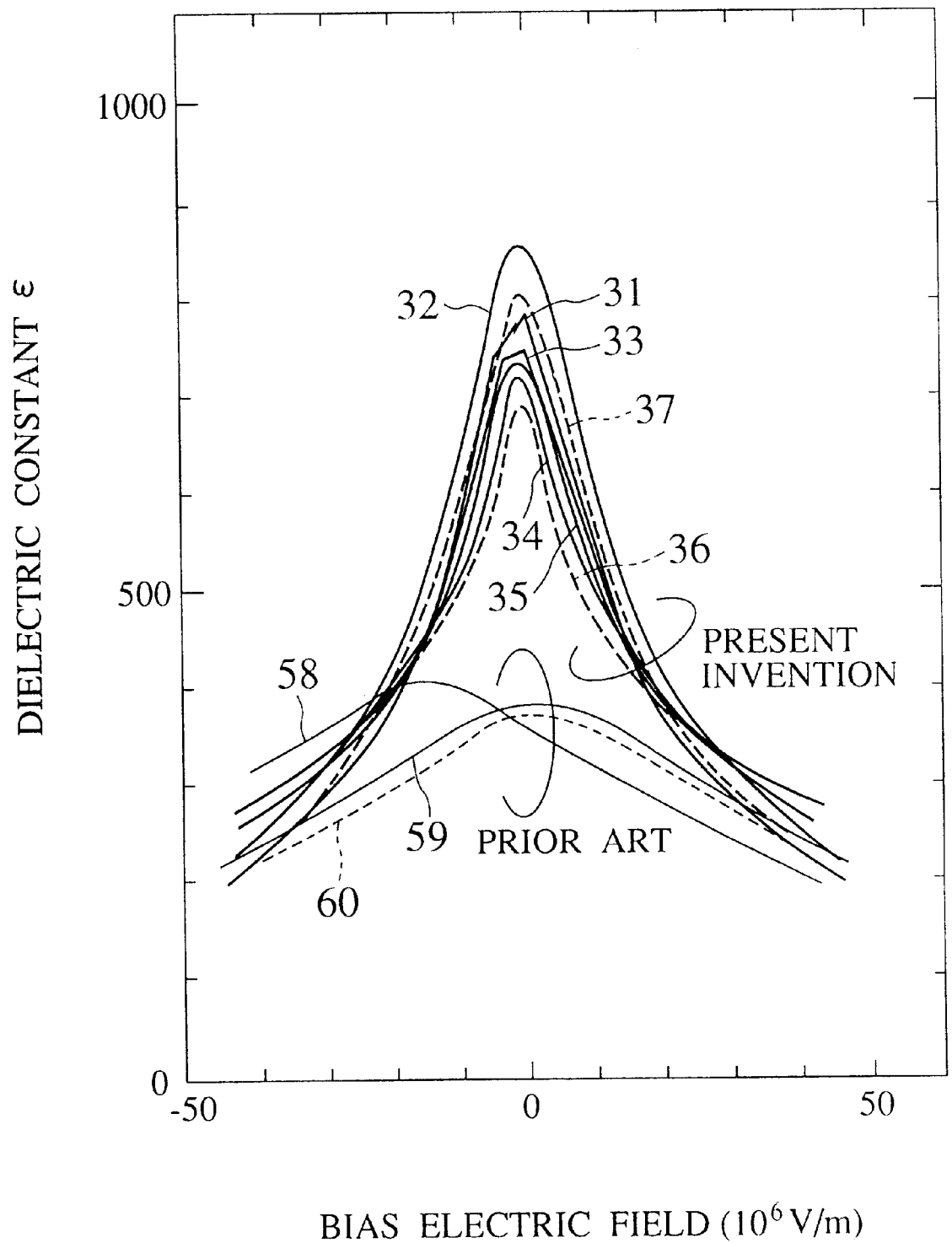
FIG. 5 is a graph showing the bias electric field dependency of the dielectric constants of capacitors according to the first, second and a 10th embodiments of the present invention and prior arts.
Figure 6:
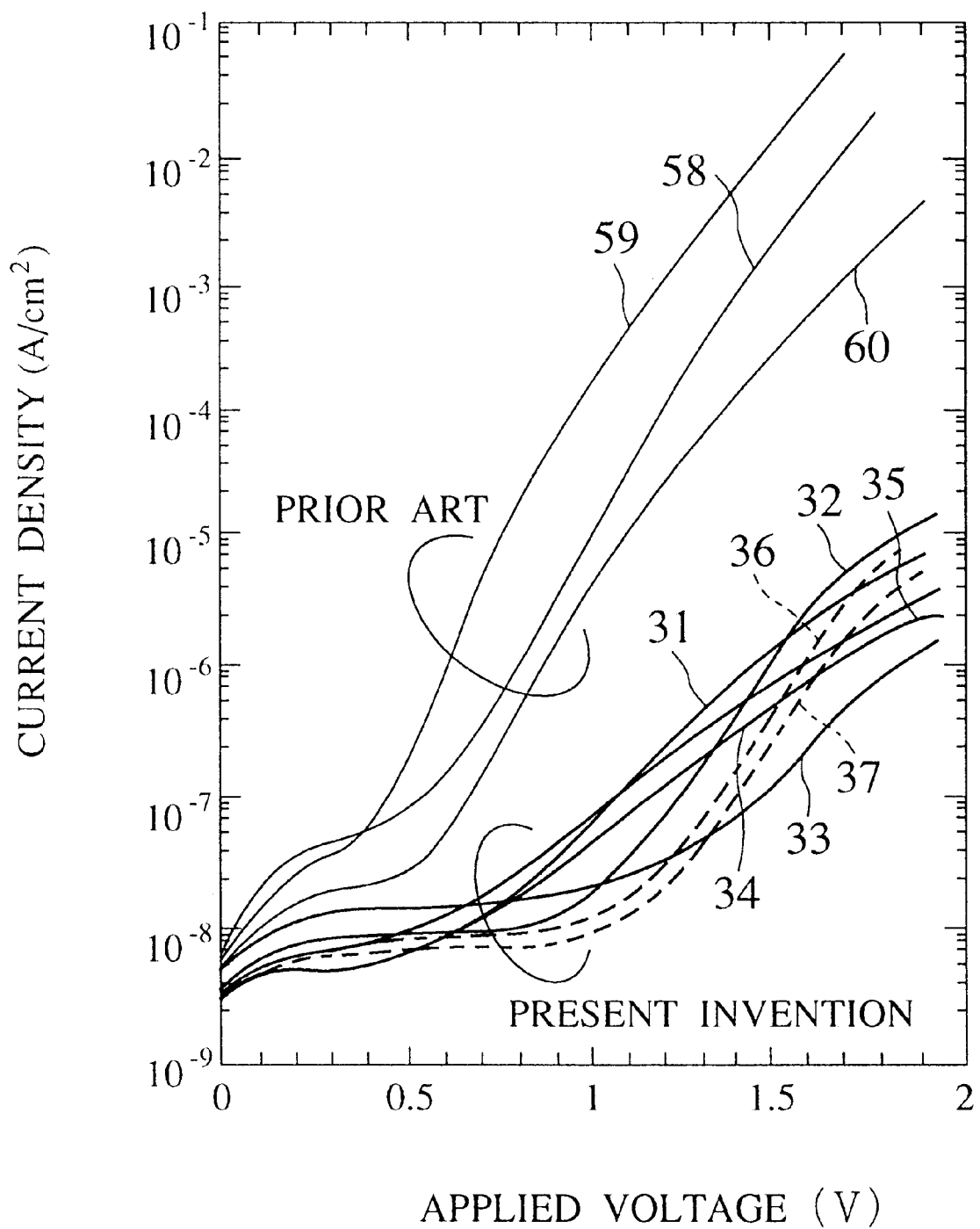
FIG. 6 is a graph showing the relationships between a leakage current and a DC bias voltage of the capacitors of FIG. 5.

FIG. 5 is a graph showing the bias electric field dependency of the dielectric constants of capacitors according to the present invention and prior arts, and FIG. 6 is a graph showing the voltage dependency of the leakage currents of the capacitors. These graphs are based on tests made with TEG (Test Element Group) patterns that electrically separate the capacitors from other elements. In each of FIGS. 5 and 6, a curve 31 represents the capacitor made of $Sr_{0.8}La_{0.2}TiO_3/Sr_{0.6}Ba_{0.4}TiO_3/Sr_{0.8}La_{0.2}TiO_3$ according to the first embodiment. A curve 58 represents a conventional capacitor having a top electrode made of Pt and a bottom electrode made of ITO. A curve 59 represents a conventional capacitor having top and bottom electrodes made of ITO. A curve 60 represents a conventional capacitor having a top electrode made of ITO and a bottom electrode made of STO:Nb. The storage capacitor having the electrodes of $AE_{1-x}RE_xTiO_3$ according to the first embodiment shows a higher dielectric constant and lower leakage current than the conventional ones.

In this way, the electrodes according to the first embodiment optimize a barrier height in each interface between the electrodes and the dielectric thin film and have a thermal expansion coefficient proper for the dielectric thin film. As a result, the storage capacitor of the first embodiment has a high dielectric constant and a low leakage current. The capacitor is small and provides large capacitance, to help miniaturing the feature size of the memory and increasing the capacity thereof. The electrodes of the first embodiment show good lattice matching with the perovskite dielectric thin film, to cause no accumulation of charges due to interface lattice mismatching, nor degradation of dielectric material due to crystalline distortion. Consequently, the capacitor according to the first embodiment has a large dielectric constant and a stable memory function.

[Second Embodiment]

Figure 4:
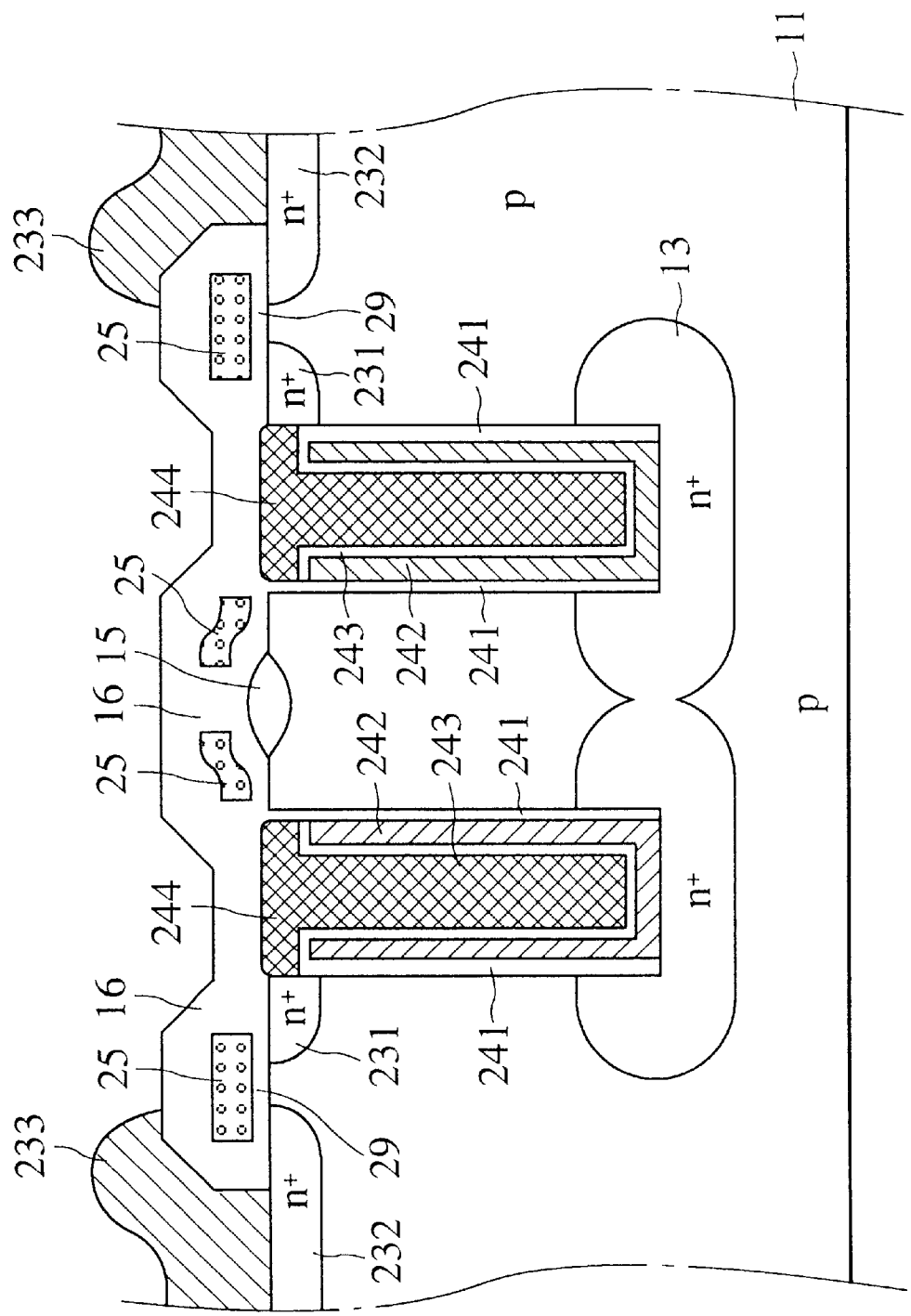
FIG. 4 is a sectional view showing a DRAM according to a second embodiment of the present invention.

FIG. 4 is a sectional view showing a DRAM according to the second embodiment of the present invention. The DRAM has a p-type substrate 11 having an impurity concentration of $1 \times 10^{16}$ to $1 \times 10^{17}$ cm$^{-3}$. A trench to form a storage capacitor is formed in the substrate 11. Although the plan view of the trench is not shown, the three-dimensional shape of the trench may be a cylinder, a quadrangular prism, a hexagonal prism or an octagonal prism. An n$^+$-type plate electrode 13 is formed in the substrate 11 around the bottom of the trench. The impurity concentration of the electrode 13 is 1 to $5 \times 10^{19}$ cm$^{-3}$. The depth of the trench is, for example, 7 μm and the diameter thereof is, for example, 1.5 μm. The depth, diameter, and aspect ratio of the trench are properly determined according to the required capacitance of the capacitor. According to the second embodiment, a dielectric thin film 243 has a high dielectric constant to provide large capacitance, and therefore, the aspect ratio of the trench may be 1 to 3.

An oxide film 241 of 50 nm thick is formed on the inner wall of the trench. Formed on the film 241 is a bottom electrode 242 of 400 nm thick serving as a sheath plate electrode. The bottom electrode 242 is made of $Sr_{0.8}La_{0.2}TiO_3$. On the bottom electrode 242, the dielectric thin film 243 is formed from $Sr_{0.6}Ba_{0.4}TiO_3$ to a thickness of 100 nm. On the dielectric thin film 243, a top electrode 244 is formed from $Sr_{0.8}La_{0.2}TiO_3$ to a thickness of 400 nm. These films 242 to 244 form the capacitor of the DRAM. The top electrode 244 is electrically connected to an $n^+$-type source region 231 of a switching MOS transistor, and the bottom electrode 242 is electrically connected to the plate electrode 13.

The switching transistor consists of the $n^+$-type source region 231, an $n^+$-type drain region 232, and a gate electrode 25. The source region 231 is formed on the surface of the substrate 11. The gate electrode 25 is formed on a gate oxide film 29, which is formed on the substrate 11 between the source and drain regions 231 and 232. The gate electrode 25 serves as a word line 25. The drain region 232 is electrically connected to a bit line 233. The gate electrode 25 is made of doped polysilicon (DOPOS). The electrodes 242 and 244 made of $Sr_{0.8}La_{0.2}TiO_3$ and the dielectric thin film 243 made of $Sr_{0.6}Ba_{0.4}TiO_3$ are formed according to a metal organic CVD (MOCVD) technique and are patterned according to an ion-milling technique.

The electrodes and dielectric thin film formed according to the MOCVD technique have a good step coverage so that the capacitor is easily formed in the trench as shown in FIG. 4.

According to the results of TEG pattern tests shown in FIGS. 5 and 6, the trench capacitor made of $Sr_{0.8}La_{0.2}TiO_3/Sr_{0.6}Ba_{0.4}TiO_3/Sr_{0.8}La_{0.2}TiO_3$ according the second embodiment showed a characteristic similar to the curve 31 in the first embodiment, superior to the prior art curves 58 with a top electrode made of Pt and a bottom electrode made of ITO, 59 with top and bottom electrodes made of ITO, and 60 with a top electrode made of ITO and a bottom electrode made of STO:Nb.

The capacitor of the second embodiment is not limited to $Sr_{0.8}La_{0.2}TiO_3/Sr_{0.8}Ba_{0.4}TiO_3/Sr_{0.8}La_{0.2}TiO_3$. For example, the following modifications are possible:

(a) Modification 1

A capacitor has top and bottom electrodes made of $Ca_{0.7}Y_{0.3}TiO_3$. The dielectric constant and leakage current of this capacitor are indicated with curves 32 in FIGS. 5 and 6.

(b) Modification 2

A capacitor has top and bottom electrodes made of $Ca_{0.5}Nd_{0.5}TiO_3$. The dielectric constant and leakage current of this capacitor are indicated with curves 33 in FIGS. 5 and 6.

(c) Modification 3

A capacitor has top and bottom electrodes made of $Ca_{0.4}Sr_{0.2}Y_{0.2}La_{0.2}TiO_3$. The dielectric constant and leakage current of this capacitor are indicated with curves 34 in FIGS. 5 and 6.

(d) Modification 4

Figure 7:
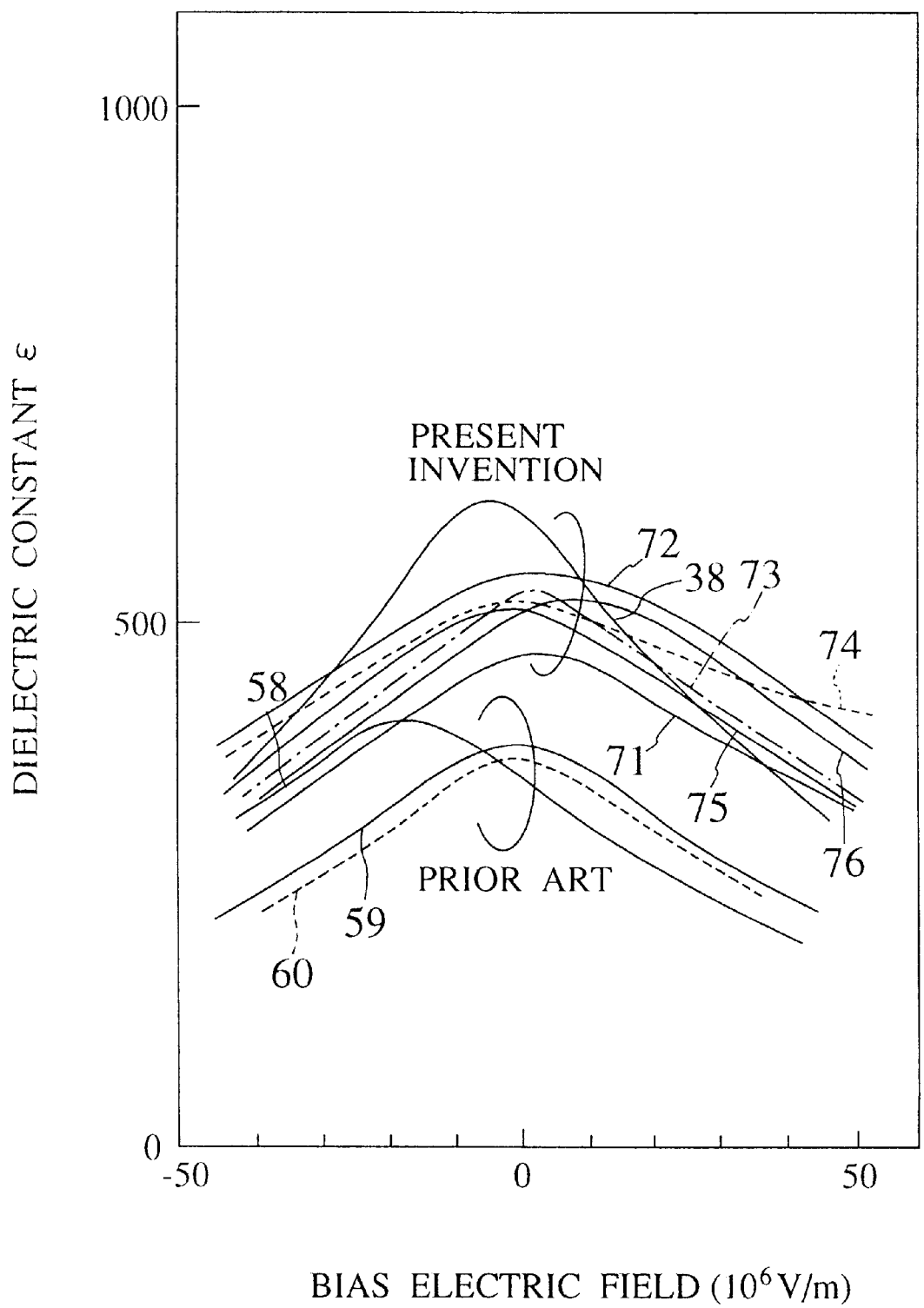
FIG. 7 is a graph showing the bias electric field dependency of the dielectric constants of capacitors according to the second embodiment of the present invention and prior arts.
Figure 8:
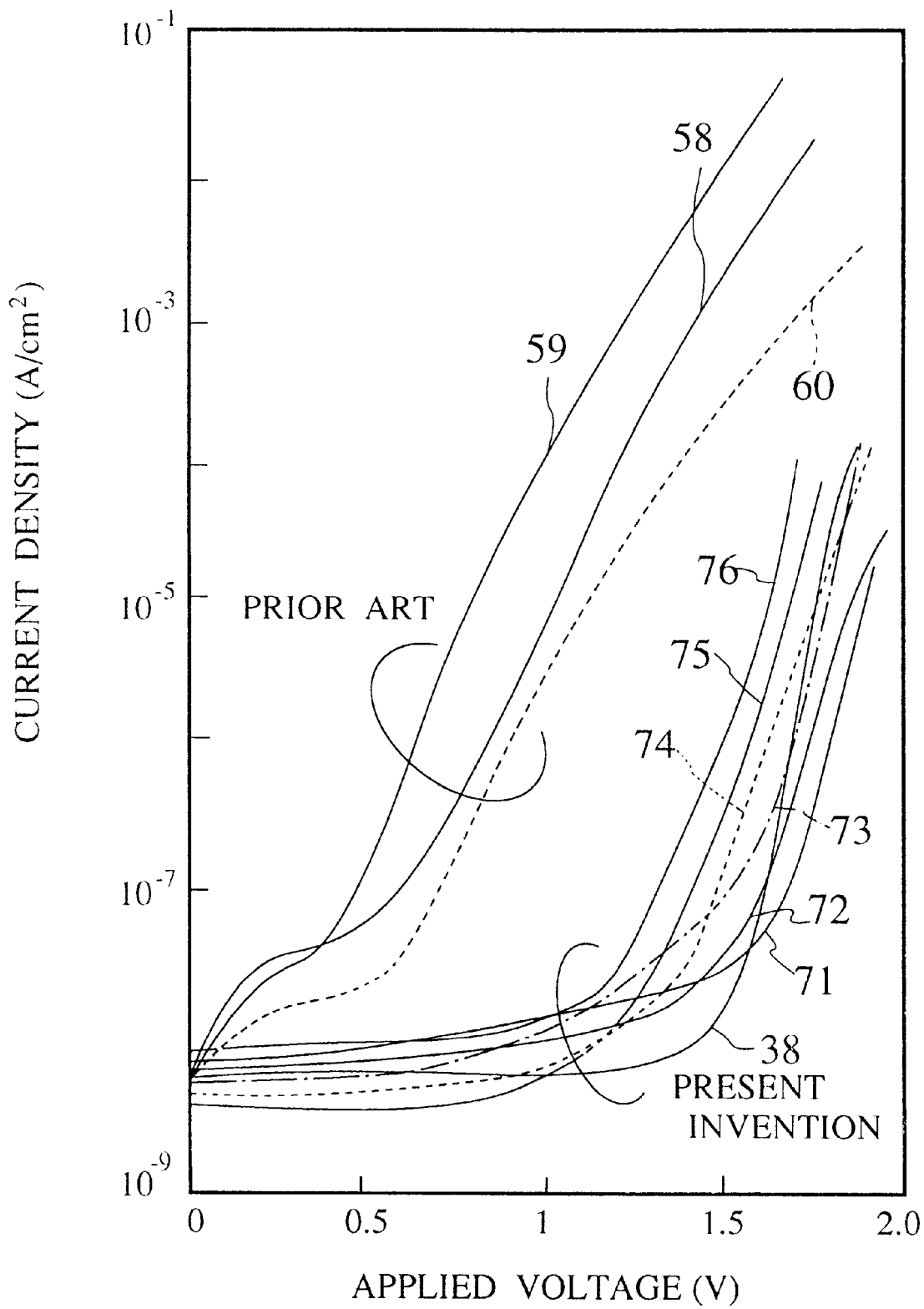
FIG. 8 is a graph showing the DC bias voltage dependency of the leakage currents of the capacitors of FIG. 7.

A capacitor has top and bottom electrodes made of $Sr_{0.5}Nd_{0.5}TiO_3$. The dielectric constant and leakage current of this capacitor are indicated with curves 38 in FIGS. 7 and 8.

(e) Modification 5

A capacitor has top and bottom electrodes made of $La_{0.5}Sr_{0.5}CrO_3$. The dielectric constant and leakage current of this capacitor are indicated with curves 71 in FIGS. 7 and 8.

(f) Modification 6

A capacitor has top and bottom electrodes made of $Nd_{0.5}Sr_{0.5}CrO_3$. The dielectric constant and leakage current of this capacitor are indicated with curves 72 in FIGS. 7 and 8.

(g) Modification 7

A capacitor has top and bottom electrodes made of $La_{0.4}Sr_{0.6}MnO_3$. The dielectric constant and leakage current of this capacitor are indicated with curves 73 in FIGS. 7 and 8.

(h) Modification 8

A capacitor has top and bottom electrodes made of $Nd_{0.4}Sr_{0.6}MnO_3$. The dielectric constant and leakage current of this capacitor are indicated with curves 74 in FIGS. 7 and 8.

(i) Modification 9

A capacitor has top and bottom electrodes made of $La_{0.1}Sr_{0.9}FeO_3$. The dielectric constant and leakage current of this capacitor are indicated with curves 75 in FIGS. 7 and 8.

(j) Modification 10

A capacitor has top and bottom electrodes made of $Nd_{0.5}Sr_{0.5}CoO_3$. The dielectric constant and leakage current of this capacitor are indicated with curves 76 in FIGS. 7 and 8.

Note that the capacitor characteristics for 10th embodiment (curves 35, 37) and for an application (curve 36), which will be explained later, are also included in FIGS. 5 and 6.

These ten modifications are applicable to the first embodiment as well. Any one of the capacitors according to the first and second embodiments and modifications is formed according to the MOCVD technique employing a β-diketone complex as a source gas of alkaline-earth metal. The β-diketone complex is expressed with a general formula of $M(OCR1CHCR20)_2$ with R1 and R2 shown in Table 1. A most general form is $M(DPM)_2$ in Table 1. Here, M represents alkaline-earth metal such as Sr and Ca.

TABLE 1

| R1 | R2 | Abbreviation |
|---|---|---|
| $CH_3$ | $CH_3$ | $M(AcAc)_2$ |
| $C(CH_3)_3$ | $C(CH_3)_3$ | $M(DPM)_2$ |
| $CF_3$ | $CF_3$ | $M(HFA)_2$ |
| $CH_3$ | $CF_3$ | $M(TFA)_2$ |
| $C(CH_3)_3$ | $CF_3$ | $M(TPM)_2$ |
| $C(CH_3)_3$ | $C_2F_5$ | $M(PPM)_2$ |
| $C(CH_3)_3$ | $C_3F_7$ | $M(FPM)_2$ |

A source gas for rare earth elements such as La and Nd may also be the β-diketone complex. Ti may be formed from the β-diketone complex such as an alkoxide compound such as $Ti(OR)_4$ and $TiO(DPM)_2$, or an alkylamine compound such as $Ti(NR_3)_4$. Here, R represents an alkyl radical $C_nH2_{n+1}$ (n=1, 2, 3, . . . ). The alkoxide compound is usually $Ti(i-OC_3H_7)_4$.

The MOCVD technique may be a normal-pressure MOCVD technique, or a reduced-pressure MOCVD (LPMOCVD) technique that is carried out under a pressure of 5 to 20 kPa. If the thickness of a thin film to be formed must be accurate, a growth pressure of about $1.3 \times 10^{-3}$ Pa is used with the above-mentioned source gases, and a CBE (chemical beam epitaxy) technique is employed. When forming cells of a 4-Gb or 16-Gb DRAM, a reduced pressure of about $6 \times 10^{-4}$ Pa is used with the above-mentioned gases being alternately introduced, and an MLE (molecular layer epitaxy) technique is employed. In this case, a film having an accuracy of molecular layer order is formed.

Any one of the first and second embodiments may thin the electrodes of a capacitor to an order of debye length. It is possible to form a mesoscopic (≈10 nm) scale capacitor according to the MLE technique. If the accuracy of the thickness of a film is not so strict, an RF spattering technique or an MBE (molecular beam epitaxy) technique may be employed. A technique such as MOCVD that uses chemical surface reactions is preferable than a technique that uses physical surface reactions because the chemical techniques are capable of carrying out high quality selective epitaxy and providing proper step coverage. And if Nd is replaced by Eu, Sm, or Pr in the above-mentioned modification 10, similar characteristics are obtained, although the wiring resistance increases to some extent.

[Third Embodiment]

Figure 9:
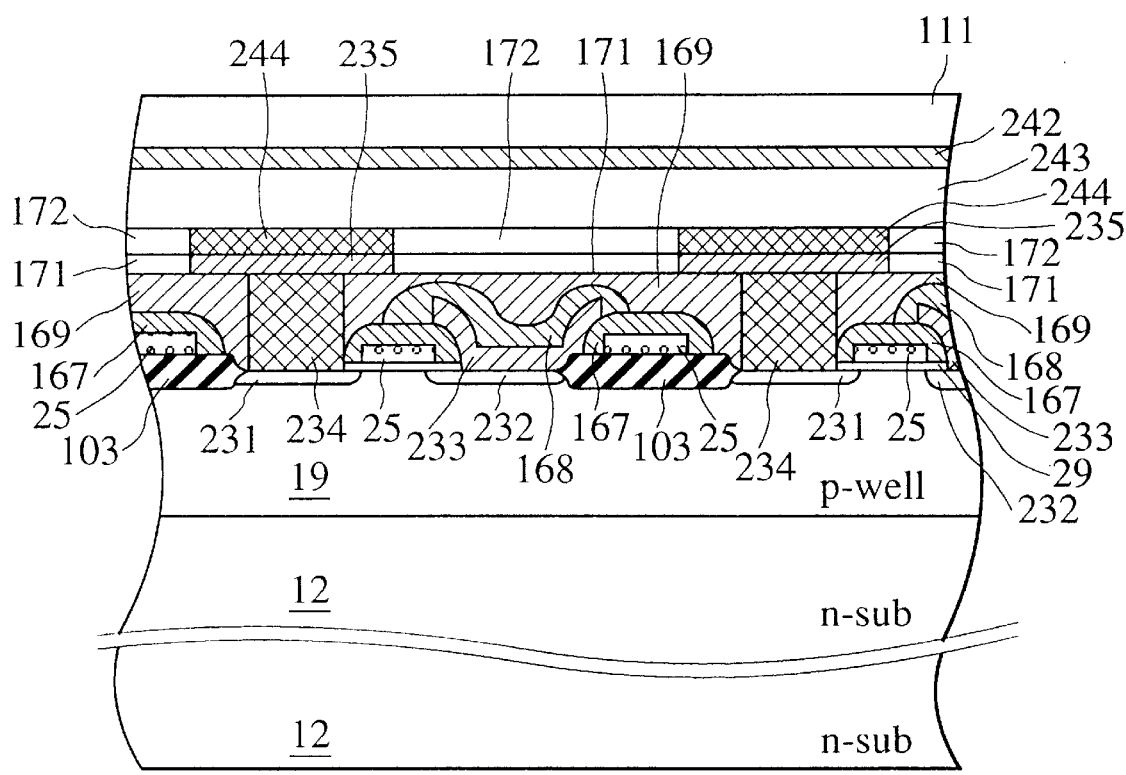
FIG. 9 is a sectional view showing a nonvolatile memory according to a third embodiment of the present invention.
Figure 10:
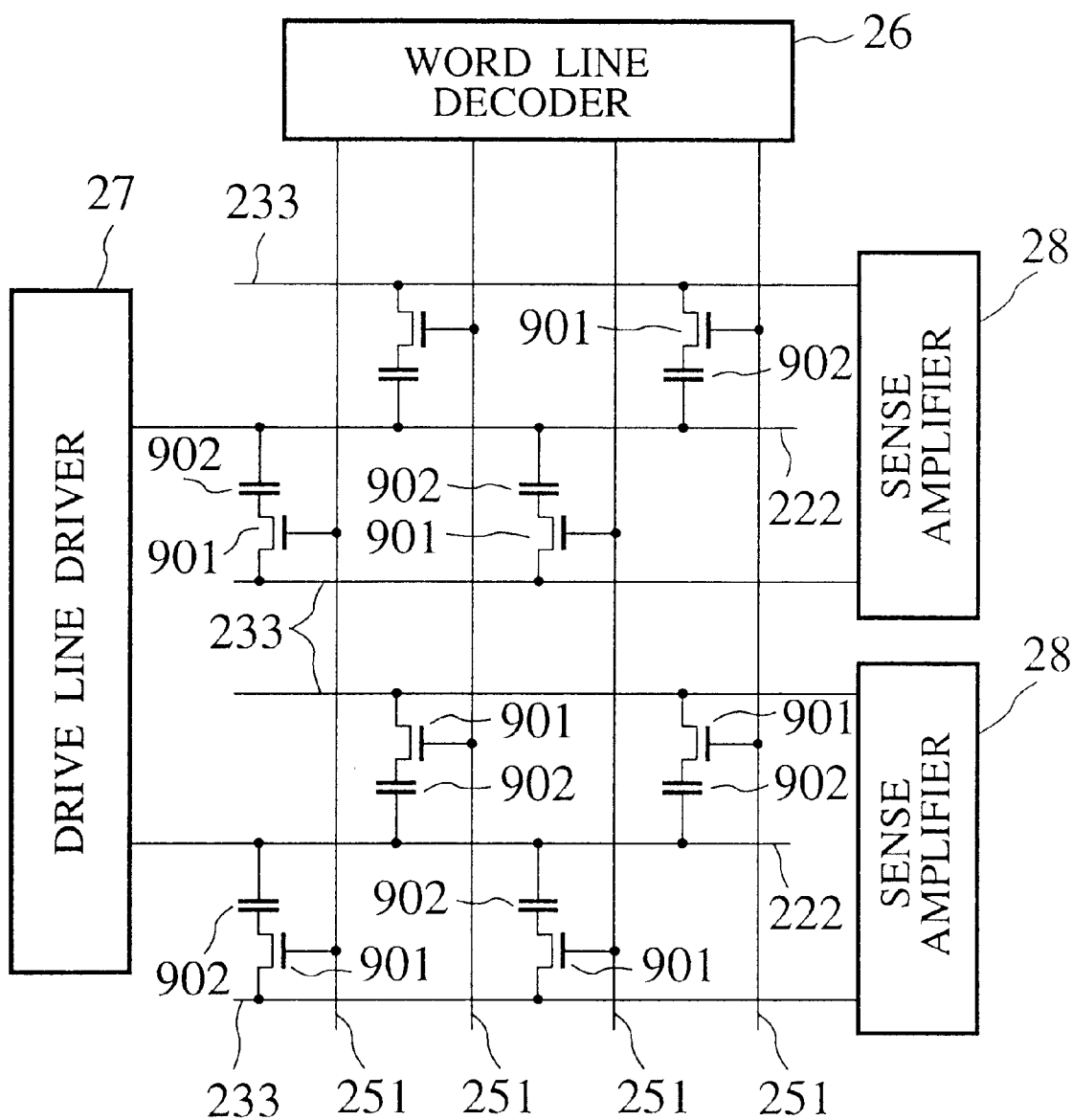
FIG. 10 shows an equivalent circuit of FIG. 9.

FIG. 9 is a sectional view showing a nonvolatile memory according to the third embodiment of the present invention, and FIG. 10 shows an equivalent circuit of the same. A p-well 19 is formed on an n-type substrate 12. On the surface of the p-well 19, a matrix of MOS transistors is formed. The transistors are separated from one another by an element isolation region 103, which is a thermal-oxidized silicon film formed according to, for example, a LOCOS (LOCal Oxidation of Silicon) technique. The sectional view of FIG. 9 is taken along a drive line 222 of FIG. 10. The MOS transistor consists of a gate oxide film 29 formed on the p-well 19, a gate electrode 25 formed on the film 29, an $n^+$-type source region 231, and an $n^+$-type drain region 232. The source and drain regions 231 and 232 are formed in the well 19. The gate electrode 25 forms a part of a word line.

A bit line 233 is formed on the drain region 232. The source region 231 is connected to a lead electrode 235 through a contact electrode 234. The lead electrode (or the buffer electrode) 235 is connected to a thin film capacitor. The memory also includes interlayer insulation films 167 and 168 and a flattening interlayer insulation film 169. The contact electrode 234 may be formed from refractory metal such as W according to the selective CVD technique. The lead electrode 235 may be made from refractory metal such as W and Ti, or refractory metal silicide such as $WSi_2$, $MoSi_2$, and $PtSi_2$.

On the lead electrode 235, there is formed a top electrode 244, a dielectric thin film 243, and a bottom electrode 242. The top electrode 244 is a film of $Ca_{0.5}Y_{0.5}TiO_3$ of 50 nm thick. The dielectric thin film 243 is made of $Ba_{0.44}Sr_{0.56}TiO_3$ (BSTO) of 100 nm thick. The bottom electrode 242 is a film of $Ca_{0.5}Y_{0.5}TiO_3$ of 500 nm thick. These films 244, 243, and 242 form the capacitor. The reason why the top electrode 244 is under the bottom electrode 242 in FIG. 9 is because of manufacturing processes, which will be explained later. The BSTO film 243 is epitaxially grown. The lattice constant of the BSTO film 243 in a vertical direction is 0.0398 nm, which is greater than an original value of 0.03946 nm.

Figure 11:
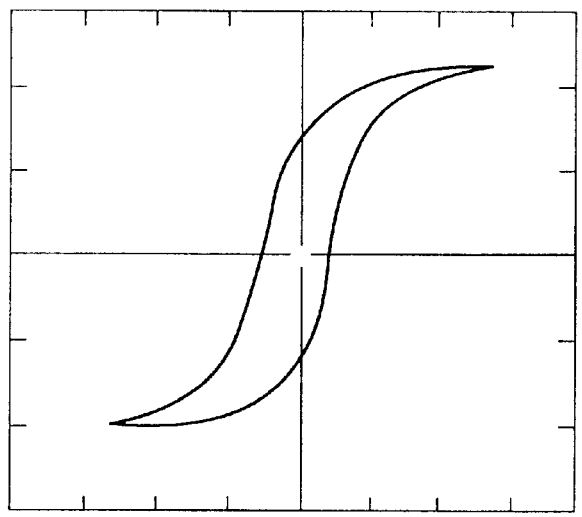
FIG. 11 shows a hysteresis curve indicating the polarization and electric field of a capacitor according to the third embodiment.

FIG. 11 shows the dielectric characteristics of the capacitor mentioned above. The capacitor shows ferroelectric characteristics. This may be because the dielectric thin film is epitaxially grown on the $CaYTiO_3$ bottom electrode 242, to extend the length of a c-axis. To test the fatigue characteristics, i.e., the degradation of polarization of the capacitor, alternating electric fields of ±6 V were applied to the capacitor $10^8$ times, and the capacitor showed no degradation in the polarization thereof.

In the equivalent circuit of the FIG. 10, each 1-bit memory cell consists of a switching transistor 901 and a thin-film capacitor 902. The memory cells form a matrix. The gate electrode 25 of the transistor 901 is connected to a word line 251, and the drain region 232 thereof is connected to a bit line 233. A pair of electrodes of the capacitor 902 are connected to the source region 231 of the transistor 901 and a drive line 222, respectively. The word lines 251 are orthogonal to the drive lines 222. The word lines 251 are connected to a word line selector 26, and the drive lines 222 are connected to a drive line driver 27. A pair of the bit lines 233 are arranged on each side of the drive line 222 and are connected to a sense amplifier 28.

In a write operation, the word line selector (decoder) 26 selects one of the word lines 251 according to a row address, to turn ON the switching transistors 901 connected to the selected word line 251. According to a column address, the bit lines 233 are provided with potential levels corresponding to "1" and "0." The driver 27 activates the drive lines 222, to transfer a write signal. Thereafter, the word line 251 is deactivated to turn OFF the transistors 901. As a result, "1" or "0" is written and held in the capacitor 902 of the memory cell selected by the product of the row and column addresses. The written data will not be lost even if one of the word line 251 and drive line 222 connected to the transistor 901 and capacitor 902 of the memory cell in which the data has been written is activated.

In a read operation, the selector (decoder) 26 selects one of the word lines 251 according to a given row address and activates the selected word line 251, to turn ON the transistors 901 connected to the word line 251 in question. A pair of the bit lines 233 corresponding to a given column address is precharged into a floating state. The driver 27 activates the drive lines 222 to provide a predetermined potential. As a result, data stored in the capacitor 902 of the memory cell selected according to the product of the row and column addresses is supplied to one of the precharged bit lines 233. As a result, a small potential difference corresponding to the data is produced between the bit lines 233. The sense amplifier 28 amplifies the potential difference, to thereby read the data stored in the capacitor 902 of the selected memory cell. Thereafter, the same data is written to the capacitor 902 of the read memory cell through the processes mentioned above.

Figure 12:
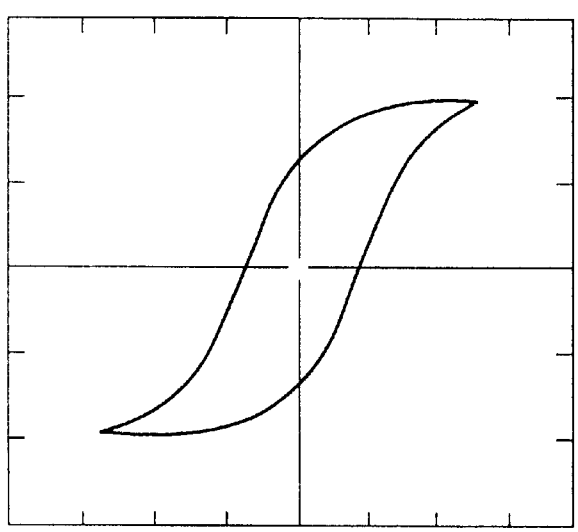
FIG. 12 shows a hysteresis curve indicating the polarization and electric field of another capacitor according to the third embodiment.

The bottom electrode 242 may be a $PrNiO_3$ film of 400 nm thick, and the top electrode 244 may be a $PrNiO_3$ film of 50 nm thick. The electrodes 242 and 244 sandwich the dielectric thin film 243, which may be a film of $Ba_{0.44}Sr_{0.56}TiO_3$ (BSTO) of 100 nm thick. This BSTO film is epitaxially grown, and the lattice constant thereof in a vertical direction is 0.0396 nm, which is an original value of a BSTO film of this composition. Namely, the lattice constant is greater than 0.03946 nm. FIG. 12 shows the dielectric characteristics of this capacitor. The capacitor shows ferroelectric characteristics. This may be because the length of a c-axis extends when the dielectric thin film is epitaxially grown on the bottom electrode 242. To test the fatigue characteristics, i.e., the degradation of polarization of the capacitor, alternating electric fields of ±6 V were applied to the capacitor $10^8$ times, and the capacitor showed no degradation in the polarization thereof. The $PrNiO_3$ films may be deposited according to the MOCVD technique with a β-diketone complex gas.

Figure 13A:
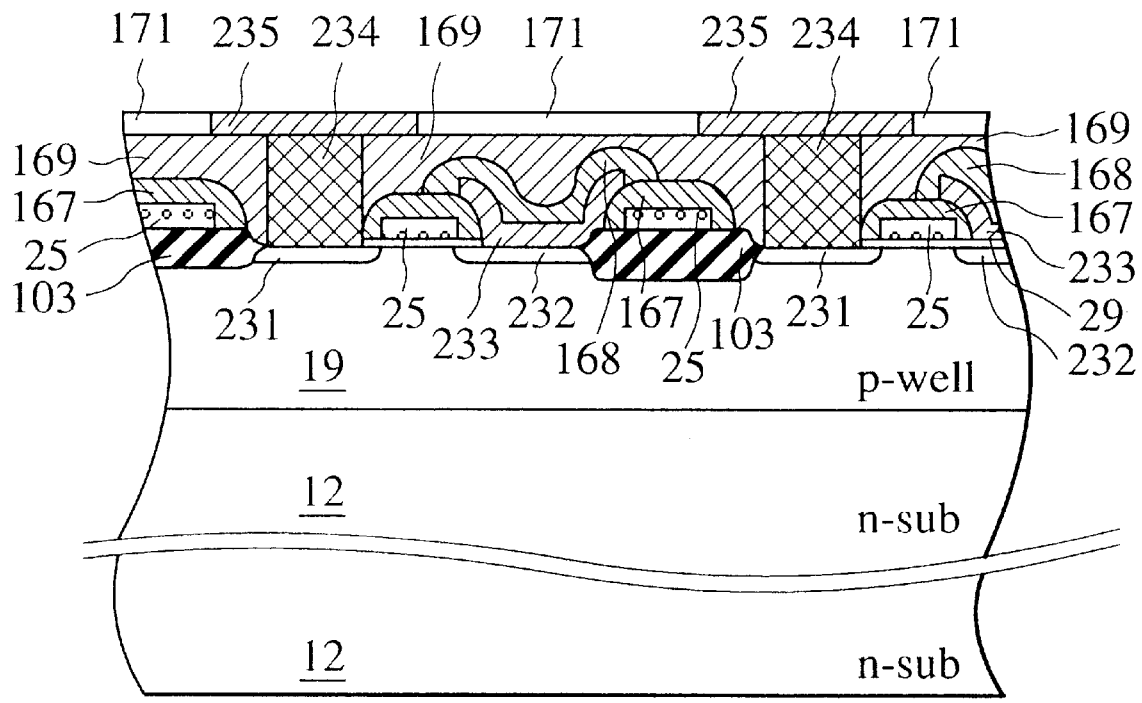
FIGS. 13A and 13B show a method of manufacturing the nonvolatile memory of FIG. 9.
Figure 13B:
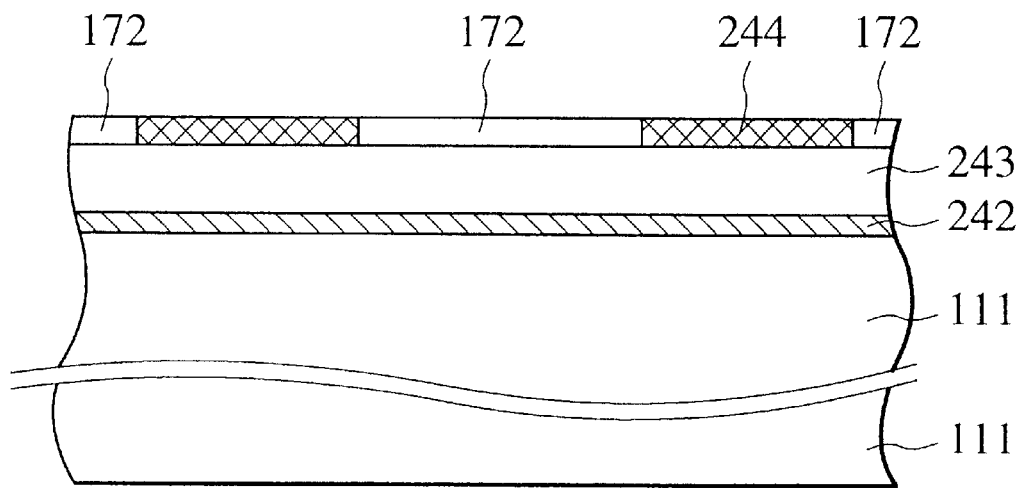

FIGS. 13A and 13B show a method of manufacturing the nonvolatile memory of FIG. 9. This method bonds a substrate of FIG. 13A and a substrate of FIG. 13B together according to a direct wafer bonding technique. In FIG. 13A, a MOSFET having an $n^+$-type drain region 232, a DOPOS gate electrode 25, etc., is formed on a p-well 19 according to standard MOS fabrication processes such as self-alignment processes using the DOPOS gate electrode. The details of these processes are well known, and therefore, are not explained. On the MOSFET, an interlayer insulation film 169 is formed from PSG, $SiO_2$ or BPSG to a thickness of one micrometer.

The insulation film 169 is deposited according to, for example, the CVD technique. A contact hole is opened through the film 169 above an n$^+$-type source region 231. In the contact hole, refractory metal such as W or Ti, or refractory metal silicide such as WSi$_2$ is deposited according to the selective CVD technique, to form a contact electrode 234. Thereafter, a film of refractory metal such as W, or a silicide film 235 is deposited to a thickness of 200 nm. A halogen-based RIE (reactive ion etching) technique is carried out to pattern a lead electrode 235. The lead electrode 235 may be formed with a lift-off technique with a spattering or vacuum vapor deposition technique. An SiO$_2$ film serving as an interlayer insulation film 171 is formed according to the CVD technique. The insulation film 171 may be formed by coating an SOG (spin-on-glass) film. To expose the lead electrode 235, the film 171 is etched by a photolithography technique. The surface of the film 171 is polished and flattened so that the film 171 and lead electrode 235 are flush with each other and the lead electrode 235 has a mirror surface.

In FIG. 13B, an ion beam deposition apparatus is used to deposit a film 242 of $Ca_{0.5}Y_{0.5}TiO_3$ to a thickness of 500 nm on an n$^+$-type silicon substrate 111 that is different from the substrate 12. At this time, Ca and Ti are applied by using a Knudsen cell and Y by using an electron beam heating/vaporizing source and by supplying oxygen and ion beams. As a result, the film 242 is a c-axis oriented single crystalline film. The film 242 is patterned to form drive lines 222 according to the ion-milling and photolithography techniques. The film 242 is used as a bottom electrode on which a film 243 of $Ba_{0.44}Sr_{0.56}TiO_3$ is deposited to a thickness of 100 nm according to an RF magnetron spattering technique. A film 244 of $Ca_{0.5}Y_{0.5}TiO_3$ serving as a top electrode is deposited to a thickness of 50 nm according to the RF magnetron spattering technique. The film 244 is also a c-axis oriented single crystalline film.

The top and bottom electrodes 244 and 242 may be made from other conductive oxide having a perovskite structure instead of $Ca_{0.5}Y_{0.5}TiO_3$. For example, the film 242 may be made by depositing PrNiO$_3$ on the substrate 111 to a thickness of 400 nm according to the ion beam deposition technique. At this time, Ni is applied by the Knudsen cell and Pr by the electron beam heating/vaporizing source and by supplying oxygen and ion beams. This results in providing a c-axis oriented single crystalline film of PrNiO$_3$. Stripes of the drive lines 222 are formed according to the ion-milling technique. This film is used as the bottom electrode 242 on which a film 243 of $Ba_{0.44}Sr_{0.56}TiO_3$ of 100 nm thick is deposited according to the RF magnetron spattering technique. Similar to the bottom electrode 242, a film 244 of PrNiO$_3$ serving as a top electrode is deposited to a thickness of 50 nm. The film 244 is also a c-axis oriented single crystalline film.

The film 244 of $Ca_{0.5}Y_{0.5}TiO_3$ or PrNiO$_3$ is patterned according to the photolithography technique and the ion-milling or RIE technique. On the patterned top electrode 244 and the BSTO film 243, there is deposited an interlayer insulation film 172 of SiO$_2$ or PSG to a thickness of 100 nm. The surface of the film 172 is polished so that the film 172 and electrode 244 are flush with each other and the top electrode 244 has a mirror surface. The lead electrode 235 of FIG. 13A and the top electrode 244 of FIG. 13B are mated with facing mirror surface to mirror surface and bonded together, and a heat treatment is carried out at 900° C. for 1 hr, for example. After the above metal bonding process is carried out, the device of FIG. 9 is completed.

[Fourth Embodiment]

Figure 14:
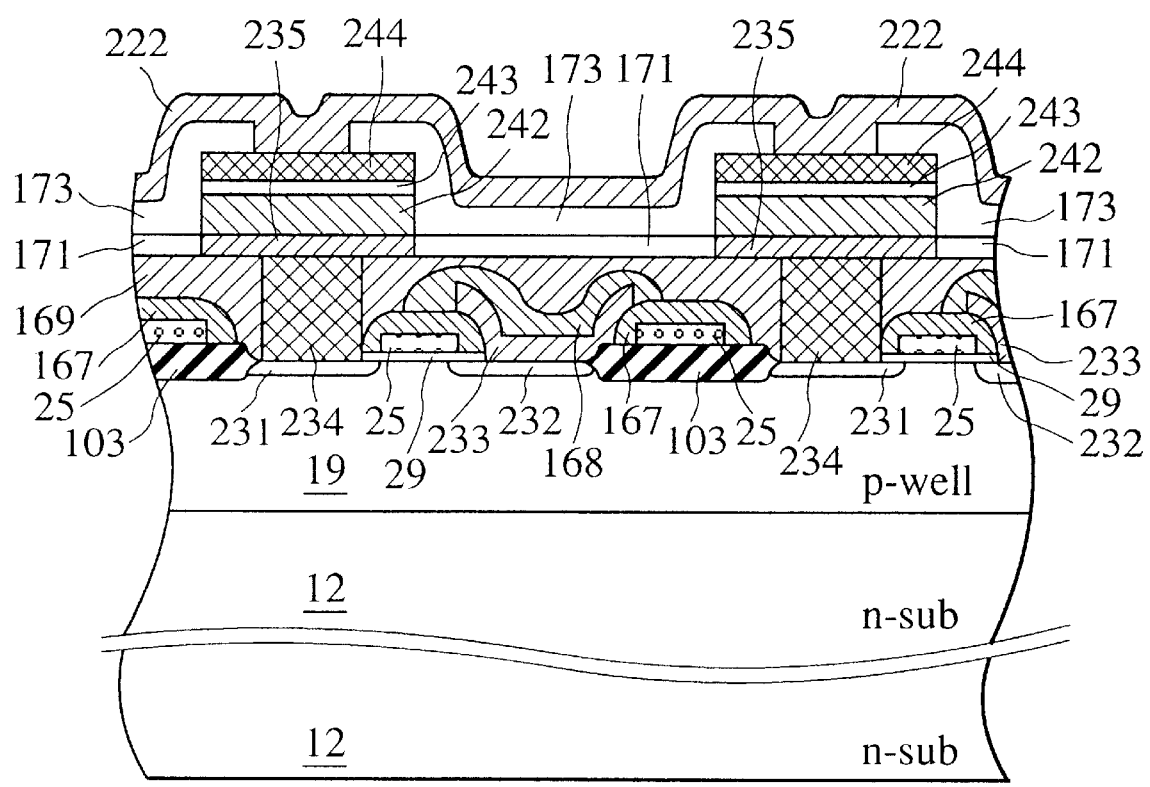
FIG. 14 is a sectional view showing a nonvolatile memory according to a fourth embodiment of the present invention.

FIG. 14 is a sectional view taken along a drive line 222, showing a nonvolatile memory employing an epitaxially grown BSTO film to form a capacitor according to the fourth embodiment of the present invention. The fourth embodiment is basically the same as the third embodiment but differs therefrom in that the fourth embodiment does not employ the direct wafer bonding technique. The fourth embodiment fabricates a MOSFET according to standard MOS fabrication processes as explained in the third embodiment. After the MOSFET as shown in FIG. 13A is manufactrued on n (100) substrate 12, an interlayer insulation film 169 is deposited thereon as shown in FIG. 14. A contact hole is opened through the film 169 on an n$^+$-type source region 231, and a DOPOS film is deposited in the contact hole, to form a contact electrode 234. An electron beam annealing technique is employed to form a single crystalline silicon contact electrode 234 oriented along a (100) plane in the DOPOS contact electrode 234. On the silicon contact electrode 234, refractory metal such as W is deposited to about 200 nm, to form a film 235. The electron beam annealing technique is employed to change the film 235 into a single crystalline film. The film 235 is patterned into a lead electrode 235 with aid of the RIE technique.

Similar to the third embodiment, the ion beam deposition apparatus is used to deposit $Ca_{0.5}Y_{0.5}TiO_3$ or PrNiO$_3$ to form a lower electrode 242 of 500 nm thick, epitaxially grow a BSTO film 243 of 100 nm thick, and deposit $Ca_{0.5}Y_{0.5}TiO_3$ or PrNiO$_3$ to form a top electrode 243 of 50 nm thick. These films are patterned according to the ECR ion etching or ion-milling technique into the capacitor of FIG. 14. A film 173 of SiO$_2$/PSG is deposited to a thickness of 500 nm, and a contact hole is opened therethrough above the top electrode 244. A drive line 222 is formed from Al, to complete the memory of FIG. 14. The operation of the memory is the same as that of the third embodiment, and therefore, is not explained.

In this way, the fourth embodiment epitaxially grows a BSTO film having ferroelectric characteristics on an electrode to form a capacitor of a nonvolatile semiconductor memory. The capacitor produces no interface charges to fatigue the BSTO film, thereby realizing good memory performance. The capacitors of the forth embodiment are effective to fabricate a high-integration large-capacity semiconductor memory that is reliable in securing data. The capacitors of the fourth embodiment endure as many as 10$^4$ rewrite operations. Each electrode of the capacitors has good lattice matching with the BSTO film epitaxially grown on the electrode, to produce no interface charges due to an interface lattice mismatching nor degradation of the dielectric constant of the capacitor due to crystalline distortion, although a c-axis length of the BSTO film is slightly elongated. Consequently, the capacitors of the fourth embodiment have a large dielectric constant and a stable memory function.

[Fifth Embodiment]

Figure 15A:
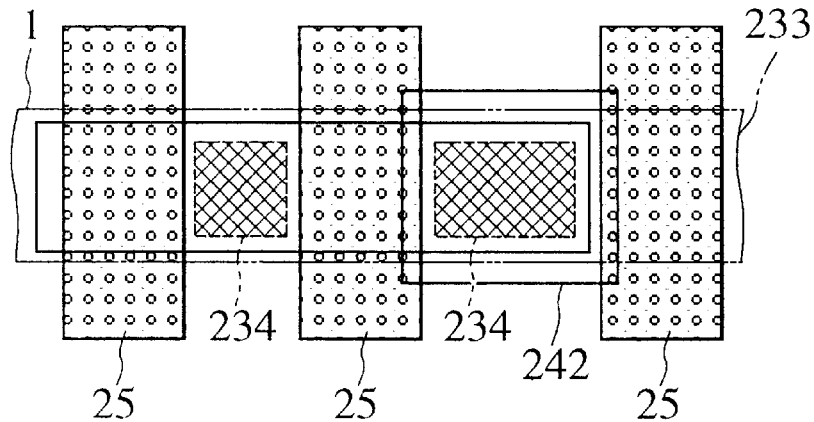
FIGS. 15A and 15B are plan and sectional views showing an SOI DRAM according to a fifth embodiment of the present invention.
Figure 15B:
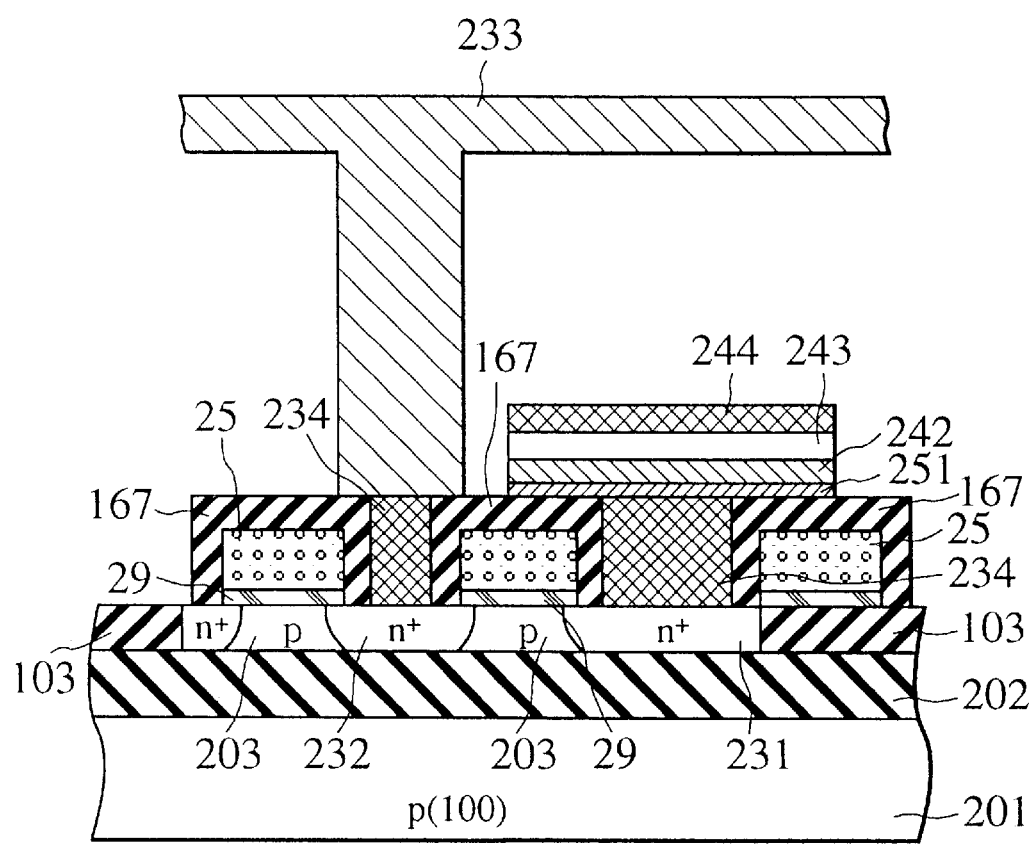

FIG. 15A is a plan view showing an SOI MOS DRAM according to the fifth embodiment of the present invention, and FIG. 15B is a sectional view showing the same. On a p-type (100) silicon substrate 201, a buried oxide film 202 is formed. On the oxide film 202, a p-type SOI film 203 is formed according to the LOCOS technique. The SOI film 203 is surrounded by an element isolation oxide film 103, to define an active region (device region) 1. The active region 1 contains a switching transistor of a unit cell of the DRAM. The transistor has an n$^+$-type source region 231 and an n$^+$-type drain region 232. The bottoms of the source and drain regions 231 and 232 are deep to get in contact with the oxide film 202. A channel region 203 is defined between the source and drain regions 231 and 232. On the channel region 203, a gate oxide film 29 is formed and on which a gate electrode 25 is formed from, for example, polysilicon. In FIG. 15A, the gate electrode 25 serves as a word line. Instead, a separate word line may be formed from W, Mo, or $WSi_2$ and connected to the gate electrode 25. The word line is covered with an interlayer insulation film 167. Contact holes are opened through the film 167, and in the contact holes, contact electrodes 234 are formed from W, $WSi_2$, $TiSi_2$, or $MoSi_2$ to reach the drain region 232 and the source region 231. The contact electrode 234 on the drain region 232 is connected to a data line (bit line) 233 formed from metal such as W, Al, Al—Si, and Al—Cu—Si.

The DRAM of the fifth embodiment is of a stack type that forms a storage capacitor on the source region 231 and on a part of the gate electrode 25. A contact electrode 234 is formed on the source region 231, and on the contact electrode 234, there is formed a TiN film 251 to a thickness of 20 nm to serve as a barrier metal. On the TiN film 251, a storage electrode (bottom electrode) 242 is formed from $Sr_{0.9}Ba_{0.1}RuO_3$ to a thickness of 30 nm. On the bottom electrode 242, a dielectric thin film 243 is formed from $Ba_{0.5}Sr_{0.5}TiO_3$ to a thickness of 40 nm, and on which, an opposite electrode (plate electrode, or top electrode) 244 is formed from $Sr_{0.9}Ba_{0.1}RuO_3$ to a thickness of 40 nm. On the plate electrode 244, a film is made from W to a thickness of 20 nm, to complete the storage capacitor. The top and bottom electrodes 244 and 242 are made from $Sr_{0.9}Ba_{0.1}RuO_3$ to change the barrier characteristics of each interface between the dielectric thin film 243 and the electrodes 244 and 242 as well as the electron state of the electrodes, to thereby improve the characteristics of the capacitor. To change the electron state of the electrodes and optimize the characteristics of the dielectric thin film, part of Sr or Ba of $Sr_{0.9}Ba_{0.1}RuO_3$ may be replaced with other rare earth elements such as La and Nd having proper ion radii. Adding these rare earth elements may prevent insulation reactive products having a low dielectric constant when the dielectric thin film and electrodes diffuse to each other through the interfaces. This results in securing the high dielectric constant of the DRAM storage capacitor. If the dielectric thin film and electrodes diffuse to each other through the interfaces to produce reactive products mainly composed of Ti, the reactive products are doped with the rare earth elements to secure a metal-like conductivity, inherent electrode function, and high dielectric constant. These rare earth elements may be used as the A-site elements of the $ABO_3$ perovskite electrodes having Ru radicals, to improve the crystalline characteristics and surface morphology of the electrodes, to thereby improve the performance of the storage capacitor. In this way, the DRAM according to the fifth embodiment includes storage capacitors each made of a BSTO thin film to realize a high dielectric constant and a low leakage current.

TABLE 2

| Sample No. | Electrode composition | Dielectric constant | Leakage current voltage |
|---|---|---|---|
| 38 | $Sr_{0.9}Ba_{0.1}RuO_3$ | 400 | −1.2 to +1.3 |
| 61 | $SrRuO_3$ | 300 | −0.8 to +1.0 |
| 62 | $BaRuO_3$ | 200 | unmeasurable |
| 39 | $Sr_{0.7}Ba_{0.3}RuO_3$ | 420 | −1.2 to +1.2 |
| 40 | $Sr_{0.5}Ba_{0.5}RuO_3$ | 450 | −1.1 to +1.3 |
| 41 | $Sr_{0.4}Ba_{0.6}RuO_3$ | 440 | −1.5 to +1.4 |
| 42 | $Sr_{0.5}Ba_{0.3}La_{0.2}RuO_3$ | 450 | −1.4 to +1.2 |

In this table, the "dielectric constant" is with respect to a bias electric field at 0 V, and the "leakage current voltage" is a voltage (V) that causes a leakage current $J<10^{-6}$ $A/cm^2$.

Figure 16:
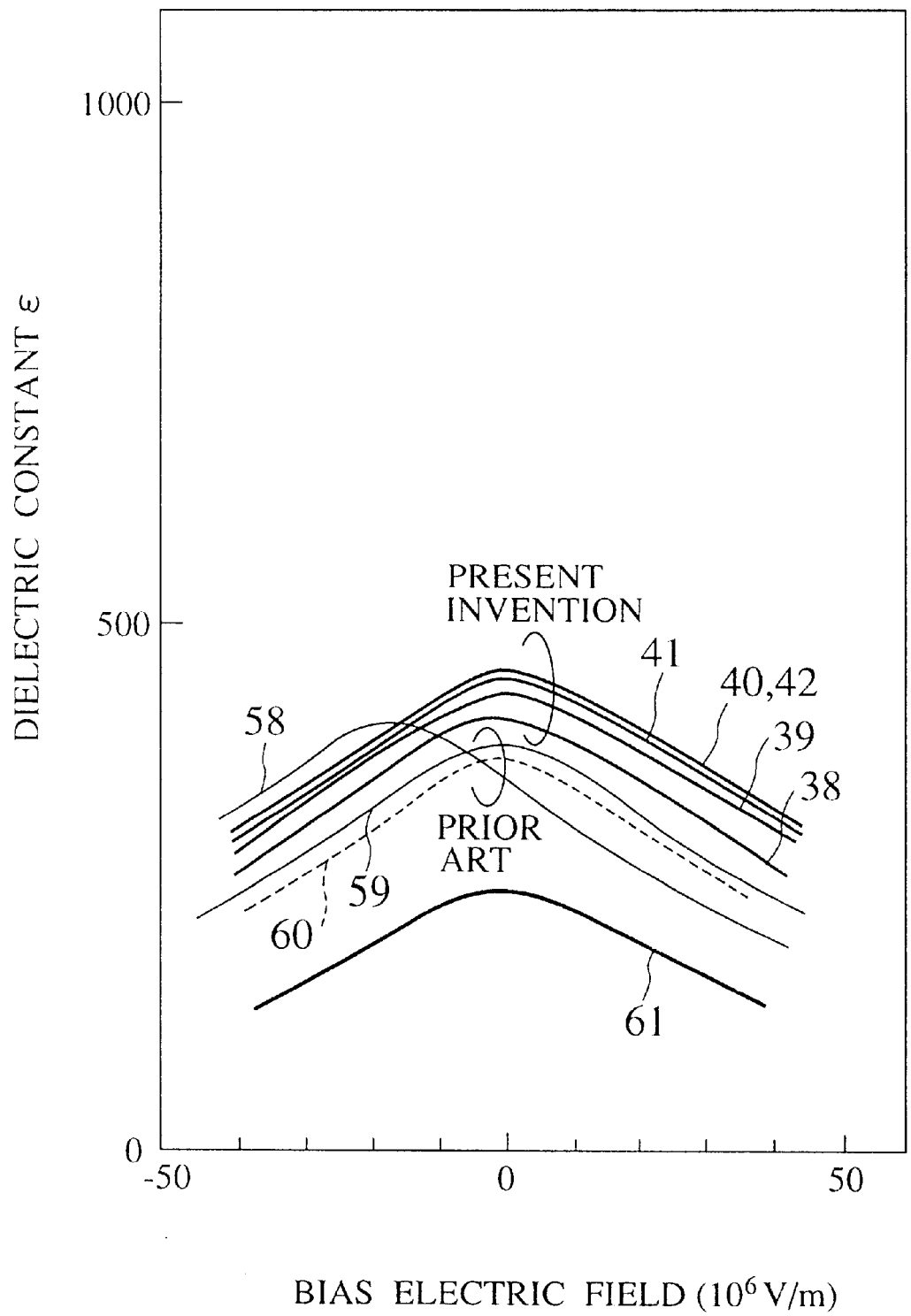
FIG. 16 is a graph showing the bias dependency of the dielectric constants of capacitors of the fifth embodiment and prior arts.
Figure 17:
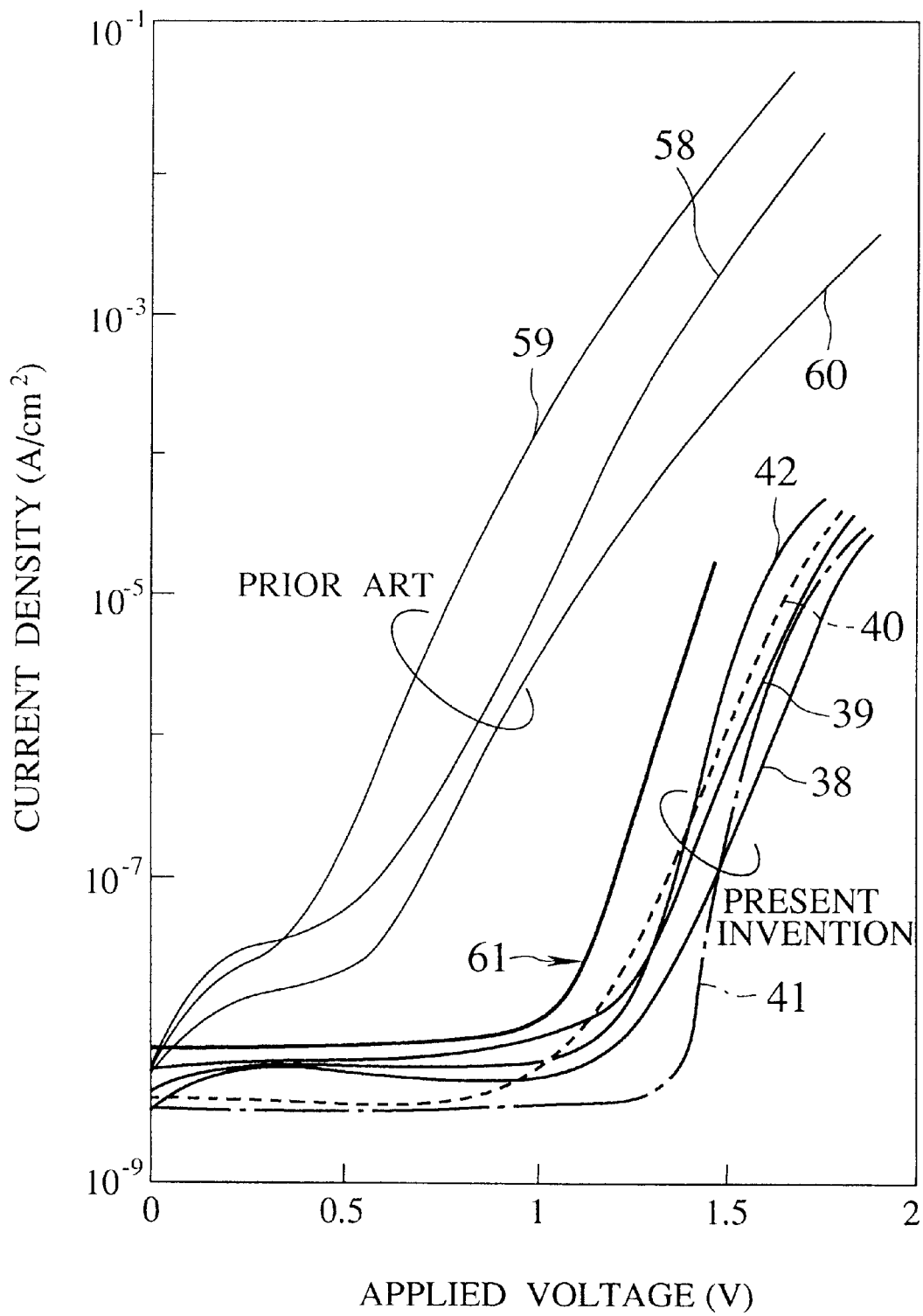
FIG. 17 is a graph showing the DC bias dependency of the leakage currents of the capacitors of FIG. 16.

Table 2 shows the characteristics of capacitors measured with TEG patterns that electrically separate the capacitors from other elements. On an Si substrate, a TiN barrier metal of 20 nm thick was formed, and a capacitor of $Sr_{0.9}Ba_{0.1}RuO_3/Ba_{0.5}Sr_{0.5}TiO_3/Sr_{0.9}Ba_{0.1}RuO_3$ was fabricated as shown in FIGS. 15A and 15B. The dielectric constant and leakage current of the capacitor were measured. In Table 2, the sample No. 38 corresponds to the capacitor of the fifth embodiment. A first comparison corresponding to the sample No. 61 is a thin film capacitor having the same structure as the sample No. 38 but employing $SrRuO_3$ for the top and bottom electrodes. A second comparison corresponding to the sample No. 62 is a thin film capacitor having the same structure as the sample No. 38 but employing $BaRuO_3$ for the top and bottom electrodes. The capacitors with $BaRuO_3$ electrodes of the second comparison had bad surface morphology and caused a so-called "A mode" defect (short circuit). Only a few of them endured the test and provided the values shown in Table 2. Those endured the test, however, showed a large leakage current of $1 \times 10^{-6}$ $A/cm^2$ in a 0 bias region and a dielectric loss of tans of about 0.5. These are unacceptable values. On the other hand, the capacitors of the sample No. 38 of the fifth embodiment showed a dielectric constant of 400 and a voltage of −1.2 V to +1.3 V to cause a leakage current of $10^{-6}$ $A/cm^2$. These are good values. The sample numbers 39, 40, 41, and 42 represent modifications 1, 2, 3, and 4, respectively, of the fifth embodiment. FIGS. 16 and 17 show the characteristics of various capacitors tested with TEG patterns that electrically separate the capacitors from other elements, in which FIG. 16 shows the bias electric field dependency of the dielectric constants of the capacitors, and FIG. 17 shows the voltage dependency of the leakage currents of the capacitors. In the figures, a curve 38 represents the capacitor made of $Sr_{0.9}Ba_{0.1}RuO_3/Ba_{0.5}Sr_{0.5}TiO_3/Sr_{0.9}Ba_{0.1}RuO3$ of the fifth embodiment. A curve 58 represents a conventional capacitor having a top electrode made of Pt and a bottom electrode made of ITO. A curve 59 represents a conventional capacitor having top and bottom electrodes made of ITO. A curve 60 represents a conventional capacitor having a top electrode made of ITO and a bottom electrode made of STO:Nb. A curve 61 represents a conventional capacitor having top and bottom electrodes made of $SrRuO_3$. As is apparent in FIGS. 16 and 17, the storage capacitor having the electrodes of $Sr_{0.9}Ba_{0.1}RuO_3$ according to the fifth embodiment shows a high dielectric constant and a low leakage current.

The modifications of the fifth embodiment of the present invention will be explained. The structures of the modifications are different from the structure of $Sr_{0.9}Ba_{0.1}RuO_3/Ba_{0.5}Sr_{0.5}TiO_3/Sr_{0.9}Ba_{0.1}RuO_3$ of the fifth embodiment.

(a) Modification 1

A capacitor has top and bottom electrodes made of $Sr_{0.7}Ba_{0.3}RuO_3$. Curves 39 of FIGS. 16 and 17 indicate the dielectric constant and leakage current of this capacitor.

(b) Modification 2

A capacitor has top and bottom electrodes made of $Sr_{0.5}Ba_{0.5}RuO_3$. Curves 40 of FIGS. 16 and 17 indicate the dielectric constant and leakage current of this capacitor.

(c) Modification 3

A capacitor has top and bottom electrodes made of $Sr_{0.4}Ba_{0.6}RuO_3$. Curves 41 of FIGS. 16 and 17 indicate the dielectric constant and leakage current of this capacitor.

(d) Modification 4

A capacitor has top and bottom electrodes made of $Sr_{0.5}Ba_{0.3}La_{0.2}RuO_3$. Curves 42 of FIGS. 16 and 17 indicate the dielectric constant and leakage current of this capacitor.

A method of manufacturing the SOI MOS DRAM according to the fifth embodiment will be explained. A capacitor of this example has a dielectric thin film made of BSTO and top and bottom electrodes made of $Sr_{0.9}Ba_{0.1}RuO_3$. However, the present invention is not limited to this example, and many modifications are possible as mentioned above.

(a) An SIMOX (separation by implanted oxygen) or SDB (silicon direct bonding) technique is employed to form an SOI film 203 on a buried oxide film 202 formed on a p-type (100) substrate 201, to thereby prepare a SOI substrate.

(b) The LOCOS or BOX (buried oxide) technique is employed to form an oxide film 103 to electrically isolate adjacent elements from one another. A gate oxide film 29 is formed to a thickness of 10 nm. On the film 29, a phosphorus doped polysilicon film 25 is formed to a thickness of 0.3 $\mu$m according to the LPCVD technique. The lithography and RIE patterning techniques are used to pattern the film 25 into a polysilicon gate electrode 25 having a gate length of 0.5 $\mu$m on the gate oxide film 29.

(c) Ions $^{31}p^+$ are implanted at $V_{ac}$=30 kV and a dose of $\Phi$=3×10$^{15}$ cm$^{-2}$, and a heat treatment is carried out at 850° C. for 30 minutes, to form n$^+$-type source and drain regions 231 and 232. An SiO$_2$/PSG film is deposited to a thickness of 200 to 300 nm according to the CVD technique, to form an interlayer insulation film 167. As and when required, a p$^+$-type channel stop region is formed, and a channel dope ion implantation is carried out. These are standard MOS DRAM fabrication processes, and therefore, are not explained.

(d) First contact holes are opened in the film 167. In the first contact holes, As-doped n$^+$-type polysilicon or W films are deposited to a thickness of 200 nm to 400 nm according to the CVD technique, to form contact electrodes 234. Over the contact electrode 234 on the no source region, a TiN barrier metal layer 251 is deposited to a thickness of 20 nm according to the RF spattering technique. On the layer 251, an electrode 242 is formed from Sr$_{0.9}$Ba$_{0.1}$RuO$_3$ according to a multiple RF magnetron spattering technique. The electrode 242 is a polycrystalline film and has a thickness of 30 nm. On the electrode 242, a dielectric thin film 243 of Ba$_{0.5}$Sr$_{0.5}$TiO$_3$ is deposited to a thickness of 40 nm according to the multiple RF magnetron spattering technique. A top electrode 244 of Sr$_{0.9}$Ba$_{0.1}$RuO$_3$ is deposited to a thickness of 40 nm in a similar manner. In each case, a film forming temperature is 600° C. Thereafter, a film of W is formed to a thickness of 20 nm by spattering.

(e) Photoresist is coated entirely. The photolithography technique is used with the photoresist serving as a mask, to etch the W film into the pattern of FIG. 15B according to the RIE technique with CF. The Sr$_{0.9}$Ba$_{0.1}$RuO$_3$ film is also etched according to the RIE technique, to form the top electrode (opposite electrode) 244.

(f) The film of W/Sr$_{0.9}$Ba$_{0.1}$RuO$_3$ serving as the electrode 244 is used as a mask, to etch the BSTO thin film 243 with an etching solution such as a mixture of hydrogen peroxide, ammonia water, and EDTA.

The RIE technique is used to pattern the bottom electrode 242 and barrier metal 251. The RIE technique on the Sr$_{1-x}$Ba$_x$RuO$_3$ film is carried out with the following ions:

O$_2$(98%)+CF$_3$CFH$_2$,
O$_2$(90%)+CF$_4$(10%),
O$_2$(95%)+Cl$_2$(5%), or
O$_2$+C$_3$F$_6$ (g) An interlayer insulation film is formed from SiO$_2$, PSG, or BPSG according to the CVD technique. A second contact hole is opened through the film above the contact electrode 234 on the drain region 232. A high conductivity film of DOPOS or WSi$_2$ is formed according to the selective CVD technique, to bury the second contact hole in the interlayer insulation film. Instead of the selective CVD method, the high conductivity film may be entirely formed according to the CVD technique, and thereafter, the high conductivity film may be etched back so that the second contact hole is filled with the high conductivity film. On top of the buried second contact hole, Al, Al—Si, or Al—Cu—Si is used to form a bit line 233, to complete the SOI DRAM of FIGS. 15A and 15B.

In this way, the fifth embodiment forms a storage capacitor with conductive oxide electrodes and a BSTO thin film, to maintain the ratio of Ba to Sr in the BSTO thin film, which is around each interface between the electrodes and the BSTO thin film, at a predetermined value. This capacitor is capable of maintaining its high dielectric constant even if Ba and Sr diffuse between the BSTO thin film and the electrodes during film formation and heat-treatment processes. The capacitor, therefore, has a large dielectric constant and a low leakage current as shown in FIGS. 16 and 17. The capacitors of the fifth embodiment help provide high-integration large-capacity semiconductor memories such as DRAMs.

[Sixth Embodiment]

Figure 18A:
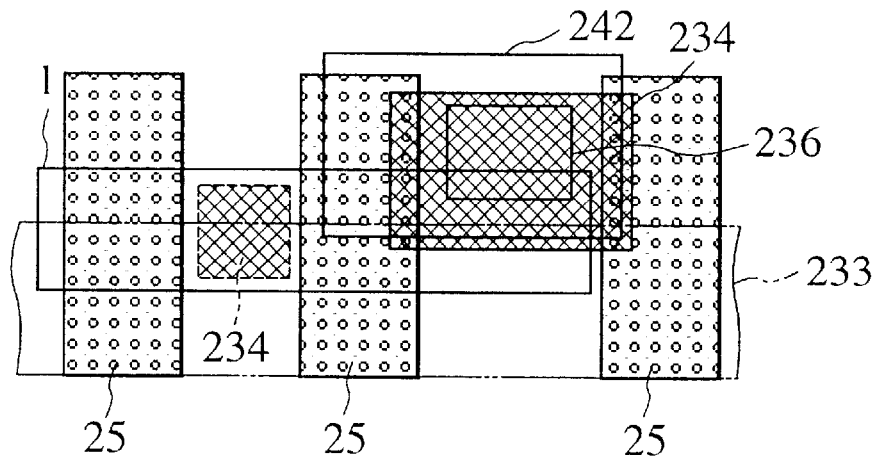
FIGS. 18A and 18B are plan and sectional views showing an SOI DRAM according to a sixth embodiment of the present invention.
Figure 18B:
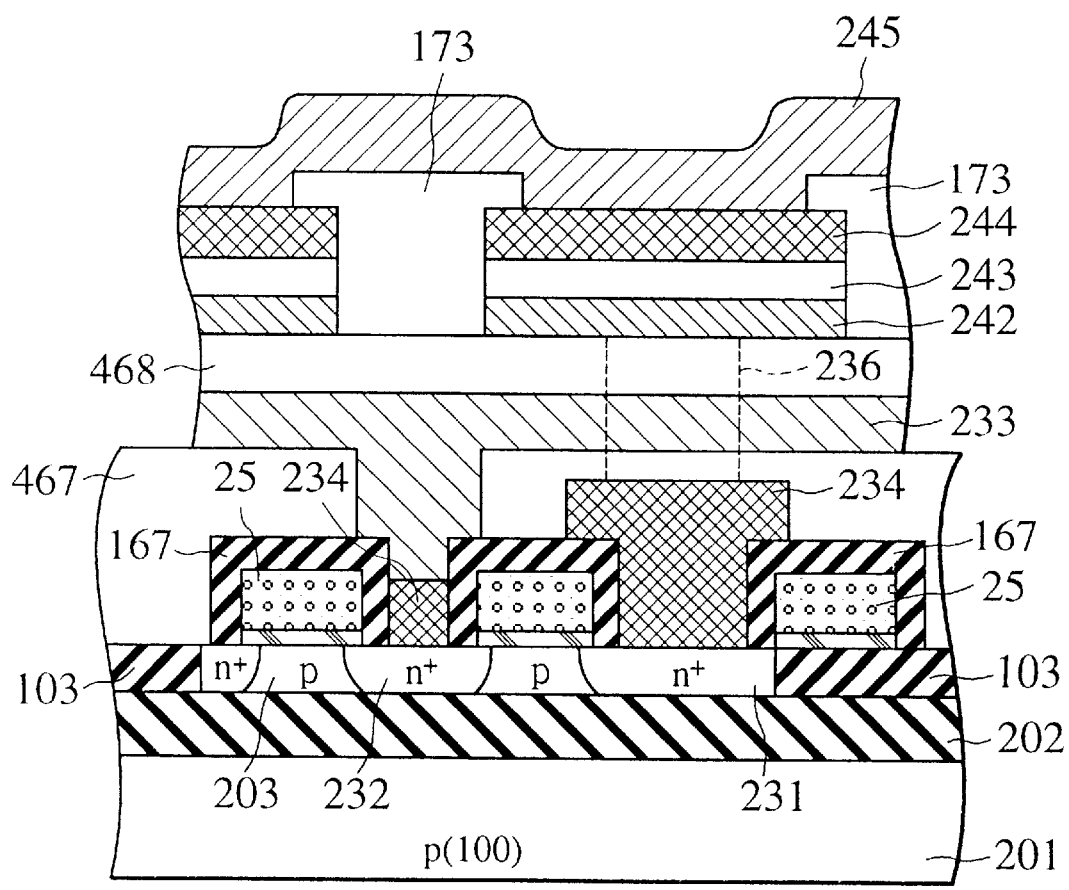

FIG. 18A is a plan view showing an SOI MOS DRAM according to the sixth embodiment of the present invention, and FIG. 18B is a sectional view showing the same. The DRAM has a p-type (100) silicon substrate 201 on which a buried oxide film 202 is formed. On the film 202, a p-type SOI film 203 is formed. The film 203 is surrounded by an oxide film 103 formed according to, for example, the LOCOS technique. The oxide film 103 isolates adjacent elements from one another. The surrounded region is an active region (device region) 1. The active region 1 contains a switching transistor of a unit cell of the DRAM. The transistor consists of an n$^+$-type source region 231 and an n$^+$-type drain region 232. The bottoms of the source and drain regions 232 are deep to get in contact with the film 202. A channel region 203 is defined between the source and drain regions 231 and 232. On the channel region 203, a gate oxide film is formed and on which a gate electrode 25 is formed from, for example, polysilicon. The gate electrode 25 serves as a word line as shown in FIG. 18A. On the word line, there is formed a first interlayer insulation film 167, which may be an oxide film. Contact holes are opened through the film 167. In the contact holes, contact electrodes 234 are formed from W, WSi2, TiSi2, or MoSi2. The contact electrodes 234 are in contact with the top of the drain region 232 and the source region 231. Over the contact electrodes 234, a second interlayer insulation film 467 is formed. A second contact hole on the drain region 232 is opened through the film 467. In the second contact hole, a data line (bit line) 233 made of metal such as W, Al, Al—Si, and Al—Cu—Si is in contact with the contact electrode 234 on the drain region 232. The data line 233 is covered with a third interlayer insulation film 468, which is an oxide film or a nitride film. The film 468 is covered with a storage electrode (bottom electrode) 242 made of W$_{1-x}$Re$_x$O$_{3-\delta}$ (mixed crystal of WO$_3$ and ReO$_3$) of 50 nm thick. The bottom electrode 242 is covered with a dielectric thin film 243 of SrTiO$_3$ (STO) of 50 nm thick. The dielectric thin film 243 is covered with an opposite electrode (top electrode) 244 of Al of 100 nm thick. These films 242, 243, 244 form a storage capacitor of each cell of the DRAM. A fourth interlayer insulation film 173 is formed on the top electrode 244. The film 173 has a contact hole through which the top electrode 244 is connected to a plate electrode 245. A via hole is opened through the films 467 and 468, to form a metal contact 236, which connects the bottom electrode 242 to a contact electrode 234 formed on the source region 231. Since the bottom electrode 242 is made of W$_{1-x}$Re$_x$O$_{3-\delta}$ (mixed crystal of $WO_3$ and $ReO_3$), the surface thereof has no irregularities during high-temperature processes, and therefore, the dielectric thin film (STO film) 243 formed on the bottom electrode 242 has excellent insulation characteristics.

Figure 19:
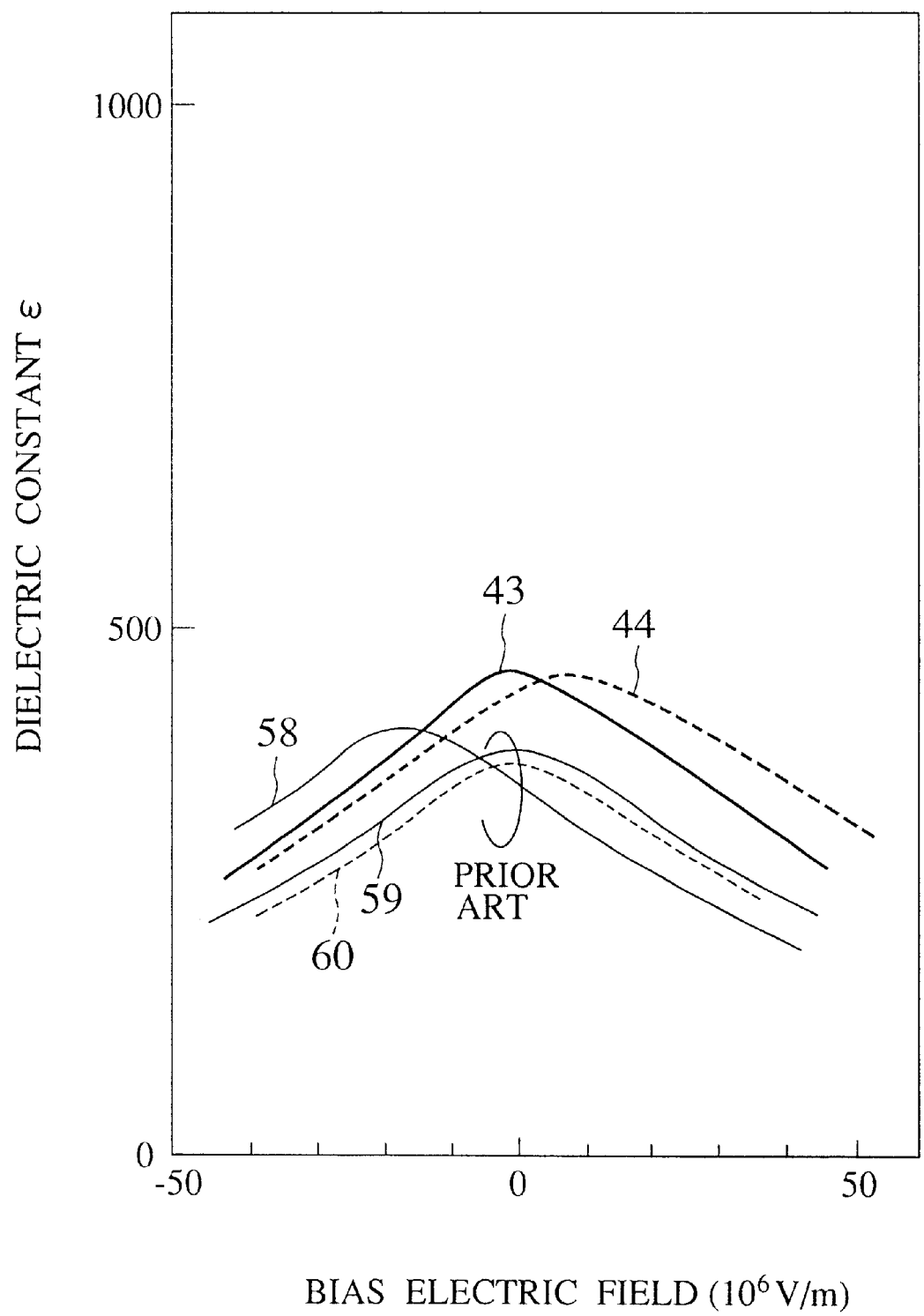
FIG. 19 is a graph showing the bias dependency of the dielectric constants of capacitors of the sixth and seventh embodiments and prior arts.
Figure 20:
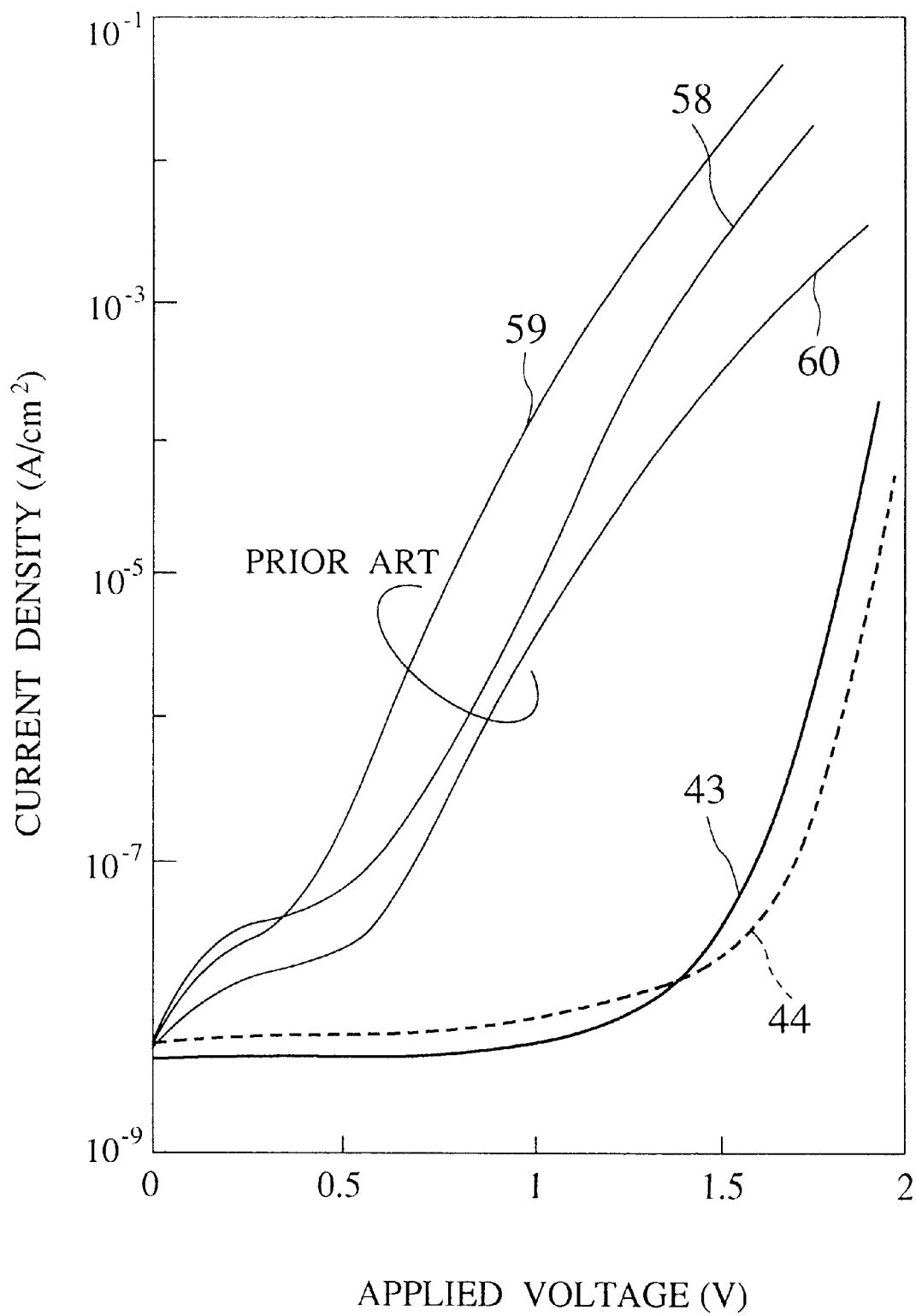
FIG. 20 is a graph showing the DC bias dependency of the leakage currents of the capacitors of FIG. 19.

The $SrTiO_3$ storage capacitor having the $W_{1-x}Re_xO_{3-\delta}$ bottom electrode of the sixth embodiment was compared with an $SrTiO_3$ capacitor having a platinum bottom electrode of a prior art. The $SrTiO_3$ layer of each of the complete capacitors was removed by etching, and the surface roughness of each bottom electrode was measured with a contact-type step meter, or a stylus profiler. The platinum bottom electrode showed irregularities of 40 to 50 nm. On the other hand, the $W_{1-x}Re_xO_{3-\delta}$ bottom electrode of the sixth embodiment showed irregularities of only several nanometers. In this way, the flatness of the sixth embodiment is better than that of the prior art. As a result, the maximum dielectric strength, or the dielectric breakdown voltage of the sixth embodiment is about four times as large as that of the prior art. FIG. 19 is a graph showing the bias electric field dependency of the dielectric constants of capacitors according to the present invention and prior arts, and FIG. 20 is a graph showing the voltage dependency of the leakage currents of the capacitors. These graphs are based on tests made with TEG patterns that electrically separate the capacitors from other elements. A curve 58 represents a conventional capacitor having a top electrode made of Pt and a bottom electrode made of ITO. A curve 59 represents a conventional capacitor having top and bottom electrodes made of ITO. A curve 60 represents a conventional capacitor having a top electrode made of ITO and a bottom electrode made of STO:Nb. The thin film capacitor of the sixth embodiment represented with a curve 43 has a high dielectric constant and a low leakage current. In FIGS. 19 and 20, a curve 44 represents a thin film capacitor according to the seventh embodiment to be explained later.

Since the vapor pressure of $ReO_3$ is very high, an electrode made of mixed crystals of $ReO_3$ and $WO_3$ is easy to process according to, for example, the RIE technique. On the other hand, the platinum electrode of the prior art is hard to process. A method of manufacturing the SOI DRAM according to the sixth embodiment will be explained.

(a) Similar to the fifth embodiment, the SIMOX or SDB technique is employed to form an SOI film 203 on a buried oxide film 202 formed on a p-type (100) substrate 201.

(b) The LOCOS or BOX technique is employed to form an oxide film 103 to electrically isolate adjacent elements from one another. A gate oxide film is formed to a thickness of 10 nm on which phosphorus-doped polysilicon layer 25 is formed to a thickness of 0.3 μm according to, for example, the LPCVD technique. The layer 25 is patterned according to the lithography and RIE techniques, to form a polysilicon gate electrode 25 having a gate length of 0.5 μm.

(c) Ions $^{31}p^-$ are implanted at $V_{ac}$=30 kV and a dose of (=$3\times10^{15}$ cm$^{-2}$, and a heat treatment is carried out at 850° C. for 30 minutes, to form $n^+$-type source and drain regions 231 and 232. An $SiO_2$/PSG film is deposited to a thickness of 200 to 300 nm according to the CVD technique, to form a first interlayer insulation film 167. If required, a $p^+$-type channel stop region is formed, and a channel dope ion implantation is carried out. These are standard MOS DRAM fabrication processes, and therefore, are not explained.

(d) First contact holes are opened in the film 167. In the first contact holes, As-doped $n^+$-type polysilicon layers or W films are deposited to a thickness of 200 nm to 400 nm according to the CVD technique, to form a first contact electrodes 234.

(e) Over the first contact electrodes 234, a second interlayer insulation film 467 such as $SiO_2$, PSG, or BPSG is deposited by the CVD technique. A second contact hole is opened through the film 467 above the first contact electrode 234 on the drain region 232. The second contact hole is filled with a DOPOS film or a $WSi_2$ film according to the selective CVD technique. Instead of the selective CVD technique, the DOPOS or $WSi_2$ film may be entirely formed according to the CVD technique, and the DOPOS or $WSi_2$ film may be etched back and flattened to fill the second contact hole formed through the film 467. Thereafter, a bit line 233 is formed from Al, Al—Si, or Al—Cu—Si, and then, a third interlayer insulation film 468 is formed from $SiO_2$ or $Si_3N_4$ according to the CVD technique.

(f) The photolithography technique is employed to open a third contact hole (via hole) in the film 468, and the third contact hole is filled with metal such as W or $WSi_2$ according to the selective CVD technique, to form a second contact electrode 236. The second contact electrode 236 is covered with a bottom electrode 242, which is formed from $W_{1-x}Re_xO_{3-\delta}$ to a thickness of 50 nm according to the DC magnetron spattering technique. The mole fraction of Re is preferably in the range of 0.2 to 0.8. An alloy of Re and W, or a sintered target formed from a mixture of $ReO_3$ and $WO_3$ powder of, for example, 1:3 is used to form the mixed crystal electrode under a pressure of 0.53 Pa at a substrate temperature of 400 to 600° C. in a mixture of $O_2$ and Ar gases. When the $ReO_3$ and $WO_3$ powder is used, an Ar gas or a mixture of $O_2$ and Ar gases is used. If required, $WO_{3-\delta}$ and $Re_xO_{3-\delta}$ involving oxygen defect may be contained. The bottom electrode 242 may be made by forming a W—Re alloy film according to the spattering or CVD technique and by oxidizing the surface of the alloy film. On the bottom electrode 242, an $SrTiO_3$ film 243 is deposited to a thickness of about 50 nm with the use of a powder target of stoichiometric composition according to the high-frequency magnetron spattering technique. For example, the film 243 is formed in a mixture of Ar and $O_2$ gases at a pressure of 1.33 Pa and a substrate temperature of 600° C. Alternatively, an STO film 243 is deposited on the W—Re bottom electrode 242, to spontaneously form a film of $W_{1-x}Re_xO_{3-\delta}$ between the bottom electrode 242 and the STO film 243. On the film 243, a top electrode 244 is formed from Al to a thickness of 100 nm according to the DC spattering technique.

(g) The photolithography technique is employed to pattern the films 244 to 242 into a capacitor of a cell of the DRAM. More precisely, the films 244, 243, and 242 are successively etched according to the RIE technique with, for example, $CCl_4$, $Cl_2$/Ar, $CF_4$, and $C_3F_8$. After the RIE, $SiO_2$, $Si_3N_4$, or polyimide film is deposited on the capacitor, to form a fourth interlayer insulation film 173. A fourth contact hole is opened through the film 173 above the top electrode 244. In the fourth contact hole, wiring is made from Al, Al—Si, or Al—Cu—Si, to form a plate electrode 245. This completes the DRAM according to the sixth embodiment.

The sixth embodiment never roughens the surface morphology of the bottom electrode of the thin film capacitor when carrying out high-temperature processes, to thereby provide the storage capacitor with a high dielectric constant. The sixth embodiment is capable of minimizing the feature size of circuit element and increasing the integration density of the semiconductor devices such as DRAMs. The electrodes of the storage capacitors of the sixth embodiment are easy to process. The sixth embodiment forms a dielectric thin film having a high dielectric constant on a bottom electrode without oxidizing the surface of the electrode. Namely, the surface of W or WN that forms a barrier metal or the bottom electrode is never oxidized, and therefore, it is possible to employ, as the material of the dielectric thin film, not only STO but also other material having a high dielectric constant. Consequently, the sixth embodiment increases the degree of freedom of the structure and process designing of high integration semiconductor memories such as DRAMs.

[Seventh Embodiment]

Figure 21A:
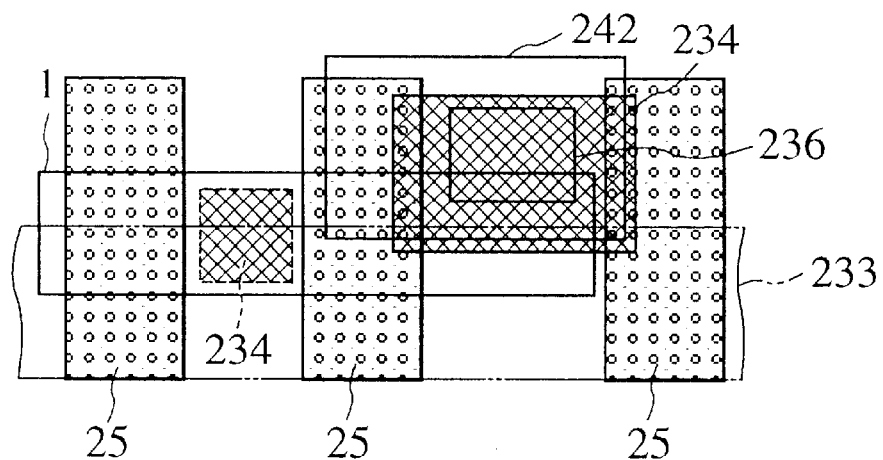
FIGS. 21A and 21B are plan and sectional views showing an SOI DRAM according to the seventh embodiment of the present invention.
Figure 21B:
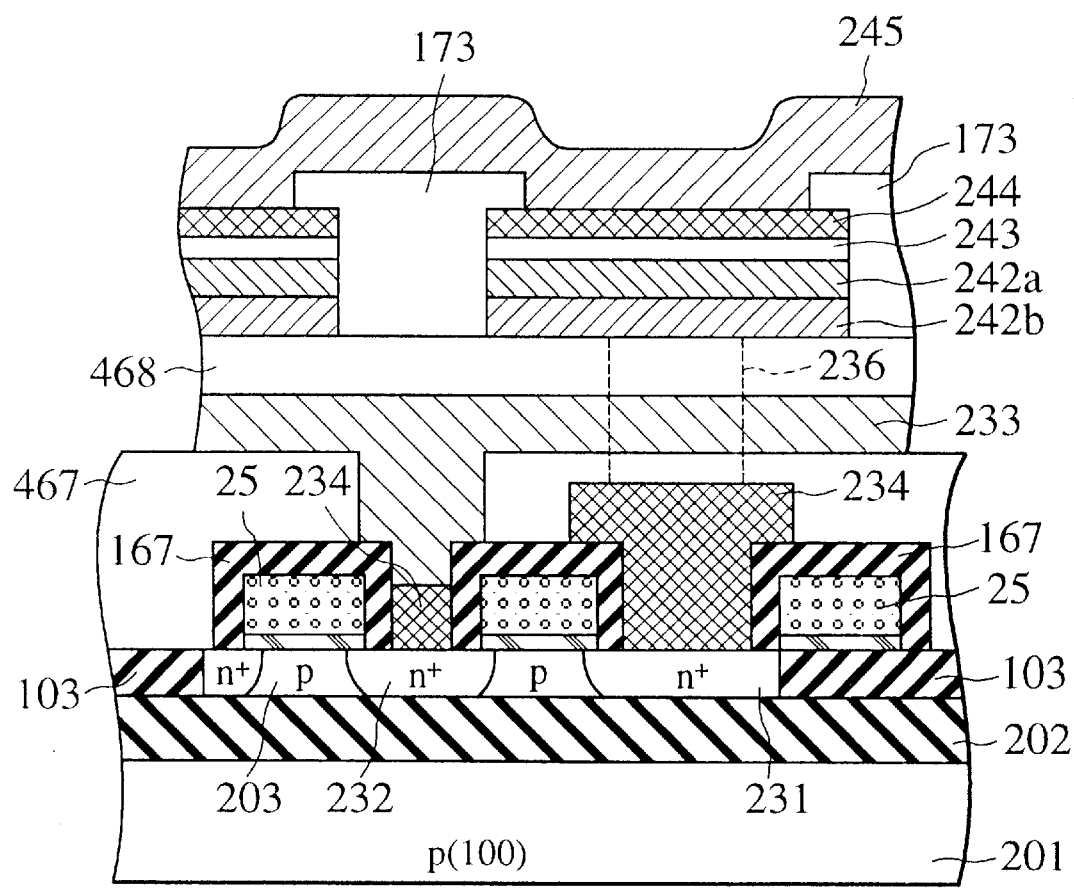

FIG. 21A is a plan view showing an SOI MOS DRAM according to the seventh embodiment of the present invention, and FIG. 21B is a sectional view showing the same. The DRAM has a p-type (100) silicon substrate 201 on which a buried oxide film 202 is formed. On the film 202, a p-type SOI film 203 is formed. The film 203 is surrounded by an oxide film 103 formed according to, for example, the LOCOS technique. The film 103 isolates adjacent elements from one another. The surrounded region is an active region (device region) 1. The active region 1 contains a switching transistor of a unit cell of the DRAM. The transistor consists of an $n^+$-type source region 231 and an $n^+$-type drain region 232. The bottoms of the source and drain regions 232 are deep to get in contact with the film 202. A channel region 203 is formed between the source and drain regions 231 and 232. On the channel region 203, a gate oxide film is formed and on which a gate electrode 25 is formed from, for example, polysilicon. The gate electrode 25 serves as a word line as shown in FIG. 21A. On the word line, there is formed a first interlayer insulation film 167, which may be an oxide film. Contact holes are opened through the film 167. In the contact holes, contact electrodes 234 are formed from refractory metal such as W, Mo, and Ti, or refractory metal silicide such as $WSi_2$, $TiSi_2$, and $MoSi_2$. The contact electrodes 234 are in contact with the top of the source region 231 and the drain region 232. Over the contact electrode 234, a second interlayer insulation film 467 is formed. A second contact hole (via hole) on the drain region 232 is opened through the film 467. In the second contact hole, a data line (bit line) 233 made of metal such as W, Al, Al—Si, and Al—Cu—Si is formed. The data line 233 is in contact with the contact electrode 234 on the drain region 232. The data line 233 is covered with a third interlayer insulation film 468, which is an oxide film or a nitride film. The film 468 is covered with a WN film 242b of 30 nm thick on which a film 242a of $W_{1-x}Re_xO_{3-\delta}$ of 30 nm thick is formed. The films 242b and 242a form a storage electrode (bottom electrode) 242 of each cell of the DRAM. The bottom electrode 242 is covered with a dielectric thin film 243 of BSTO ($Ba_xSr_{1-x}TiO_3$) of 50 nm thick. The dielectric thin film 243 is covered with an opposite electrode (top electrode) 244 of Al of 100 nm thick. A third contact hole, or a via hole opened through the films 467 and 468 has a second contact electrode 236, which connects the bottom electrode 242 to the first contact electrode 234 formed on the source region 231. An interlayer insulation film 173 is formed on the top electrode 244. The film 173 has a fourth contact hole through which the top electrode 244 is connected to a plate electrode 245. To the contrary, a prior art directly grows $Ba_xSr_{1-x}TiO_3$ on a bottom electrode of W or WN. Then, the surface of the W or WN film is oxidized to form insulation oxide $WO_3$. Since $WO_3$ does not electrically conduct, it forms parasitic capacitor, which is connected in series to the intrinsic capacitor and decreases the total capacitance of the original capacitor below a designed value. Namely, the WN film will not properly serve as an electrode, and the $WO_3$ layer on the WN film having a lower dielectric constant than the $Ba_xSr_{1-x}TiO_3$ film decreases the apparent dielectric constant of the DRAM storage capacitor. On the other hand, the seventh embodiment mixes $WO_3$ with $ReO_3$ to form the $W_{1-x}Re_xO_{3-\delta}$ film 242a so that no surface oxidization occurs in the succeeding processes and a sufficient electric conductivity is secured for the bottom electrode 242.

In this way, the bottom electrode 242 of the seventh embodiment is not oxidized when the BSTO film 243 or any other perovskite dielectric film is formed thereon in an oxygen atmosphere. The seventh embodiment increases the degree of designing freedom of the structure and process and the productivity of DRAMs. As explained in the sixth embodiment, FIG. 19 is a graph showing the bias electric field dependency of the dielectric constants of capacitors according to the present invention and prior arts, and FIG. 20 is a graph showing the voltage dependency of the leakage currents of the capacitors. These graphs are based on tests made with TEG patterns, or the slab capacitors that are electrically isolated from other elements. Compared with the conventional capacitor having a top electrode made of Pt and a bottom electrode made of ITO of the curve 58, the conventional capacitor having top and bottom electrodes made of ITO of the curve 59, and the conventional capacitor having a top electrode made of ITO and a bottom electrode made of STO:Nb of the curve 60, the BSTO thin film capacitor having the bottom electrode made of $WN/W_{1-x}Re_xO_{3-\delta}$ according to the seventh embodiment of the curve 44 has a higher dielectric constant and a lower leakage current.

Since the vapor pressure of ReO3 is very high, an electrode made of mixed crystals of $ReO_3$ and $WO_3$, i.e., $W_{1-x}Re_xO_{3-\delta}$ is easy to process according to, for example, the RIE technique. On the other hand, a conventional platinum electrode is hard to process. A method of manufacturing the SOI DRAM according to the seventh embodiment will be explained. This method is basically the same as that of the sixth embodiment.

(a) Similar to the sixth embodiment, a gate electrode 25 and $n^+$-type source and drain regions 231 and 232 are formed on an SOI substrate. An interlayer insulation film 167 is formed on these films, and first contact holes are opened through the film 167. In the first contact holes, $n^+$-type doped polysilicon layers or W films are deposited according to the CVD technique, to form first contact electrodes 234.

(b) Over the first contact electrodes 234 and the first interlayer insulation film 167, a second interlayer insulation film 467, made from $SiO_2$, PSG, or BPSG, is deposited by the CVD technique. A second contact hole is opened through the film 467 above the first contact electrode 234 formed on the drain region 232. The second contact hole is filled with a DOPOS or $WSi_2$ film according to the selective CVD technique. Instead, the DOPOS or $WSi_2$ film may be entirely formed according to the CVD technique, and the film is etched back and flattened to fill the second contact hole. Thereafter, a bit line 233 is formed from Al, Al—Si, or Al—Cu—Si. Then, a third interlayer insulation film 468, made from $SiO_2$, or $Si_3N_4$, is deposited on the bit line 233 by CVD technique.

(c) The photolithography technique is employed to open a third contact hole (via hole) through the film 468, and the third contact hole is filled with metal such as W or $SWi_2$ according to the selective CVD technique, to form a second contact electrode 236. On the second contact electrode 236, there is formed a lower layer 242b of a bottom electrode from WN to a thickness of 30 nm by spattering, etc. On the lower layer 242b, there is formed an upper layer 242a by spattering with an Re metal target or an $ReO_3$ sintered material target, in a mixture of $O_2$ and Ar gases, at a pressure of 0.53 Pa and a substrate temperature of 400 to 600° C. The bottom electrode thus formed has a mixed crystal layer of $WO_3$ and $ReO_3$. On the film 242aa, a BSTO film 243 is deposited to a thickness of 50 nm according to the high-frequency magnetron spattering technique employing a mixture of Ar and $O_2$ gases, at a pressure of 1.3 Pa and a substrate temperature of 600° C. On the BSTO film 243, a top electrode 244 is formed from Al to a thickness of 100 nm according to the DC spattering technique. The bottom electrode 242a of $W_{1-x}Re_xO_{3-\delta}$ may be formed by forming a W—Re alloy film according to the spattering or CVD technique and by oxidizing the surface thereof.

(d) The photolithography technique is used to pattern these films into the storage capacitor of FIG. 21B. Namely, the Al film 244, BSTO film 243, $W_{1-x}Re_xO_{3-\delta}$ film 242a, and WN film 242b are successively etched according to the RIE technique with, for example, $CCl_4$, $Cl_2/Ar$, $CF_4$, and $C_3F_8$. Then, $SiO_2$, $Si_3N_4$, or polyimide is deposited on the storage capacitor, to form a fourth interlayer insulation film 173. A fourth contact hole is opened through the film 173 above the top electrode 244. Through the fourth contact hole, wiring is made from Al, Al—Si, or Al—Cu—Si, to form a plate electrode 245. This completes the DRAM according to the seventh embodiment.

The seventh embodiment maintains the surface morphology of the bottom electrode of the thin film capacitor when carrying out high-temperature processes, to thereby provide the capacitor with a high dielectric constant. The seventh embodiment is capable of minimizing the storage capacitor sizes for semiconductor memory devices such as DRAMs. The electrodes of the DRAM storage capacitors according to the seventh embodiment are easy to process. The seventh embodiment forms a dielectric thin film having a high dielectric constant on a bottom electrode without oxidizing the surface of the electrode. Namely, the surface of W or WN that forms a barrier metal or the bottom electrode is never oxidized, and therefore, it is possible to employ, as the material of the dielectric thin film, not only STO but also other material having a high dielectric constant. It is possible to form the bottom electrode (interface electrode) 242a from an alloy of W—Re, and then, directly deposit the BSTO film 243 thereon so that a film of $W_{1-x}Re_xO_{3-\delta}$ is spontaneously, or naturally formed between the bottom electrode 242a and the BSTO film 243. Consequently, the seventh embodiment increases the degree of freedom of the structural design and process design of high integration semiconductor memories such as DRAMs.

[Eighth Embodiment]

Figure 22A:
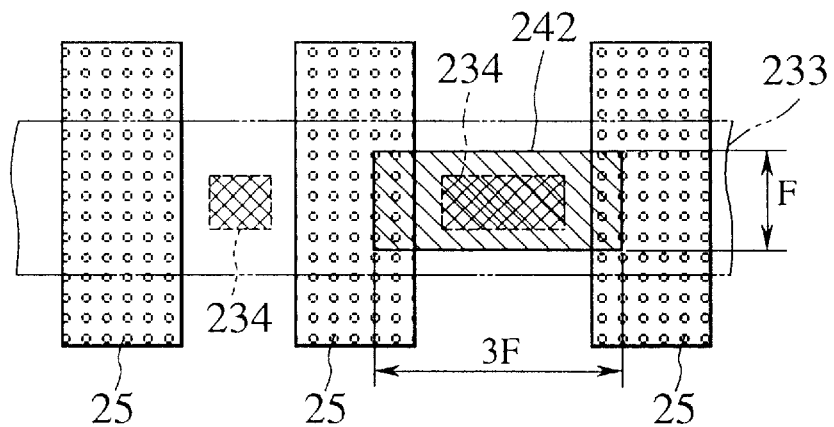
FIGS. 22A and 22B are plan and sectional views showing a DRAM according to an eighth embodiment of the present invention.
Figure 22B:
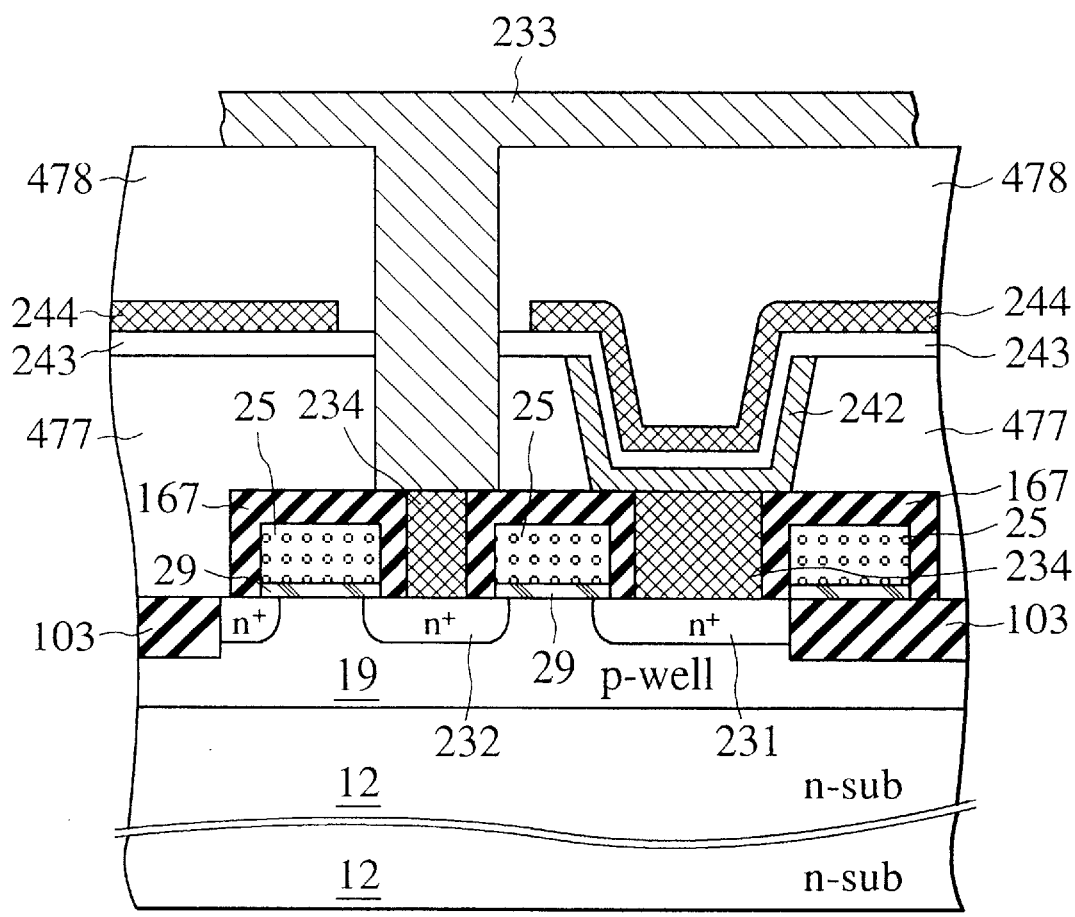

FIG. 22A is a plan view showing a MOS DRAM according to the eighth embodiment of the present invention, and FIG. 22B is a sectional view showing the same. The DRAM has an n-type (100) silicon substrate 12 on which a p-well 19 is formed. On the p-well 19, an oxide film 103 for isolating elements from one another is formed according to the BOX (buried oxide) technique. A region surrounded by the film 103 is a channel region. FIG. 22B shows one of cells of the DRAM. The cell is formed in an active region (device region) defined by the film 103. At the surface of the p-well 19, $n^+$-type source and drain regions 231 and 232 are formed to a predetermined depth, to form a switching transistor of the unit cell. On the channel region between the source and drain regions 231 and 232, there is formed a gate oxide film 29 on which a gate electrode 25 is formed from, for example, polysilicon. The gate electrode 25 serves as a word line in this embodiment. It is possible to form a word line from W, Mo, or $WSi_2$ and connect the word line to the gate electrode 25. On the gate electrode 25, a first interlayer insulation film 167, which may be an oxide film, is formed. Contact holes are opened through the film 167. In the contact holes, contact electrodes 234 are formed from W, $WSi_2$, $TiSi_2$, or $MoSi_2$ to reach the top of the drain region 232 and the source region 231. The contact electrode 234 on the drain region 232 is connected to a data line (bit line) 233, which is formed from metal such as W, Al, Al—Si, or Al—Cu—Si.

A second interlayer insulation film 477 is formed from $SiO_2$, PSG, BPSG, or $Si_3N_4$ on the film 167. On the film 477, a U groove is formed. The aspect ratio of the U groove is relatively small. In the U groove, a bottom electrode 242, a dielectric thin film 243, and a top electrode 244 are formed to form a storage capacitor of the eighth embodiment.

The bottom and top electrodes 242 and 244 may be made of $La_{0.3}Sr_{0.7}TiO_3$ or $Nd_{0.4}Sr_{0.6}TiO_3$, and the dielectric thin film 243 of $Ba_{0.5}Sr_{0.5}TiO_3$. The electrodes 242 and 244 and film 243 may be those of the first to seventh embodiments. The top electrode 244 serves as a plate electrode and is covered with a third interlayer insulation film 478. A second contact hole (via hole) is opened through the films 478, 243, and 477. In the contact hole, a bit line 233 is formed and connected to the contact electrode 234 on the drain region 232. The side wall of the capacitor U groove forms an angle of 80 to 90 degrees with respect to a main plane. The size of the opening of the U groove is about 2 to 3F×F, where F is a feature size used in designing the DRAM. The aspect ratio of the U groove is in the range of 1 to 3.

The structure according to the eighth embodiment optimizes a barrier height in each interface between the electrodes 242 and 244 and the dielectric thin film 243. The electrodes 242 and 244 have a thermal expansion coefficient proper for the dielectric thin film 243. Accordingly, the storage capacitor of the eighth embodiment has a high dielectric constant and a low leakage current. The DRAM storage capacitor of the eighth embodiment realizes large capacitance with a small area, and therefore, is suitable for high-integrated large-capacity semiconductor memories such as DRAMs of gigabit order. The electrodes 242 and 244 made of $La_{0.3}Sr_{0.7}TiO_3$ or $Nd_{0.4}Sr_{0.6}TiO_3$ have good crystalline consistency with the perovskite oxide of the dielectric thin film 243, to cause no accumulation of charges due to an interface lattice mismatching nor degradation of the dielectric thin film due to crystalline distortion. Consequently, the storage capacitor of the eighth embodiment has a large dielectric constant and a stable memory function.

FIGS. 23A to 23E show processes of manufacturing a DRAM according to the eighth embodiment. In this example, the dielectric thin film 243 is a BSTO film, and the top and bottom electrodes 244 and 242 are made of $Nd_{0.4}Sr_{0.6}TiO_3$. The DRAM storage capacitor of the eighth embodiment may be made of the materials of the first to seventh embodiments and the modifications thereof.

Figure 23A:
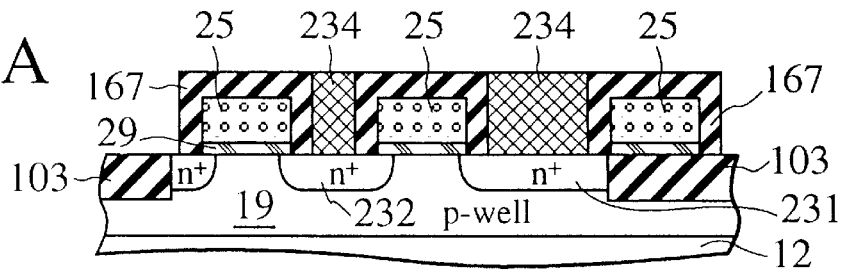
FIGS. 23A to 23E are sectional views showing processes of manufacturing the DRAM of the eighth embodiment.

(a) In FIG. 23A, ions $^{11}B^+$ are implanted into an n-type substrate, which is heat-treated to form a p-well 19 to a depth of 2 to 0.3 μm at an impurity concentration of $5\times10^{16}$ to $1\times10^{18}$ cm$^{-3}$. The BOX technique is employed to form an oxide film 103 on the p-well 19. The oxide film 103 is used to electrically isolate adjacent elements from one another. A gate oxide film 29 is formed to a thickness of 10 nm on which a phosphorus-doped polysilicon layer 25 is formed to a thickness of 0.3 μm according to the LPCVD technique. The layer 25 is patterned into a polysilicon gate electrode 25 having a gate length of 0.5 μm according to the lithography and RIE techniques. Ions $^{31}P^+$ are implanted at $V_{ac}$=30 kV and a dose of Φ=$3\times10^{15}$ cm$^{-2}$, and a heat treatment is carried out at 850° C. for 30 minutes, to form $n^+$-type source and drain regions 231 and 232. An $SiO_2$/PSG film is deposited to a thickness of 200 to 300 nm according to the CVD technique, to form a first interlayer insulation film 167. If it is required, a p$^+$-type channel stop region is formed, and a channel dope ion implantation is carried out. These are standard MOS DRAM fabrication processes, and therefore, are not explained here. First contact holes are opened through the film 167. In the contact holes, an As-doped n$^+$-type polysilicon layer or a W film is deposited to a thickness of 200 nm to 400 nm according to the CVD technique, to form contact electrodes (plugs) 234.

Figure 23B:
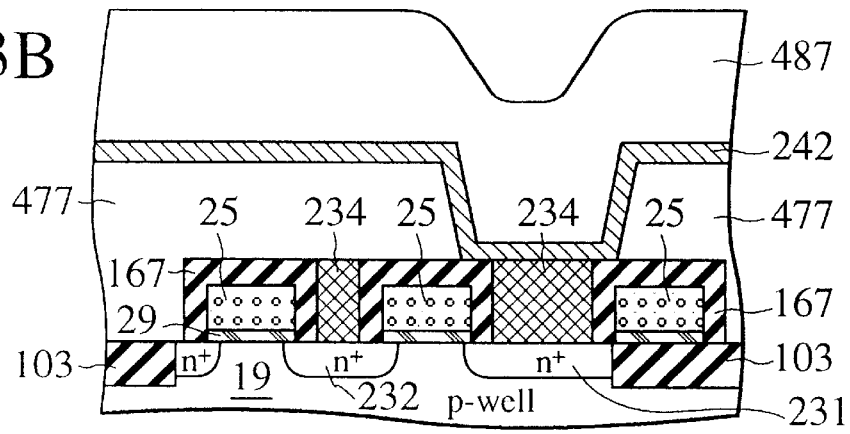

(b) In FIG. 23B, a second interlayer insulation film 477 is formed from $Si_3N_4$ on the contact electrodes 234 and film 167. The photolithography and RIE or ECR ion etching techniques are used to form a U groove in the insulation film 477. The aspect ratio of the U groove is in the range of 1 to 3. The insulation film 477 may be made of a composite film of $SiO_2$ and $Si_3N_4$. In this case, the top layer must be the $Si_3N_4$ film. A mask for forming the U groove is prepared to align the bottom of the U groove to the contact electrode 234 on the source region 231. The side wall of the U groove is nearly vertical, i.e., at an angle of 90 to 80 degrees. The surface of the U groove is covered with a film 242 of $Nd_{0.4}Sr_{0.6}TiO_3$ according to the CVD or spattering technique, and then, an oxide film 487 is formed to bury the U groove. The film 487 is formed according to an SOG (spin-on-glass) technique, or an organic-silicon-based CVD technique using such as TEOS (tetraethyl orthosilicate $Si(OC_2H_5)_4$).

Figure 23C:
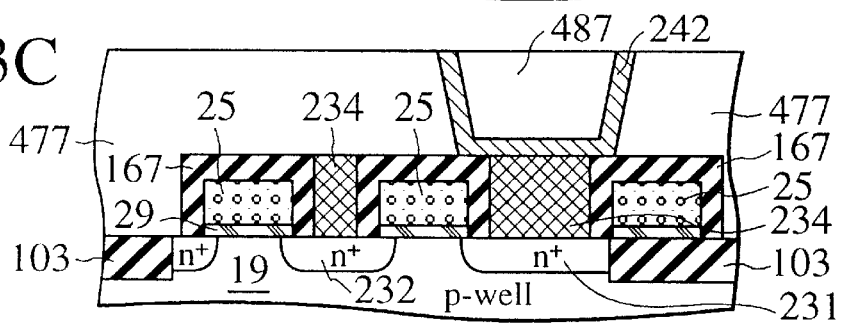

(c) In FIG. 23C, the film 487 is etched back and flattened according to a CMP (chemical mechanical polishing) technique or a reverse spattering technique, to expose the film 477. As a result, the film 242 is left only in the U groove. Accordingly, even some kinds of perovskite conductive oxide 242, which are difficult to process by the RIE technique, are easily patterned and separated by this flattening process.

Figure 23D:
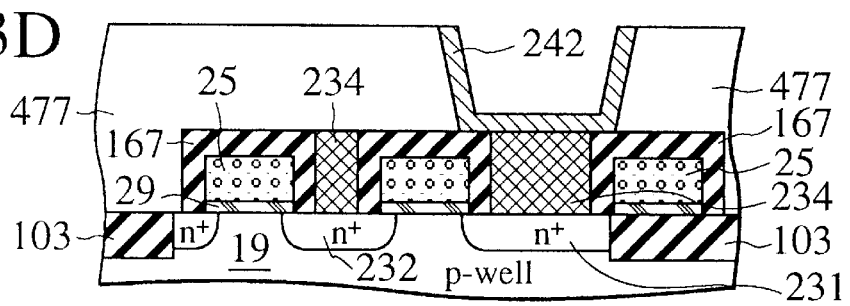

(d) In FIG. 23D, the $SiO_2$ film 487 is etched. Since the composite film 477 has $Si_3N_4$ on top thereof, the film 487 is selectively etched with an HF-based etching solution. The etching may be carried out according to a $CF_4$-based CDE (chemical dry etching) technique, which may realize a selection ratio of approximately 5 between $Si_3N_4$ and $SiO_2$.

Figure 23E:
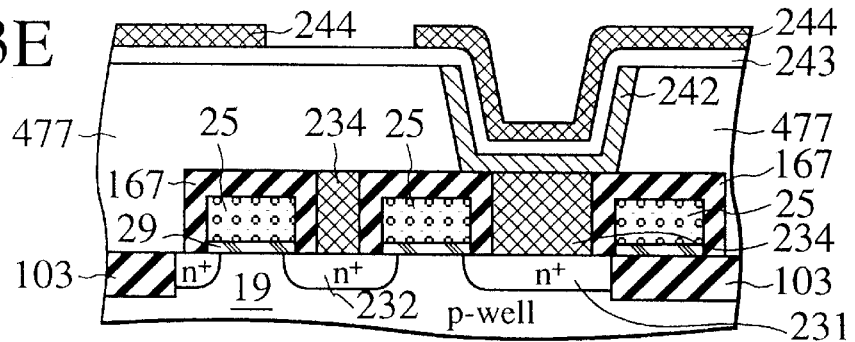

(e) In FIG. 23E, the multiple RF magnetron spattering or CVD technique is employed to form a film 243 of $Ba_{0.5}Sr_{0.5}TiO_3$ of 20 to 50 nm thick. Then, a film 244 of $Nd_{0.4}Sr_{0.6}TiO_3$ serving as a top electrode is formed to a thickness of 30 to 50 nm according to the multiple RF magnetron spattering or CVD technique. A film forming temperature is in the range of 500 to 700° C. A photoresist film is spin-coated entirely and is patterned into a mask according to the photolithography technique. The mask is used to pattern the film 244 as shown in FIG. 23E according to the $CF_4$-based RIE technique.

(f) A film of $SiO_2$, PSG, BPSG, $Si_3N_4$, or polyimide is deposited according to the CVD technique, to form a third interlayer insulation film 478 as shown in FIG. 22B. A second contact hole is opened through the films 478, 243, and 477 above the drain region 232. A high conductivity film such as a doped polysilicon (DOPOS) film or a $WSi_2$ film is formed to fill the second contact hole according to the selective CVD technique. Instead of the selective CVD technique, the CVD technique may be employed to form the DOPOS film or $WSi_2$ film entirely, and then, the DOPOS or $WSi_2$ film is etched back and flattened to fill only the second contact hole on the no drain region 232. A bit line 233 is formed from Al, Al—Si, or Al—Cu—Si on the filled second contact hole, to complete the DRAM of FIGS. 22A and 22B.

[Ninth Embodiment]

Figure 24:
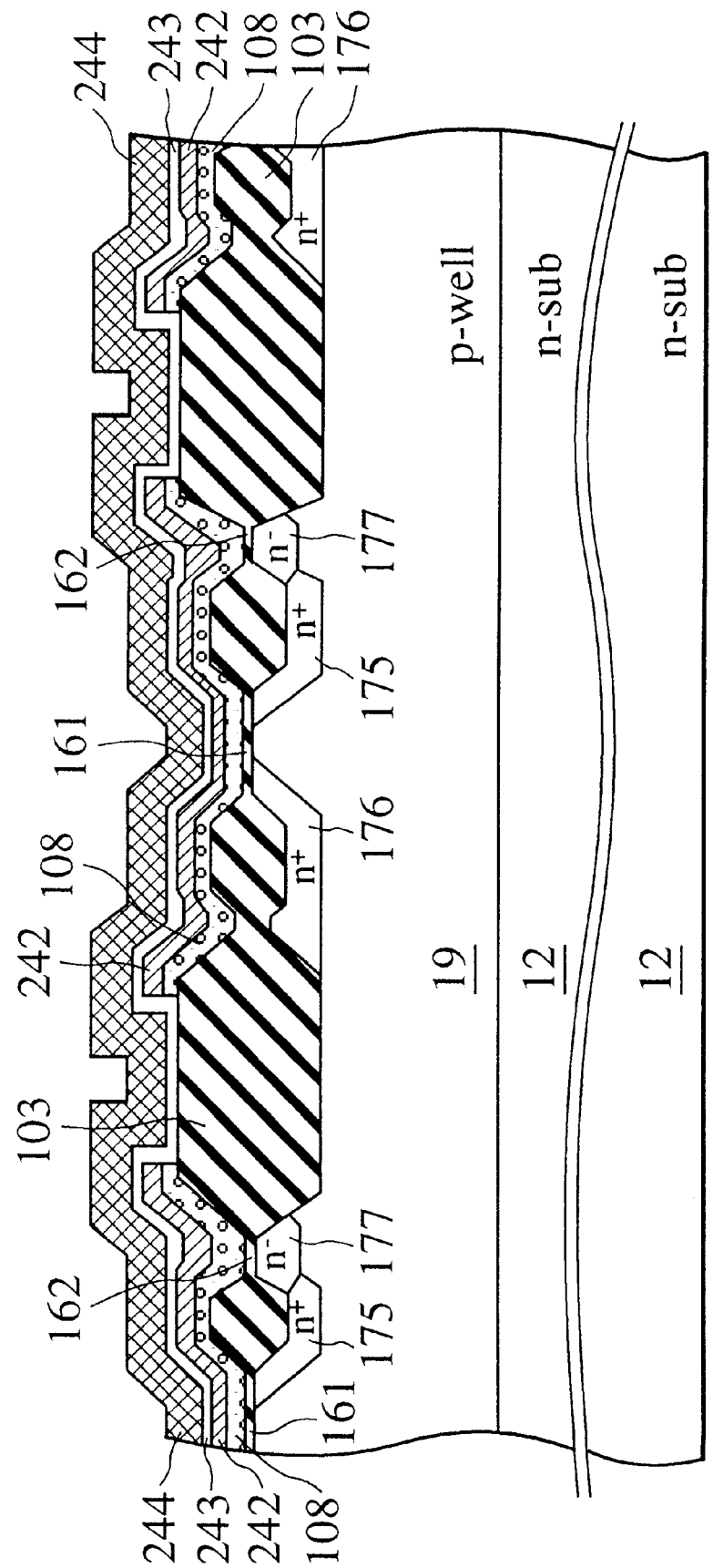
FIG. 24 is a sectional view showing a flash EEPROM according to a ninth embodiment of the present invention.
Figure 25:
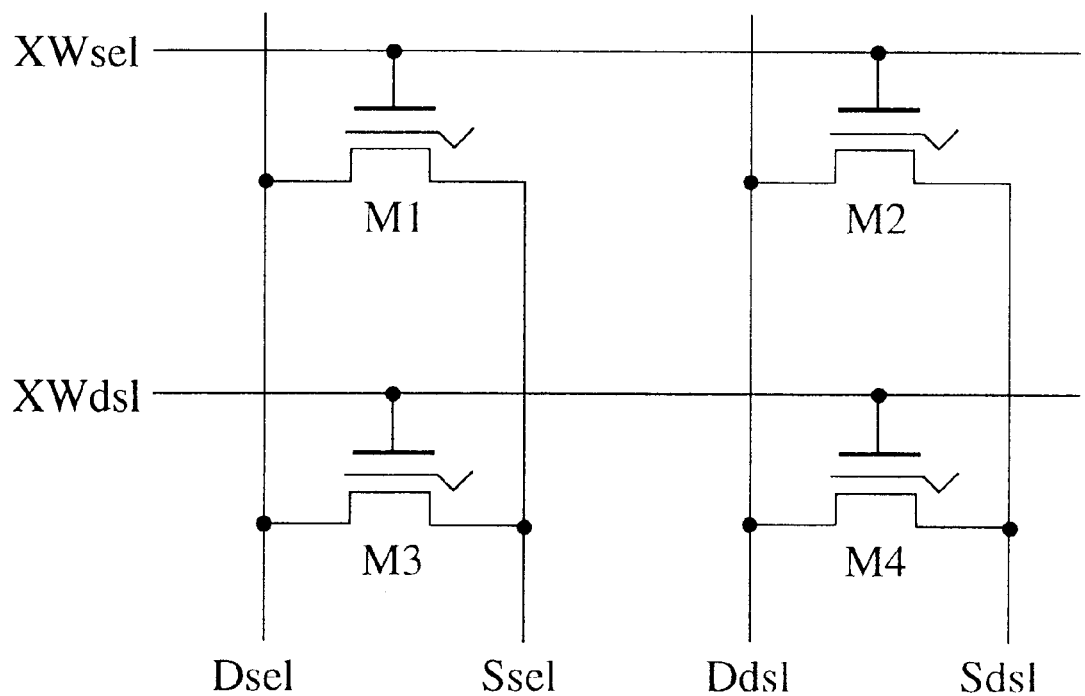
FIG. 25 shows an equivalent circuit of the memory of the ninth embodiment.

FIG. 24 is a sectional view showing a flash EEPROM according to the ninth embodiment of the present invention, and FIG. 25 shows an equivalent circuit of the same. This memory is a nonvolatile memory employing a paraelectric film. The cross-sectional view of FIG. 24 is along a word line 244. FIG. 25 shows word lines $D_{sel}$ and $D_{dsl}$ and bit lines $XW_{sel}$ and $XW_{dsl}$. A transistor of each memory cell has an n-type substrate 12 on which a p-well 19 is formed. At the surface of the p-well 19, there are formed n$^+$-type source and drain regions 175 and 176. An n$^+$-type region 177 is formed at the surface of the p-well 19, and on top of the region 177, there is formed a tunnel oxide film 162 of 10 nm thick to write and erase data with a tunnel current (Fowler-Nordheim tunnel current). The region 176 serves as the buried bit lines $D_{sel}$ and $D_{dsl}$.

The floating gate of the memory transistor is a composite film consisting of a doped polysilicon (DOPOS) film 108 of 150 nm thick and a film 242 of $Sr_{0.8}La_{0.2}TiO_3$ of 250 nm thick. The film 108 may be omitted, and the film 242 may be formed to a thickness of 400 nm. These films are designed according to the threshold voltage Vth of the memory transistor. The film 242 may be omitted, and only the DOPOS film 108 may form a bottom electrode. Instead of the DOPOS film 108, it is possible to form a silicide film made of, for example, $MoSi_2$, $TiSi_2$, or $WSi_2$, or a polycide film, i.e., a composite film of silicide and DOPOS films. On the film 242, a film 243 of $Sr_{0.6}Ba_{0.4}TiO_3$ is formed to a thickness of 10 nm and on which a control gate 244 is formed from $Sr_{0.8}La_{0.2}TiO_3$ to a thickness of 500 nm. The control gates 244 serve as the word lines $XW_{sel}$ and $XW_{dsl}$ that are connected to adjacent cells.

Similar to the first and second embodiments, the floating gate 242 and control gate 244 of the ninth embodiment may be made of $Ca_{0.7}Y_{0.3}TiO_3$, $Ca_{0.5}Nd_{0.5}TiO_3$, or $Ca_{0.4}Sr_{0.2}Y_{0.2}La_{0.2}TiO_3$.

[Tenth Embodiment]

Figure 26:
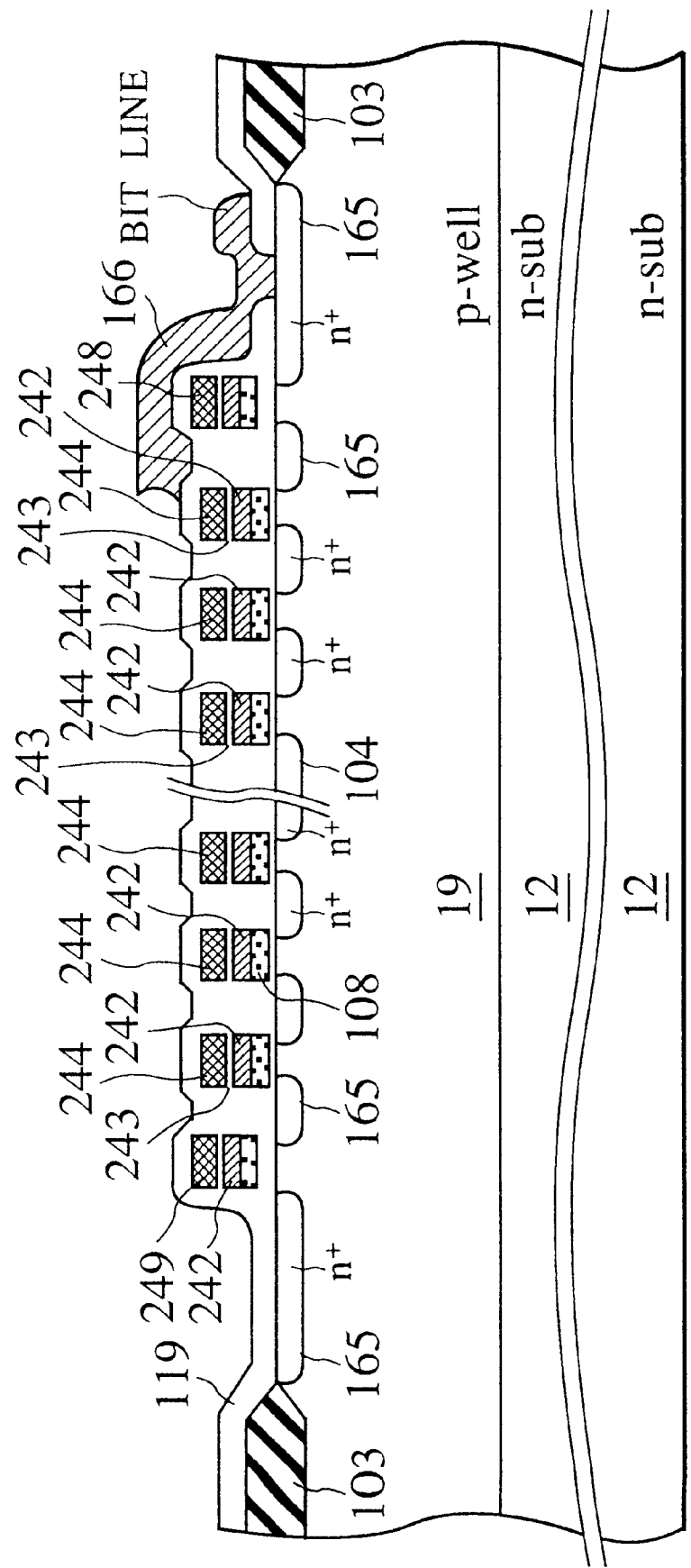
FIG. 26 is a sectional view showing a NAND-type EEPROM according to a 10th embodiment of the present invention.
Figure 27:
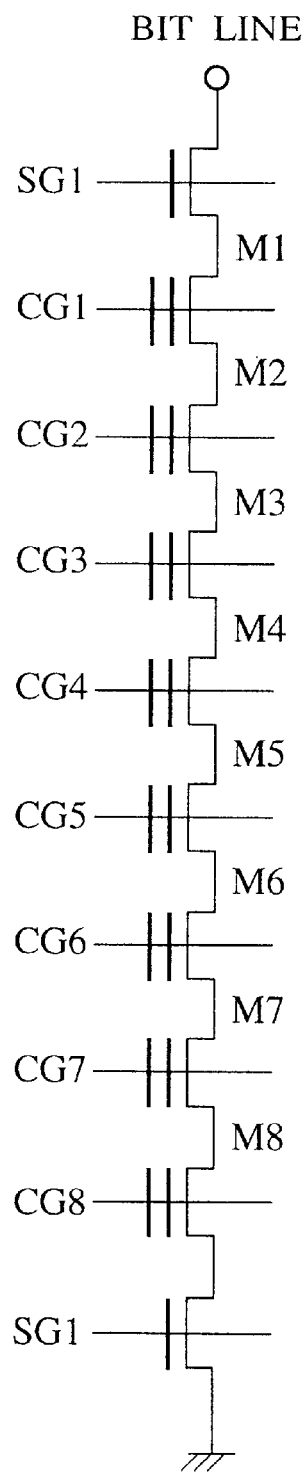
FIG. 27 shows an equivalent circuit of the memory of the 10th embodiment.

FIG. 26 shows a NAND-type EEPROM according to the 10th embodiment of the present invention, and FIG. 27 shows an equivalent circuit of the same. In FIG. 26, eight memory cells M1 to M8 are connected in series, and selection gate transistors SG1 and SG2 are connected to each end of the series connected memory cells. The top of an n-type substrate 12 has a p-well 19 on which the circuit of FIG. 27 is formed.

N$^+$-type regions 165 are formed inside the p-well 19, to serve as the source and drain regions of MOS transistor of the memory cells. The region 165 at the right end is connected to a bit line 166. The floating gate of each of the memory cells M1 to M8 is made of a composite film that consists of a doped polysilicon (DOPOS) film 108 of 200 nm thick and a film 242 of $LaNiO_3$ of 200 nm thick formed on the film 108. The floating gate may be made of one of the films 108 and 242.

The control gate 244 of each of the memory cells M1 to M8 consists of a film of $LaNiO_3$ of 400 nm thick. Between the control and floating gates 242 and 244, there is formed a film 243 of $Sr_{0.5}Ba_{0.5}TiO_3$ of 100 nm thick. The gates and films 242, 243, 244 form a capacitor with the control gate 244 serving as a top electrode, the floating gate 242 serving as a bottom electrode, and the film 243 serving as a dielectric thin film. In this capacitor, the electric resistivity of $LaNiO_3$ is low, i.e., $3 \times 10^{-4}$ Ω cm at room temperature. The dielectric thin film 243 is a polycrystalline film. Each end of the series-connected memory cells M1 to M8 is provided with a switching transistor. The selection gates 248 and 249 of the switching transistors are made of $LaNiO_3$.

The capacitor made of $LaNiO_3/Sr_{0.5}Ba_{0.5}TiO_3/LaNiO_3$ of the 10th embodiment is deposited according to the multiple RF magnetron spattering technique, or the MOCVD technique employing a β-diketone complex. The curves 35 of FIGS. 5 and 6 represent the characteristics of the capacitor of the 10th embodiment tested with TEG patterns that electrically separate the capacitor from other elements. The capacitor structures of $Sr_{0.8}La_{0.2}TiO_3/Sr_{0.6}Ba_{0.4}TiO_3/Sr_{0.8}La_{0.2}TiO_3$ and $Ca_{0.7}Y_{0.3}TiO_3/Sr_{0.9}Ba_{0.4}TiO_3/Ca_{0.7}Y_{0.3}TiO_3$ of the second embodiment are applicable to the 10th embodiment. Also, the capacitor structure of $LaNiO_3/Sr_{0.5}Ba_{0.5}TiO_3/LaNiO_3$ of the first to ninth embodiment is applicable to the 10th embodiment.

Various modifications will become possible for those skilled in the art after receiving the teachings of the present disclosure without departing from the scope thereof. For example, any one of the first to 10th embodiments may form a film of $NdNiO_3$ of 100 nm thick according to the RF spattering technique, a dielectric film of $Sr_{0.5}Ba_{0.5}TiO_3$ (SBTO) of 10 nm thick thereon according to the multiple RF spattering technique, and a top electrode of $NdNiO_3$ of 100 nm thick thereon. The NdNiO3 film is a polycrystalline film having an electric resistivity of $5 \times 10^{-4}$ Ω cm under a room temperature or below. This is a very low value that is not achievable by a conventional ITO or STO:Nb film. At this time, the SBTO film is usually a polycrystalline film. The curves 37 of FIGS. 5 and 6 indicate the dielectric constant and leakage current of this capacitor. As is apparent in these figures, this capacitor has a high dielectric constant and a low leakage current.

Figure 28:
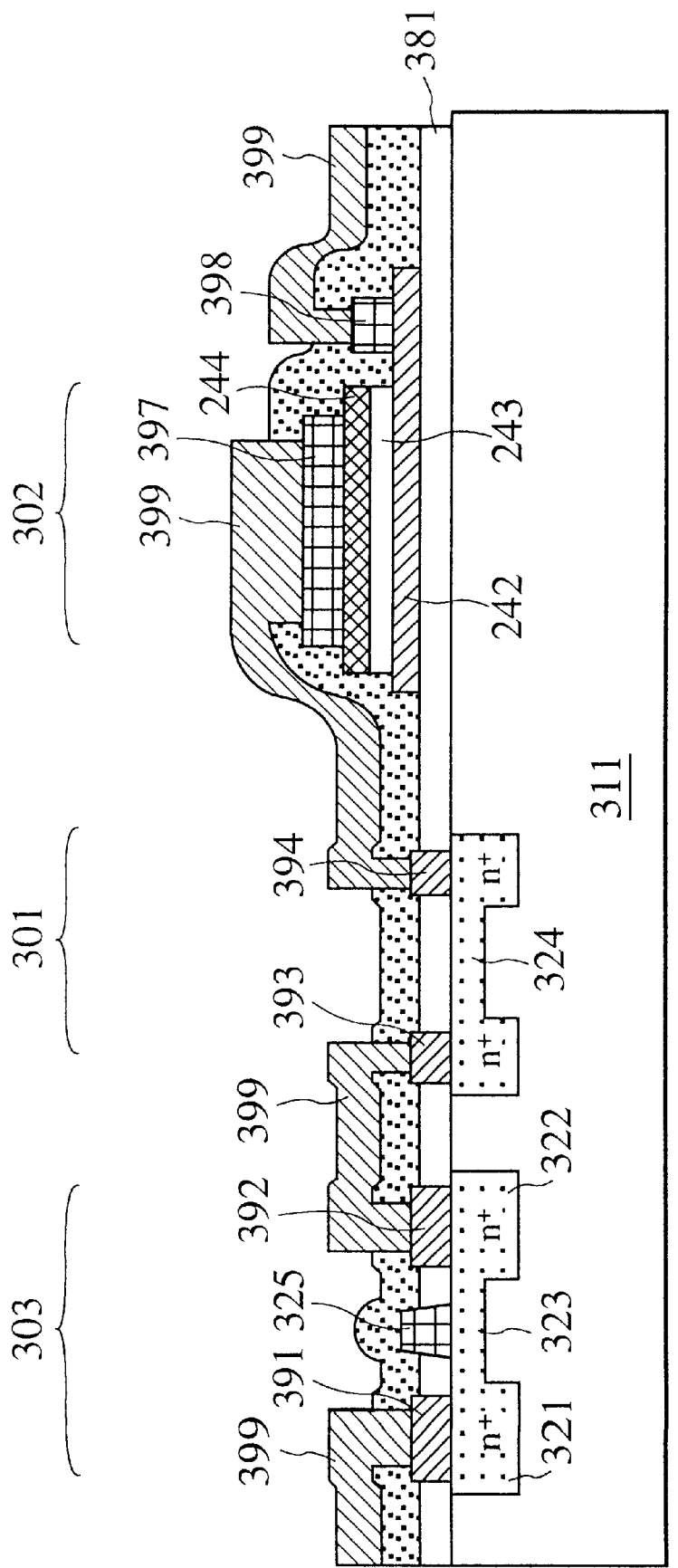
FIG. 28 is a sectional view showing a GaAs microwave monolithic integrated circuit (MMIC) according to an application of the present invention.
Figure 29:
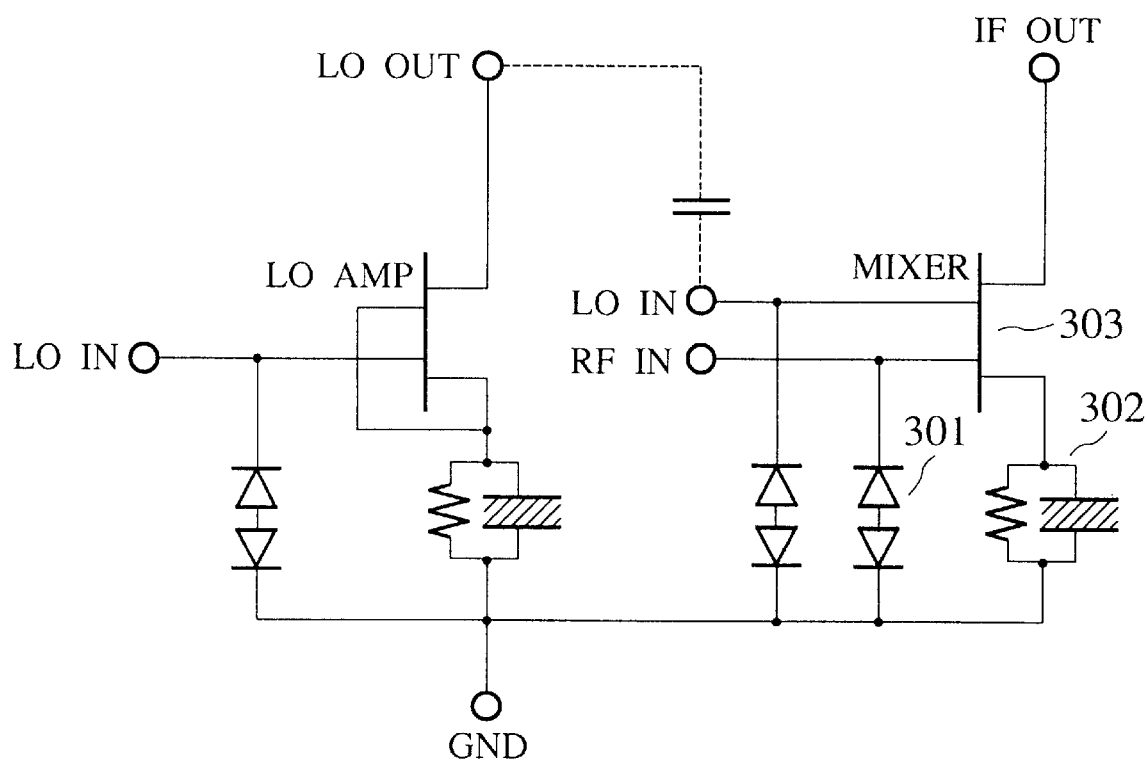
FIG. 29 shows an equivalent circuit of the MMIC of FIG. 28.
Figure 30:
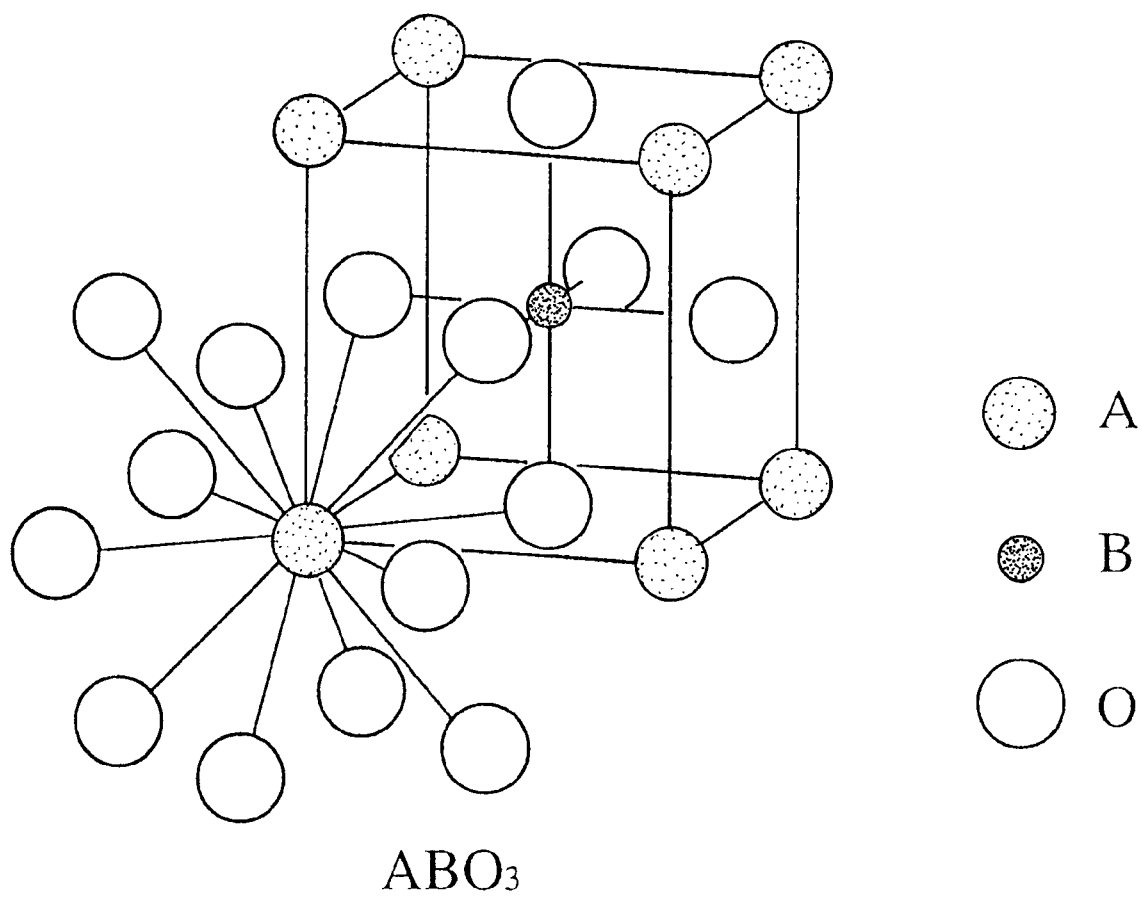
FIG. 30 shows a model of an ABO$_3$ perovskite structure.

Although the first to 10th embodiments relate to semiconductor memories, the electrode structure of the present invention is also applicable to bypass capacitors of GaAs microwave monolithic integrated circuits (MMICs) as well as to capacitors of random-access-type image sensors such as MOS-type image sensors and SIT (static induction transistor) image sensors. The perovskite conductive oxide electrodes according to the present invention have light transmissivity, and this is the reason why they are applicable to the image sensors and image converters. For example, a capacitor consisting of a bottom electrode made of a p$^+$-type silicon region, a dielectric thin film made of perovskite oxide, and a top electrode made of perovskite oxide according to the present invention may be arranged on top of a gate region of a gate-storage type SIT image sensor. FIG. 28 is a sectional view showing a GaAs microwave integrated circuit (MMIC) according to an application of the present invention, and FIG. 29 shows an equivalent circuit of the same. On a GaAs semiconductor substrate 311, a mixer and a local amplifier are integrated. The mixer consists of a GaAs MESFET 303, a resistor 301, and a bypass capacitor 302. The MESFET 303 consists of n$^+$-type source and drain regions 321 and 322 formed in the substrate 311, and a Ti/Al gate electrode 325 that controls a current flowing through a channel 323. Ohmic electrodes of the source and drain regions 321 and 322 are AuGe/Ni/Au electrodes 391 and 392. The resistor 301 consists of an n$^+$-type diffusion region 324 formed in the substrate 311, and Au/Ge/Ni/Au electrodes 393 and 394 serving as ohmic electrodes. The bypass capacitor 302 has a bottom electrode 242 made of $Sr_{0.6}Ca_{0.3}La_{0.1}RuO_3$ of 500 nm thick, a dielectric thin film 243 made of $Sr_{0.6}Ba_{0.4}TiO_3$ of 100 nm thick, and a top electrode 244 made of $Sr_{0.6}Ca_{0.3}La_{0.1}RuO_3$ of 500 nm thick. The capacitor 302 is formed on an oxide film 381 according to the multiple RF magnetron spattering technique. The curves 36 of FIGS. 5 and 6 represent the characteristics of the bypass capacitor 302 measured with TEG patterns that electrically separate the capacitor from other elements. The resistor 301, bypass capacitor 302, and MESFET 303 are connected to one another through an Au-plated wiring layer 399. According to an S-parameter test with a network analyzer, the capacitor of $Sr_{0.6}Ca_{0.3}La_{0.1}RuO_3/Sr_{0.6}Ba_{0.4}TiO_3/Sr_{0.6}Ca_{0.3}La_{0.1}RuO_3$ showed good characteristics at a high frequency over 2 GHz. This capacitor structure is applicable to any one of the first to 10th embodiments.

What is claimed is:

1. A thin film capacitor comprising:

(a) a first electrode;

(b) a second electrode; and (c) a dielectric thin film having a perovskite structure, sandwiched between the first and second electrodes, at least one of the first and second electrodes comprising an electric conductive oxide material having a perovskite structure and showing a metallic conductivity, wherein the electric conductive oxide material consists of $A_1B_1O_3$, in which $A_1$ represents Ca and at least one element of rare-earth elements other than La, and $B_1$ consisting of at least one element of Fe, Mn, Cr, and Ru.

2. A thin film capacitor as claimed in claim 1, wherein said $A_1$ is represented by $AE_{1-x}RE_x$, $(0.1 \leq x \leq 0.95)$, in which AE represents Ca and RE represents rare-earth elements other than La.

3. A thin film capacitor comprising:

(a) a TiN barrier metal layer;

(b) a first electrode formed on the TiN barrier metal layer;

(c) a second electrode; and (d) a dielectric thin film having a perovskite structure, sandwiched between the first and second electrodes, at least one of the first and second electrodes comprising an electric conductive oxide material having a perovskite structure and showing a metallic conductivity, wherein the electric conductive oxide material is $Sr_{1-x}Ba_xRuO_3$ $(0.1 \leq x \leq 0.6)$.

4. A thin film capacitor as claimed in claim 1, wherein said dielectric thin film comprises $Sr_{1-x}Ba_xTiO_3$ $(0 \leq x \leq 1)$.

5. A thin film capacitor as claimed in claim 1, wherein said thin film capacitor is formed on a semiconductor substrate.

6. A semiconductor device comprising a transistor formed on a substrate and said thin film capacitor according to claim 1, the thin film capacitor is formed on the same substrate and connected to the transistor.

7. A semiconductor memory device comprising:

a) a substrate;

b) a semiconductor active region formed at the surface of the substrate;

c) first and second main electrode regions separately formed from each other at the surface of the semiconductor active region;

d) a gate insulation film formed on the surface of the active region between the first and second main electrode regions;

e) a gate electrode formed on the surface of the gate insulation film;

f) a word line connected to the gate electrode;

g) a bit line connected to the first main electrode region; and h) a storage capacitor connected to the second main electrode region, wherein the storage capacitor comprises said thin film capacitor according to claim 1.

8. A semiconductor memory device comprising:
a) a semiconductor substrate of a first conductivity type;
b) a semiconductor region of a second conductivity type formed at the surface of the substrate;
c) first and second main electrode regions of the first conductivity type separately formed from each other at the surface of the semiconductor region;
d) a gate insulation film formed on the surface of the semiconductor region between the first and second main electrode regions;
e) a gate electrode formed on the surface of the gate insulation film;
f) a word line connected to the gate electrode;
g) a bit line connected to the first main electrode region; and
h) a storage capacitor connected to the second main electrode region,
wherein the storage capacitor comprises said thin film capacitor according to claim 1.

9. A semiconductor memory device comprising:
a) an insulation layer formed on a support substrate;
b) a channel region formed at the top of the insulation layer;
c) first and second main electrode regions separately formed from each other at the surface of the channel region;
d) a gate insulation film formed on the surface of the channel region between the first and second main electrode regions;
e) a gate electrode formed on the surface of the gate insulation film;
f) a word line connected to the gate electrode;
g) a bit line connected to the first main electrode region; and
h) a storage capacitor connected to the second main electrode region,
wherein the storage capacitor comprises said thin film capacitor according to claim 1.

10. A semiconductor memory device as claimed in claim 7, wherein the first electrode is in contact with the second main electrode region through an electrode region formed on the second main electrode region.

11. A semiconductor memory device as claimed in claim 10, wherein the second electrode is connected to a plate electrode.

12. A thin film capacitor comprising:
(a) a first electrode;
(b) a second electrode; and
(c) a dielectric thin film having a perovskite structure, sandwiched between the first and second electrodes,
at least one of the first and second electrodes comprising an electric conductive oxide material having a perovskite structure and showing a metallic conductivity,
wherein a surface of the electric conductive oxide material facing to the dielectric thin film consists of $A_1B_1O_3$, in which $A_1$ represents Ca and at least one element of rare-earth elements other than La, and $B_1$ consists of at least one element of Fe, Mn, Cr, and Ru.

13. A thin film capacitor as claimed in claim 12, wherein said dielectric thin film is formed on the surface of said electric conductive oxide material.

14. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material consists of $A_2CoO_3$, in which $A_2$ comprises at least one element of alkaline-earth elements and at least one element selected from the group of Nd, Sm, Pr and Eu.

15. A thin film capacitor as claimed in claim 14, wherein said $A_2CoO_3$ comprises $Nd_{1-x}Sr_xCoO_3$ ($0.05 \leq x \leq 0.5$).

16. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material consists of $W_{1-x}Re_xO_{3-\delta}$ ($0<x<1$), in which $\delta$ represents oxygen deficiency.

17. A thin film capacitor as claimed in claim 16, wherein said $\delta$ is about 0.1 or less.

18. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material comprises $A_3NiO_3$, in which $A_3$ comprises at least one element of rare-earth elements.

19. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein a surface of the electric conductive oxide material facing to the dielectric thin film comprises at least one material selected from the group consisting of:
i) $A_2CoO_3$, in which $A_2$ comprises at least one element of alkaline-earth elements and at least one element selected from the group of Nd, Sm, Pr and Eu;
ii) $A_3NiO_3$, in which $A_3$ comprises at least one element of rare-earth elements; and
iii) $W_{1-x}Re_xO_{3-\delta}$ ($0<x<1$), in which $\delta$ represents oxygen deficiency.

20. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material comprises $AE_{1-x}RE_xTiO_3$ ($0.1 \leq x \leq 0.95$), in which AE represents Sr or Ba, RE consists of at least one element of rare-earth elements, and O having a substantially stoichiometric composition, without intentionally introducing oxygen deficiency.

21. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material comprises $AE_{1-x}RE_xCrO_3$ ($0.1 \leq x \leq 0.95$), in which AE represents Sr or Ba, and RE consists of at least one element of rare-earth elements.

22. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material comprises $AE_{1-x}R_xMnO_3$ ($0.1 \leq x \leq 0.95$), in which AE representing Sr or Ba, and RE consists of at least one element of rare-earth elements.

23. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material comprises $AE_{1-x}RE_xFeO_3$ ($0.1 \leq x \leq 0.95$), in which AE represents Sr or Ba, and RE consists of at least one element of rare-earth elements.

24. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity,
wherein the electric conductive oxide material comprises $AE_{1-x}RE_xCoO_3$ ($0.1 \leq x \leq 0.95$), in which AE represents Sr or Ba, and RE consists of at least one element of rare-earth element other than La.

25. A thin film capacitor comprising:
(a) a first electrode;
(b) a second electrode; and
(c) a dielectric thin film having a perovskite structure, sandwiched between the first and second electrodes,
wherein at least one of the first and second electrodes comprises an electric conductive oxide material having a perovskite structure and showing a metallic conductivity, and
wherein the electric conductive oxide material is $Sr_{1-x}Ba_xRuO_3$ ($0<x<1$), in which at least one of Sr and Ba is replaced by at least one of La and Nd.

26. A thin film capacitor comprising:
(a) a first electrode;
(b) a second electrode; and
(c) a perovskite high-dielectric-constant thin film not showing ferroelectric characteristics, sandwiched between the first and second electrodes,
at least one of the first and second electrodes comprises an electric conductive oxide material having a perovskite structure and showing a metallic conductivity,
wherein the electric conductive oxide material comprises $AE_{1-x}RE_xCoO_3$ ($0.1 \leq x \leq 0.95$), in which AE represents Sr or Ba, and RE consists of at least one element of rare-earth element.

27. A thin film capacitor comprising:
(a) a first electrode;
(b) a second electrode; and
(c) a dielectric thin film having a perovskite structure, sandwiched between the first and second electrodes,
at least one of the first and second electrodes comprises an electric conductive oxide material having a perovskite structure and showing a metallic conductivity, wherein the electric conductive oxide material comprises $AE_{1-x}RE_xCoO_3$ ($0.1 \leq x \leq 0.95$), in which AE represents Sr or Ba, and RE consists of at least two elements of rare-earth elements.

* * * * *